(12) United States Patent
Choi et al.

(10) Patent No.: US 11,502,097 B2
(45) Date of Patent: Nov. 15, 2022

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventors: Eunyeoung Choi, Hwaseong-si (KR); Suhyeong Lee, Suwon-si (KR); Yohan Lee, Seoul (KR); Yongseok Cho, Yeongcheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 16/847,210

(22) Filed: Apr. 13, 2020

(65) Prior Publication Data

US 2021/0066343 A1 Mar. 4, 2021

(30) Foreign Application Priority Data

Aug. 27, 2019 (KR) ........................ 10-2019-0104983

(51) Int. Cl.
*H01L 27/11582* (2017.01)
*H01L 27/11524* (2017.01)
*H01L 27/11556* (2017.01)
*H01L 21/28* (2006.01)
*H01L 27/1157* (2017.01)
*H01L 29/423* (2006.01)

(52) U.S. Cl.
CPC .... *H01L 27/11582* (2013.01); *H01L 27/1157* (2013.01); *H01L 27/11524* (2013.01); *H01L 27/11556* (2013.01); *H01L 29/40114* (2019.08); *H01L 29/40117* (2019.08); *H01L 29/4234* (2013.01); *H01L 29/42324* (2013.01)

(58) Field of Classification Search
CPC ..................... H01L 27/11578; H01L 27/11582
See application file for complete search history.

(56) References Cited

U.S. PATENT DOCUMENTS

| 8,853,773 B2 | 10/2014 | Lee |
| 8,937,346 B2 | 1/2015 | Aritome |
| 9,543,320 B2 | 1/2017 | Pang et al. |

(Continued)

OTHER PUBLICATIONS

Communication dated Jun. 9, 2022 by the German Patent and Trademark Office in German Patent English Application No. 10 2020 109 802.2.

*Primary Examiner* — Christopher A Johnson
(74) *Attorney, Agent, or Firm* — Sughrue Mion, PLLC

(57) ABSTRACT

An integrated circuit device includes a channel layer in a channel hole penetrating a conductive line and an insulating layer, a charge trap pattern inside the channel hole between the conductive line and the channel layer, and a dummy charge trap pattern inside the channel hole between the insulating layer and the channel layer. In order to manufacture the integrated circuit device, a channel hole penetrating an insulating layer and a mold layer is formed. A mold indent connected to the channel hole is formed. A preliminary dielectric pattern is formed in the mold indent. The preliminary dielectric pattern is oxidized to form a first blocking dielectric pattern. A charge trap layer is formed in the channel hole. The mold layer is removed to form a conductive space. A portion of the charge trap layer is removed to form charge trap patterns and dummy charge trap patterns.

19 Claims, 52 Drawing Sheets

(56) References Cited

U.S. PATENT DOCUMENTS

| | | |
|---|---|---|
| 9,865,616 B2 | 1/2018 | Shimizu et al. |
| 10,217,760 B2 | 2/2019 | Shin |
| 2013/0341701 A1 | 12/2013 | Blomme et al. |
| 2015/0333186 A1* | 11/2015 | Yoo ................... H01L 29/40117 257/324 |
| 2018/0033799 A1* | 2/2018 | Kanamori ......... H01L 27/11565 |
| 2018/0102316 A1 | 4/2018 | Kim |
| 2019/0051656 A1 | 2/2019 | Carlson et al. |
| 2021/0057434 A1* | 2/2021 | Surthi ............... H01L 27/11582 |

* cited by examiner

INTEGRATED CIRCUIT DEVICE AND METHOD OF MANUFACTURING THE SAME

CROSS-REFERENCE TO RELATED APPLICATION

This application claims priority from Korean Patent Application No. 10-2019-0104983, filed on Aug. 27, 2019, in the Korean Intellectual Property Office, the disclosure of which is incorporated by reference herein in its entirety.

BACKGROUND

1. Field

The present disclosure relates to an integrated circuit device and a method of manufacturing the same, and more particularly, to an integrated circuit device including a non-volatile vertical-type memory device and a method of manufacturing the integrated circuit device including the non-volatile vertical-type memory device.

2. Description of Related Art

With the increased capacity and high integration of integrated circuit devices, a vertical-type memory device has been provided, the vertical-type memory device having an increased memory capacity by including a plurality of memory cells stacked on a substrate in a vertical direction. When a cell stack density in the vertical direction is increased in the vertical-type memory device, a gap between cells adjacent in the vertical direction may be reduced, and thus, due to cell interference caused by charge diffusion between the adjacent cells, the reliability of an integrated circuit device may deteriorate.

SUMMARY

It is an aspect to provide an integrated circuit device having a structure for preventing cell interference due to charge diffusion between cells adjacent in a vertical direction and increasing the reliability, even when a gap between the adjacent cells is relatively small, in a highly scaled vertical-type memory device.

It is another aspect to provide a method of easily and efficiently manufacturing an integrated circuit device having a structure for preventing cell interference due to charge diffusion between cells adjacent in a vertical direction and increasing the reliability, even when a gap between the adjacent cells is relatively small, in a highly scaled vertical-type memory device.

According to an aspect of an embodiment, there is provided an integrated circuit device comprising a conductive pattern extending on a substrate in a horizontal direction that is parallel to a surface of the substrate; an insulating layer extending on the substrate in the horizontal direction, adjacent to and in parallel to the conductive pattern; a channel layer extending in a channel hole penetrating the conductive pattern and the insulating layer, in a vertical direction that is perpendicular to the surface of the substrate; a charge storage pattern inside the channel hole between the conductive pattern and the channel layer; and a dummy charge storage pattern inside the channel hole between the insulating layer and the channel layer, the dummy charge storage pattern being separated from the charge storage pattern.

According to another aspect of an embodiment, there is provided an integrated circuit device comprising a plurality of conductive patterns extending on a substrate in a horizontal direction that is parallel to a surface of the substrate, the plurality of conductive patterns overlapping each other in a vertical direction that is perpendicular to the surface; a plurality of insulating layers respectively arranged between adjacent ones of the plurality of conductive patterns, the plurality of insulating layers extending in the horizontal direction; a channel layer extending in the vertical direction within a channel hole penetrating the plurality of conductive patterns and the plurality of insulating layers; a plurality of charge trap patterns spaced apart from each other inside the channel hole and interposed between the plurality of conductive patterns and the channel layer; a plurality of dummy charge trap patterns spaced apart from each other inside the channel hole and spaced apart from the plurality of charge trap patterns, the plurality of dummy charge trap patterns interposed between the plurality of insulating layers and the channel layer; and a plurality of blocking dielectric patterns comprising a plurality of first pattern portions respectively arranged between adjacent ones of the plurality of insulating layers and interposed between the plurality of conductive patterns and the plurality of charge trap patterns, and a plurality of second pattern portions surrounding respective portions of the plurality of conductive patterns and filling respective spaces between the plurality of charge trap patterns and the plurality of dummy charge trap patterns.

According to another aspect of an embodiment, there is provided an integrated circuit device comprising a lower conductive line and an upper conductive line extending in a horizontal direction in parallel to each other on a substrate; an insulating layer extending in the horizontal direction between the lower conductive line and the upper conductive line; a channel layer in a channel hole extending in a vertical direction by penetrating the lower conductive line, the upper conductive line, and the insulating layer; a lower charge trap pattern in the channel hole, the lower charge trap pattern interposed between the lower conductive line and the channel layer; an upper charge trap pattern in the channel hole, the upper charge trap pattern interposed between the upper conductive line and the channel layer and being spaced apart from the lower charge trap pattern in the vertical direction; and a dummy charge trap pattern between the insulating layer and the channel layer, the dummy charge trap pattern being spaced apart from the lower charge trap pattern by a lower separating space and from the upper charge trap pattern by an upper separating space; a lower first blocking dielectric pattern between the lower conductive line and the channel layer; an upper first blocking dielectric pattern between the upper conductive line and the channel layer; a lower second blocking dielectric pattern between the lower conductive line and the lower first blocking dielectric pattern, the lower second blocking dielectric pattern filling the lower separating space; and an upper second blocking dielectric pattern between the upper conductive line and the upper first blocking dielectric pattern, the upper second blocking dielectric pattern filling the upper separating space.

According to another aspect of an embodiment, there is provided an integrated circuit device comprising a plurality of conductive lines extending on a substrate in a horizontal direction that is parallel to a surface of the substrate, the plurality of conductive lines overlapping each other in a vertical direction that is perpendicular to the surface; a plurality of insulating layers respectively arranged between adjacent ones of the plurality of conductive lines, the plurality of insulating layers extending in the horizontal direction; a channel layer vertically extending in a channel hole penetrating the plurality of conductive lines and the plurality of insulating layers; a plurality of charge trap patterns spaced apart from each other inside the channel hole and interposed between the plurality of conductive lines and the channel layer; a plurality of dummy charge trap patterns spaced apart from each other inside the channel hole and interposed between the plurality of insulating layers and the channel layer, the plurality of dummy charge trap patterns being spaced apart from the plurality of charge trap patterns; a plurality of first blocking dielectric patterns respectively arranged between adjacent ones of the plurality of insulating layers, and interposed between the plurality of conductive lines and the plurality of charge trap patterns; a plurality of second blocking dielectric patterns surrounding respective portions of the plurality of first blocking dielectric patterns and respective portions of the plurality of conductive lines and comprising portions filling respective spaces between the plurality of charge trap patterns and the plurality of dummy charge trap patterns; and a tunneling dielectric layer between the plurality of first blocking dielectric patterns and the channel layer.

According to another aspect of an embodiment, there is provided a method of manufacturing an integrated circuit device, the method comprising forming a structure in which a plurality of insulating layers and a plurality of mold layers are respectively alternately stacked on a substrate; forming a channel hole penetrating the structure; forming a plurality of mold indents connected to the channel hole by removing portions of the plurality of mold layers through the channel hole; forming a sacrificial layer and a preliminary dielectric pattern filling each of the plurality of mold indents; forming a first blocking dielectric pattern by oxidizing the preliminary dielectric pattern; forming a charge storage layer in the channel hole; forming a tunneling dielectric layer on the charge storage layer in the channel hole; forming a channel layer on the tunneling dielectric layer in the channel hole; forming conductive spaces each between each of the plurality of insulating layers by removing the plurality of mold layers; forming a plurality of separating spaces separating the charge storage layer into a plurality of charge storage patterns and a plurality of dummy charge storage patterns by removing the sacrificial layer and a portion of the charge storage layer through the respective conductive spaces; forming a second blocking dielectric pattern filling the plurality of separating spaces and covering inner walls of the respective conductive spaces; and forming a conductive pattern on the second blocking dielectric pattern in the respective conductive spaces.

According to another aspect of an embodiment, there is provided a method of manufacturing an integrated circuit device, the method comprising forming a structure in which a plurality of insulating layers and a plurality of mold layers are respectively alternately stacked on a substrate; forming a channel hole penetrating the structure; forming a plurality of mold indents connected to the channel hole by removing portions of the plurality of mold layers through the channel hole; forming a first blocking dielectric pattern in each of the plurality of mold indents; forming a charge trap layer covering the first blocking dielectric pattern in the channel hole; forming a conductive space exposing the first blocking dielectric pattern by removing the plurality of mold layers; forming a plurality of separating spaces separating the charge trap layer into a plurality of charge trap patterns and a plurality of dummy charge trap patterns by removing a portion of the charge trap layer through the conductive space; forming a second blocking dielectric pattern filling the plurality of separating spaces and covering the first blocking dielectric pattern in the conductive space; and forming a conductive line in the conductive space.

According to another aspect of an embodiment, there is provided a method of manufacturing an integrated circuit device, the method comprising forming a structure in which a plurality of insulating layers and a plurality of mold layers are respectively alternately stacked on a substrate; forming a channel hole penetrating the structure; forming a plurality of mold indents connected to the channel hole by removing portions of the plurality of mold layers through the channel hole; forming a sacrificial layer and a preliminary dielectric pattern filling each of the plurality of mold indents; forming a charge trap layer covering the preliminary dielectric pattern in the channel hole; forming a conductive space exposing the preliminary dielectric pattern by removing the plurality of mold layers; forming a plurality of separating spaces separating the charge trap layer into a plurality of charge trap patterns and a plurality of dummy charge trap patterns by removing a portion of the charge trap layer through the conductive space; forming a first blocking dielectric pattern by oxidizing the preliminary dielectric pattern through the conductive space; forming a second blocking dielectric pattern filling the plurality of separating spaces and covering the first blocking dielectric pattern in the conductive space; and forming a conductive line in the conductive space.

BRIEF DESCRIPTION OF THE DRAWINGS

Various embodiments will be more clearly understood from the following detailed description taken in conjunction with the accompanying drawings, in which.

DETAILED DESCRIPTION

Figure 1:
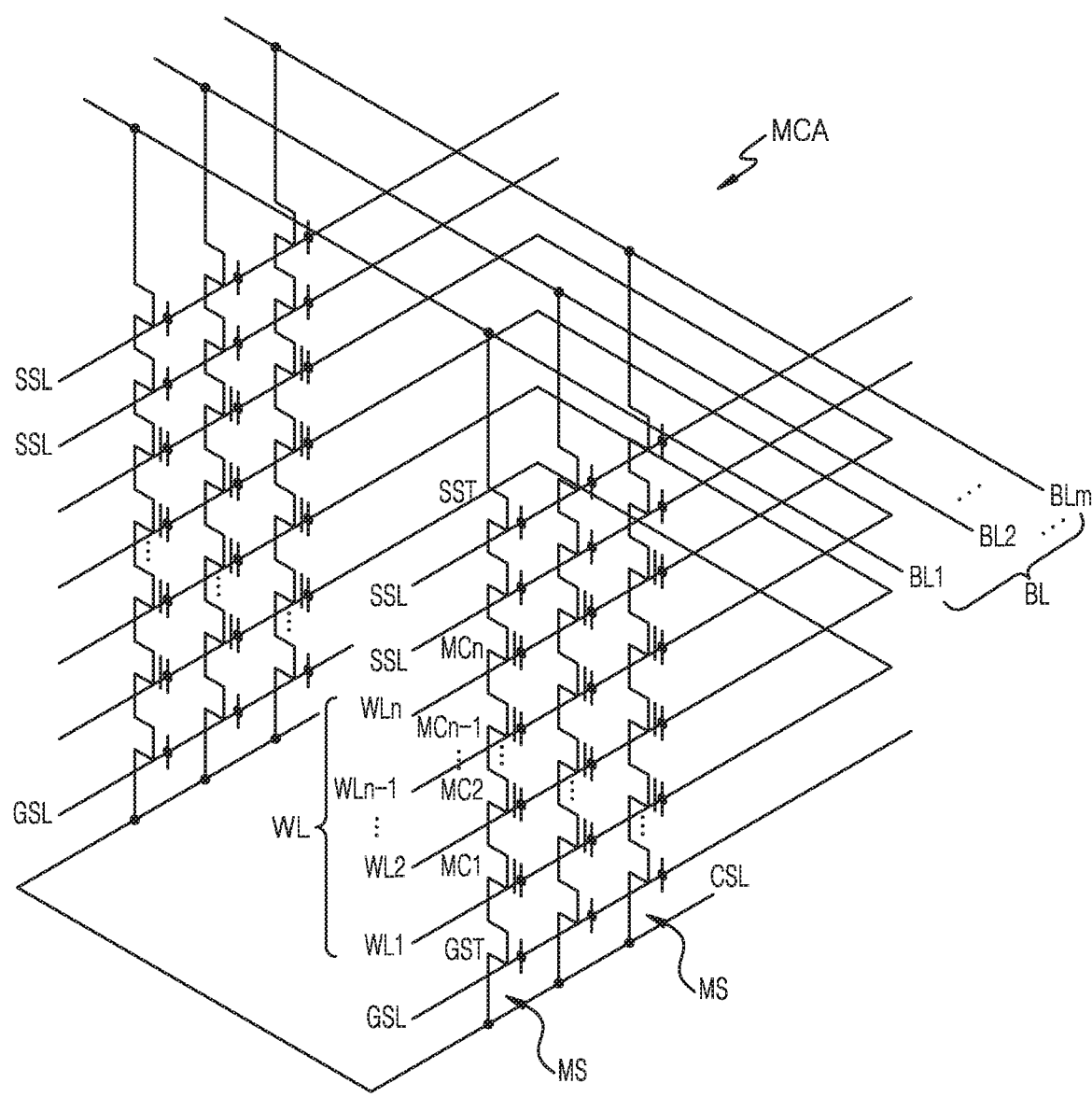
FIG. 1 is an equivalent circuit diagram of a memory cell array of an integrated circuit device according to embodiments.

Hereinafter, various embodiments will be described in detail with reference to the accompanying drawings. The same components are indicated by using the same reference numerals and their repeated descriptions will not be repeated for conciseness.

FIG. 1 is an equivalent circuit diagram of a memory cell array MCA of an integrated circuit device according to embodiments. The equivalent circuit diagram of a vertical-type NAND flash memory device having a vertical channel structure is illustrated in FIG. 1.

Referring to FIG. 1, the memory cell array MCA may include a plurality of memory cell strings MS. The memory cell array MCA may include a plurality of bit lines BL1, BL2, ..., BLm (BL), a plurality of word lines WL1, WL2, ..., WLn−1, and WLn (WL), at least one string selection line SSL, at least one ground selection line GSL, and a common source line CSL. The plurality of memory cell strings MS may be formed between the plurality of bit lines BL1, BL2, ..., BLm (BL) and the common source line CSL.

Each of the plurality of memory cell strings MS may include a string selection transistor SST, a ground selection transistor GST, and a plurality of memory cell transistors MC1, MC2, ..., MCn−1, and MCn. A drain region of the string selection transistor SST may be connected to the bit lines BL1, BL2, ..., and BLm (BL) and a source region of the ground selection transistor GST may be connected to the common source line CSL. The source regions of the plurality of ground selection transistors GST may be commonly connected to the common source line CSL.

The string selection transistor SST may be connected to the at least one string selection line SSL and the ground selection transistor GST may be connected to the at least one ground selection line GSL. The plurality of memory cell transistors MC1, MC2, ..., MCn−1, and MCn may be connected to the plurality of word lines WL1, WL2, ..., WLn−1, and WLn (WL), respectively.

Figure 2:
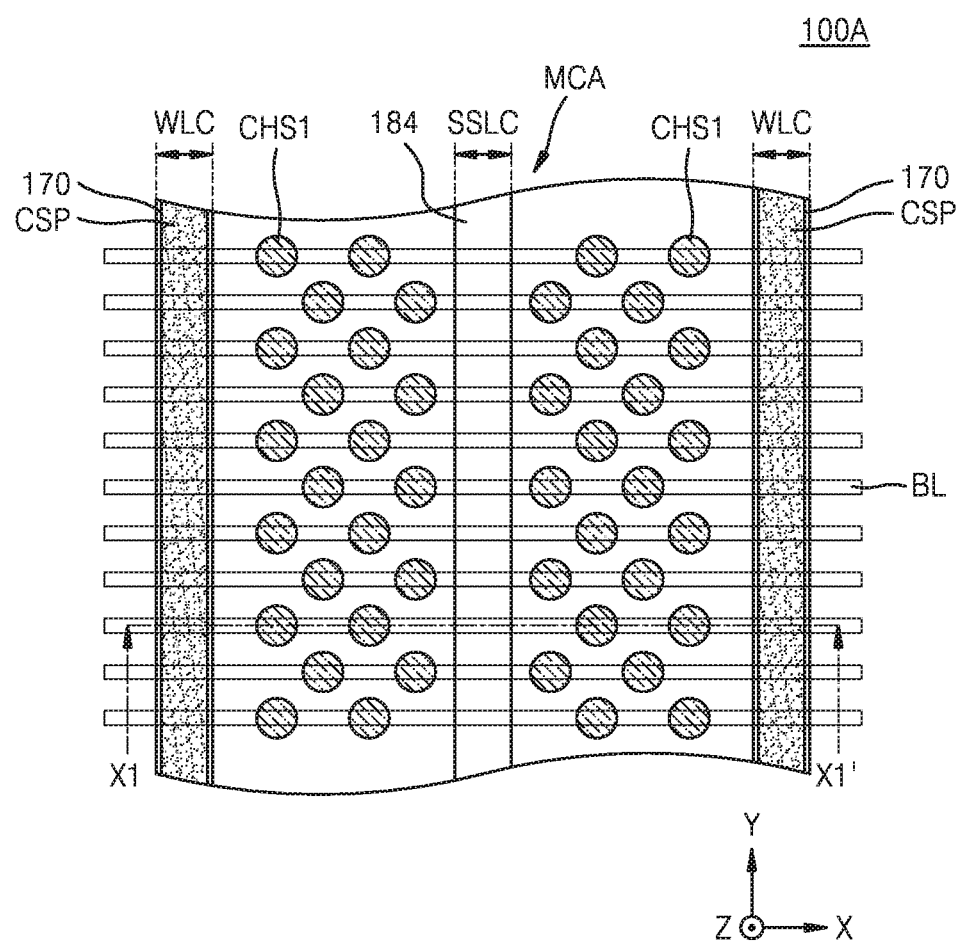
FIG. 2 is a plan view of an integrated circuit device according to embodiments.
Figure 3A:
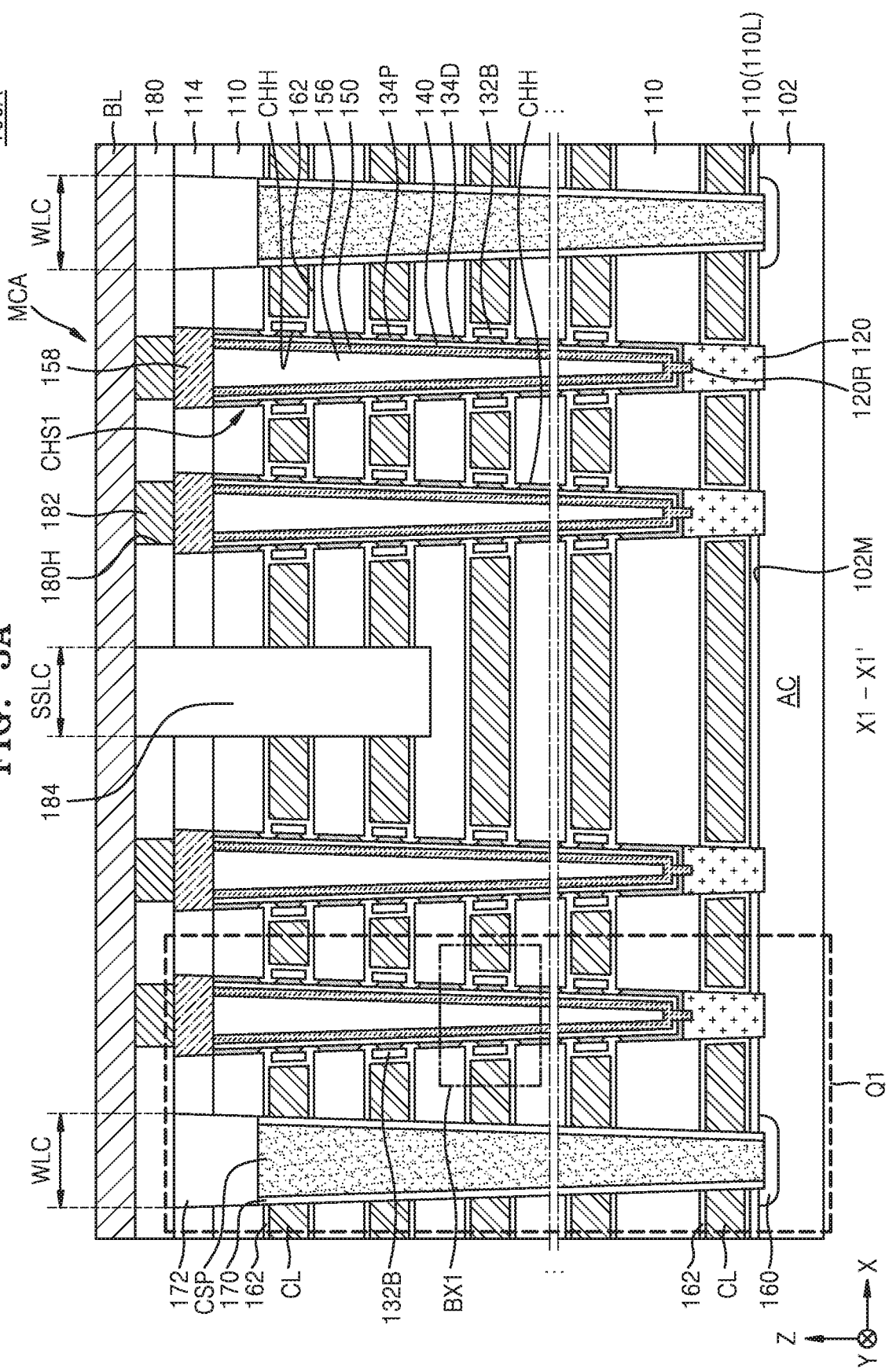
FIG. 3A is a cross-sectional view of a line X1-X1' of FIG. 2

FIG. 2 is a plan view of an integrated circuit device 100A according to embodiments. FIG. 3A is a cross-sectional view taken along line X1-X1' of FIG. 2 and FIG. 3B is an enlarged cross-sectional view of a dashed line region indicated by BX1 of FIG. 3A.

Figure 3B:
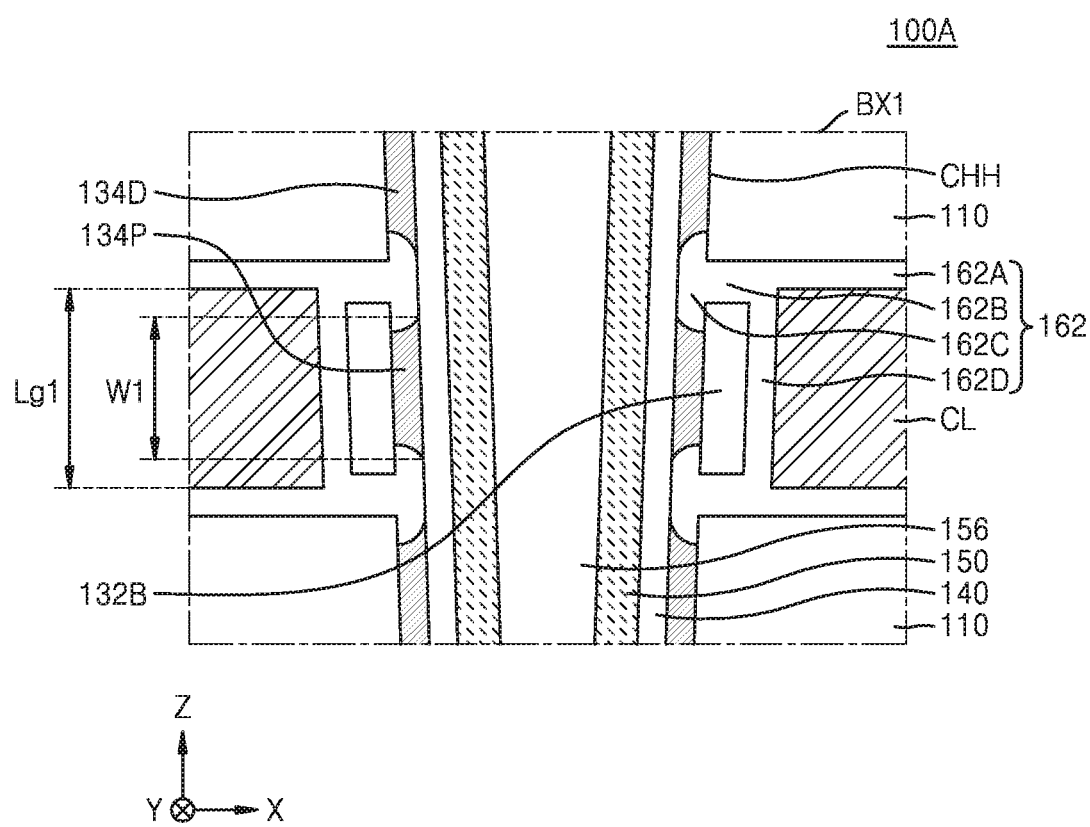
FIG. 3B is an enlarged cross-sectional view of a dashed line region indicated by BX1 of FIG. 3A.

Referring to FIGS. 2, 3A, and 3B, the integrated circuit device 100A may include a substrate 102 having an active region AC. A memory cell array MCA may be formed above the active region AC of the substrate 102. The memory cell array MCA may have a circuit structure as described with reference to FIG. 1.

The substrate 102 may have a main surface 102M extending in an X direction and a Y direction. According to example embodiments, the substrate 102 may include Si, Ge, or SiGe. According to other example embodiments, the substrate 102 may include a silicon-on-insulator (SOI) substrate or a germanium-on-insulator (GeOI) substrate.

A plurality of conductive lines CL may extend on the substrate 102 in a horizontal direction parallel to the main surface 102M along an X-Y plane, and may be arranged to be apart from each other in a vertical direction (a Z direction) perpendicular to the main surface 102M of the substrate 102, while overlapping each other. In this specification, the "conductive line CL" may be referred to as a "conductive pattern CL," and it should be understood that the "conductive line CL" and the "conductive pattern CL" refer to the same component. A plurality of insulating layers 110 may extend on the substrate 102 in the horizontal direction. Each of the plurality of insulating layers 110 may be arranged between each of the plurality of conductive lines CL. In other words, the insulating layers 110 may be interleaved with the conductive lines CL, as shown for example in FIG. 3A.

A plurality of channel holes CHH may be formed to penetrate the plurality of conductive lines CL and the plurality of insulating layers 110, and a plurality of channel structures CHS1 may extend in the vertical direction (the Z direction) in the plurality of channel holes CHH. Each of the plurality of channel structures CHS1 may include a semiconductor pattern 120 contacting the substrate 102 and partially filling the channel hole CHH, a channel layer 150 contacting the semiconductor pattern 120 and extending in the channel hole CHH in the vertical direction (the Z direction), a buried insulating layer 156 filling the inner space of the channel layer 150, and a drain region 158 contacting the channel layer 150 and filling an upper entrance portion of the channel hole CHH. According to example embodiments, the channel layer 150 may have a cylindrical shape that includes an inner space and the inner space of the channel layer 150 may be filled with the buried insulating layer 156. The channel layer 150 may include doped polysilicon or undoped polysilicon. The buried insulating layer 156 may include silicon oxide, silicon nitride, silicon oxynitride, or a combination thereof. In some example embodiments, the buried insulating layer 156 may be omitted and in this case, the channel layer 150 may have a pillar structure having no inner space. The drain region 158 may include a doped polysilicon layer. The plurality of drain regions 158 may be insulated from each other by insulating patterns 114. The insulating patterns 114 may include an oxide layer, a nitride layer, or a combination thereof.

The plurality of channel structures CHS1 may include a plurality of charge trap patterns 134P and a plurality of dummy charge trap patterns 134D. The terms, "charge trap pattern" and "dummy charge trap pattern" may be interchangeably used with respect to the terms "charge storage pattern" and "dummy charge storage pattern," respectively, and the terms "the charge trap pattern" and "the charge storage pattern" may be used to have the same meaning. The plurality of charge trap patterns 134P may be between the conductive lines CL and the channel layer 150 in the channel holes CHH, while being apart from each other. The plurality of dummy charge trap patterns 134D may be between the insulating layer 110 and the channel layer 150 and may be apart from the plurality of charge trap patterns 134P. The plurality of dummy charge trap patterns 134D may be apart from each other and one charge trap pattern 134P may be between each of the plurality of dummy charge trap patterns 134D. In other words, the charge trap patterns 134P may be interleaved with the dummy charge trap patterns 134D. In some example embodiments, the plurality of charge trap patterns 134P and the plurality of dummy charge trap patterns 134D may extend, in the channel holes CHH, along a straight line extending in a direction away from the substrate 102, and may be respectively alternately arranged along the straight line. The plurality of charge trap patterns 134P and the plurality of dummy charge trap patterns 134D may have the same width in the horizontal direction. Each of the plurality of charge trap patterns 134P and the plurality of dummy charge trap patterns 134D may have a constant width along the straight line. For example, each of the plurality of charge trap patterns 134P and the plurality of dummy charge trap patterns 134D may have a width of about 3 nm to about 10 nm in the horizontal direction.

A minimum distance between the plurality of charge trap patterns 134P and the channel layer 150 in the horizontal direction may be substantially the same as a minimum distance between the plurality of dummy charge trap patterns 134D and the channel layer 150 in the horizontal direction. Each of the plurality of charge trap patterns 134P and the plurality of dummy charge trap patterns 134D may include silicon nitride layers.

As best illustrated in FIG. 3B, in the vertical direction, a length W1 of the charge trap pattern 134P may be equal to or less than a length Lg1 of the conductive line CL and equal to or greater than a half of the length Lg1 of the conductive line CL. The charge trap pattern 134P may not include a portion facing a corner of the conductive line CL that is closest to the insulating layer 110. Thus, adverse effects on the charge trap pattern 134P caused by an electric field concentrated at the corner of the conductive line CL may be minimized.

A plurality of first blocking dielectric patterns 132B may be arranged between the plurality of conductive lines CL and the channel structures CHS1. Each of the plurality of first blocking dielectric patterns 132B may be arranged between the each of the plurality of insulating layers 110. In other words, a first blocking dielectric pattern 132B may be arranged between an adjacent two of the insulating layers 110. At least a portion of each of the plurality of first blocking dielectric patterns 132B may vertically overlap the plurality of insulating layers 110. Each of the plurality of first blocking dielectric patterns 132B may be between the conductive line CL and the charge trap pattern 134P. A side wall of the plurality of first blocking dielectric patterns 132B, which faces the channel layer 150, may contact a side wall of the charge trap patterns 134P, which faces the conductive line CL, and may extend along a straight line with respect to side walls of the plurality of insulating layers 110, which face the channel layer 150. The plurality of first blocking dielectric patterns 132B may include a silicon oxide layer. A horizontal width of the plurality of first blocking dielectric patterns 132B may be about 3 nm to about 10 nm, and in some embodiments may be, for example, about 3 nm to about 5 nm.

A second blocking dielectric pattern 162 surrounding a portion of the first blocking dielectric pattern 132B and a portion of the conductive line CL may be formed between each of the plurality of insulating layers 110. In other words, a portion of the second blocking dielectric pattern 162 may extend into an area between the charge trap pattern 134P and the first blocking dielectric pattern 132B, and similarly, a portion of the second blocking dielectric pattern 162 may extend into an area between the dummy charge trap pattern 134D and the insulating layer 110. The second blocking dielectric pattern 162 may include a first portion 162A between the conductive line CL and the insulating layer 110, a second portion 162B between the first blocking dielectric pattern 132B and the insulating layer 110, a third portion 162C between the charge trap pattern 134P and the dummy charge trap pattern 134D, and a fourth portion 162D between the conductive line CL and the first blocking dielectric pattern 132B. The third portion 162C may extend into the area between the charge trap pattern 134P and the first blocking dielectric pattern 132B and into the area between the dummy charge trap portion 134D and the insulating layer 110, such that the charge trap pattern 134P does not include the portion facing a corner of the conductive line CL that is closest to the insulating layer 110. In this configuration, the first portion 162A and the third portion 162C may together form a T-shaped portion, as illustrated in FIG. 3B. The first portion 162A, the second portion 162B, the third portion 162C, and the fourth portion 162D of the second blocking dielectric pattern 162 may be integrally connected to one another. The third portion 162C of the second blocking dielectric pattern 162 may fill a respective space between the plurality of charge trap patterns 134P and the plurality of dummy charge trap patterns 134D and may contact the charge trap patterns 134P and the dummy charge trap patterns 134D. The second blocking dielectric pattern 162 may include a silicon oxide layer, a high dielectric constant (high-k) dielectric layer, or a combination thereof. The high-k dielectric layer may have a higher dielectric constant than a silicon oxide layer. For example, the high-k dielectric layer may include $HfO_2$, $Al_2O_3$, or $ZrO_2$, but example embodiments are not limited thereto.

The charge trap patterns 134P and a tunneling dielectric layer 140 may be arranged in the channel hole CHH between the plurality of first blocking dielectric patterns 132B and the channel layer 150. The tunneling dielectric layer 140 may extend long in a direction in which the channel layer 150 extends, between the charge trap patterns 134P and the channel layer 150 and between the dummy charge trap patterns 134D and the channel layer 150. The charge trap patterns 134P may include a silicon oxide layer. Each of the charge trap pattern 134P and the channel layer 150 may have a constant horizontal width in a longitudinal direction thereof. For example, the horizontal width of each of the charge trap patterns 134P and the channel layer 150 may be about 3 nm to about 10 nm.

A width in a first horizontal direction (an X direction) of each of the plurality of conductive lines CL and each of the plurality of insulating layers 110 may be defined by a plurality of word line cut regions WLC. The plurality of conductive lines CL may be repeatedly arranged to be apart from each other by a certain distance due to the plurality of word line cut regions WLC.

A plurality of common source regions 160 may extend on the substrate 102 in a second horizontal direction (a Y direction). The plurality of common source regions 160 may be a highly doped n-type impurity regions. A portion of the plurality of word line cut regions WLC may be filled with a common source pattern CSP. The common source pattern CSP may be included in the common source line CSL illustrated in FIG. 1. The common source pattern CSP may extend long above the plurality of common source regions 160 in the second horizontal direction (the Y direction). An insulating spacer 170 covering a side wall of the common source pattern CSP may be formed in the word line cut region WLC. The insulating spacer 170 may electrically insulate the common source pattern CSP from the plurality of conductive lines CL. The common source pattern CSP and the insulating spacer 170 may be covered by a capping insulating layer 172. The common source pattern CSP may include metal, such as tungsten, copper, or aluminum, conductive metal nitride, such as titanium nitride or tantalum nitride, transition metal, such as titanium or tantalum, or a combination thereof. Each of the insulating spacer 170 and the capping insulating layer 172 may include a silicon oxide layer, a silicon nitride layer, a silicon oxynitride layer, or a combination thereof. A metal silicide layer (not shown) for reducing contact resistance may be interposed between the common source region 160 and the common source pattern CSP. For example, the metal silicide layer may include cobalt silicide, tungsten silicide, nickel silicide, etc.

The plurality of conductive lines CL between two adjacent word line cut regions WLC may form the ground selection line GSL, the plurality of word lines WL1, WL2, . . . , WLn−1, and WLn (WL), and the string selection line SSL described with reference to FIG. 1. The number of the plurality of conductive lines CL stacked on the substrate 102 in a Z direction may be variously selected. For example, a conductive line CL from among the plurality of conductive lines CL, which is the closest to the substrate 102, may form the ground selection line GSL. Each of two conductive lines from among the plurality of conductive lines CL, which are farthest from the substrate 102, may form the string selection line SSL. The string selection line SSL may include portions spaced apart from each other with a string selection line cut region SSLC therebetween. The string selection line cut region SSLC may be filled with an insulating layer 184. The insulating layer 184 may include an oxide layer, a nitride layer, an air gap, or a combination thereof. The term "air gap" used in this specification may denote a space in which air or other gases which may exist during a manufacturing process are included.

The plurality of conductive lines CL may include metal, such as tungsten, nickel, cobalt, or tantalum; metal silicide, such as tungsten silicide, nickel silicide, cobalt silicide, or tantalum silicide; doped polysilicon; or a combination thereof.

In the memory cell array MCA, a plurality of bit lines BL may extend above the plurality of channel structures CHS1 in the first horizontal direction (the X direction). A plurality of bit line contact pads 182 may be between the plurality of channel structures CHS1 and the plurality of bit lines BL. The drain region 158 of the plurality of channel structures CHS1 may be connected to one corresponding bit line BL from among the plurality of bit lines BL through the bit line contact pad 182. The plurality of bit line contact pads 182 may be insulated from each other by an insulating layer 180. The insulating layer 180 may include an oxide layer, a nitride layer, or a combination thereof.

The integrated circuit device 100A illustrated in FIGS. 3A and 3B may have the plurality of charge trap patterns 134P arranged in the channel holes CHH, and thus, the integrated circuit device 100A may be more advantageously implemented to realize an integrated circuit device highly scaled in horizontal and vertical directions, compared to an integrated circuit device having the plurality of charge trap patterns 134P arranged outside the channel holes CHH as in the related art. Also, the plurality of charge trap patterns 134P may be apart from each other in one channel hole CHH in the vertical direction (the Z direction) with the dummy charge trap pattern 134D and the second blocking dielectric pattern 162 therebetween. Thus, cell interference due to charge diffusion between adjacent cells may be prevented and the reliability may be improved, even when the vertical-type memory device has a relatively small gap between cells adjacent to each other in the vertical direction.

Figure 4A:
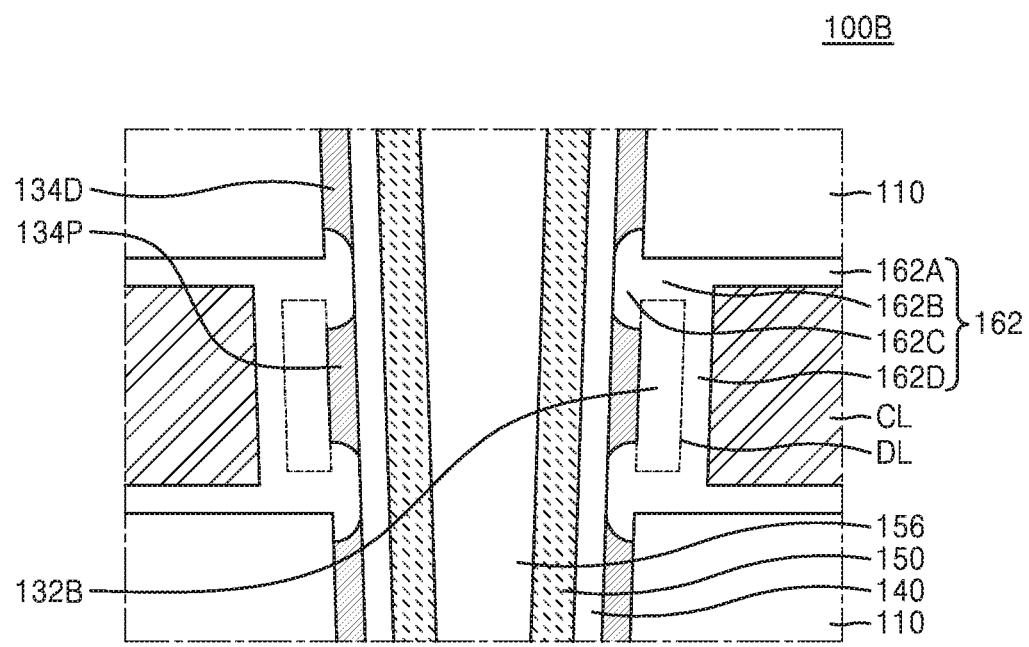
FIGS. 4A and 4B are schematic cross-sectional views of an integrated circuit device according to other embodiments.

FIG. 4A is a schematic cross-sectional view of an integrated circuit device 100B according to other embodiments. FIG. 4A illustrates an enlarged cross-sectional structure of an area corresponding to a dashed line region indicated by BX1 of FIG. 3A.

Referring to FIG. 4A, the integrated circuit device 100B may have substantially the same structure as the integrated circuit device 100A illustrated in FIGS. 3A and 3B. However, in the integrated circuit device 100B, each of the plurality of first blocking dielectric patterns 132B may be integrally connected to the second blocking dielectric pattern 162. The first blocking dielectric pattern 132B may be referred to as a "first pattern portion" and the second blocking dielectric pattern 162 may be referred to as a "second pattern portion." In FIG. 4A, the first blocking dielectric pattern 132B and the second blocking dielectric pattern 162 are separated from each other by a virtual line indicated by dashed lines DL for purposes of illustration. However, actually, the first blocking dielectric pattern 132B and the second blocking dielectric pattern 162 may be integrally formed such that the first blocking dielectric pattern 132B and the second blocking dielectric pattern 162 are connected to each other without a visual interface therebetween. In the integrated circuit device 100B, the plurality of first blocking dielectric patterns 132B and the plurality of second blocking dielectric patterns 162 may include the same material as each other. For example, each of the plurality of first blocking dielectric patterns 132B and the plurality of second blocking dielectric patterns 162 may include a silicon oxide layer. As another example, each of the plurality of first blocking dielectric patterns 132B and the plurality of second blocking dielectric patterns 162 may include a high-k dielectric layer having the same material as each other. The high-k dielectric layer may include $HfO_2$, $Al_2O_3$, or $ZrO_2$, but example embodiments are not limited thereto.

Figure 4B:
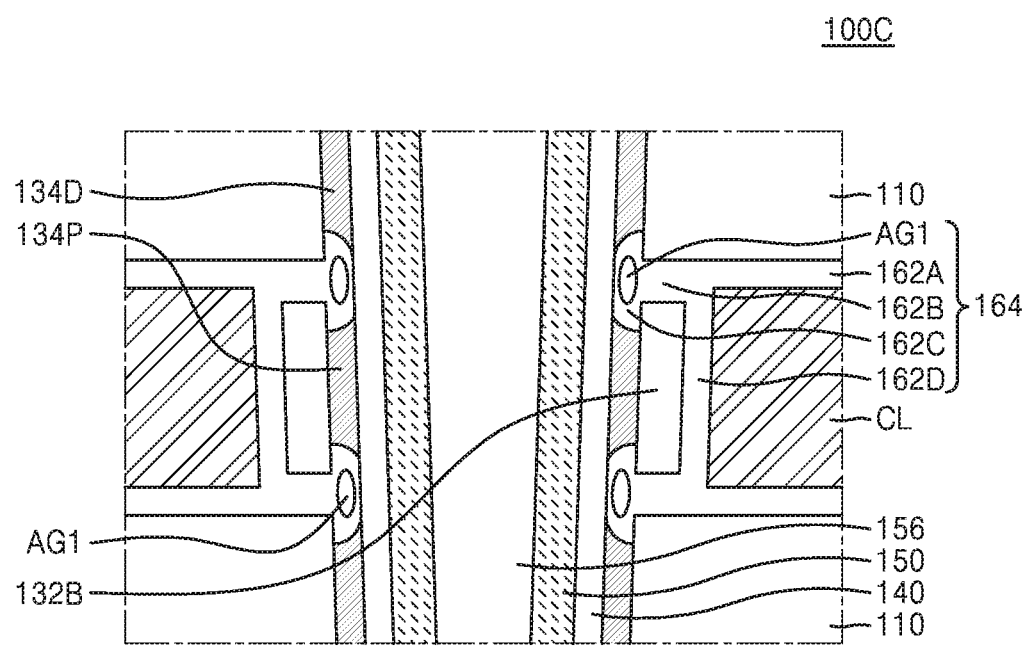

FIG. 4B is a schematic cross-sectional view of an integrated circuit device 100C according to other embodiments. FIG. 4B illustrates an enlarged cross-sectional structure of an area corresponding to a dashed line region indicated by BX1 of FIG. 3A.

Referring to FIG. 4B, the integrated circuit device 100C may have substantially the same structure as the integrated circuit device 100A illustrated in FIGS. 3A and 3B. However, the integrated circuit device 100C may include a second blocking dielectric pattern 164. The second blocking dielectric pattern 164 may have substantially the same structure as the second blocking dielectric pattern 162 illustrated in FIGS. 3A and 3B. However, the third portion 162C of the second blocking dielectric pattern 164 may include an air gap AG1. A cross-sectional shape of the air gap AG1 is not limited to the shape illustrated in FIG. 4B. The air gap AG1 may have various widths and heights. Since the third portion 162C of the second blocking dielectric pattern 164 includes the air gap AG1, a dielectric constant between the plurality of charge trap patterns 134P may be lowered, and an effect of preventing cell interference caused by charge diffusion between adjacent cells in a vertical-type memory device may be improved. In some embodiments, in the integrated circuit device 100C illustrated in FIG. 4B, like the case described in FIG. 4A about the interface between the first blocking dielectric pattern 132B and the second blocking dielectric pattern 162, a visual interface may not exist between the first blocking dielectric pattern 132B and the second blocking dielectric pattern 164. In other words, the embodiments of FIGS. 4A and 4B may be combined and used together. In this case, the plurality of first blocking dielectric patterns 132B and the plurality of second blocking dielectric patterns 164 may include the same material as each other.

Figure 5:
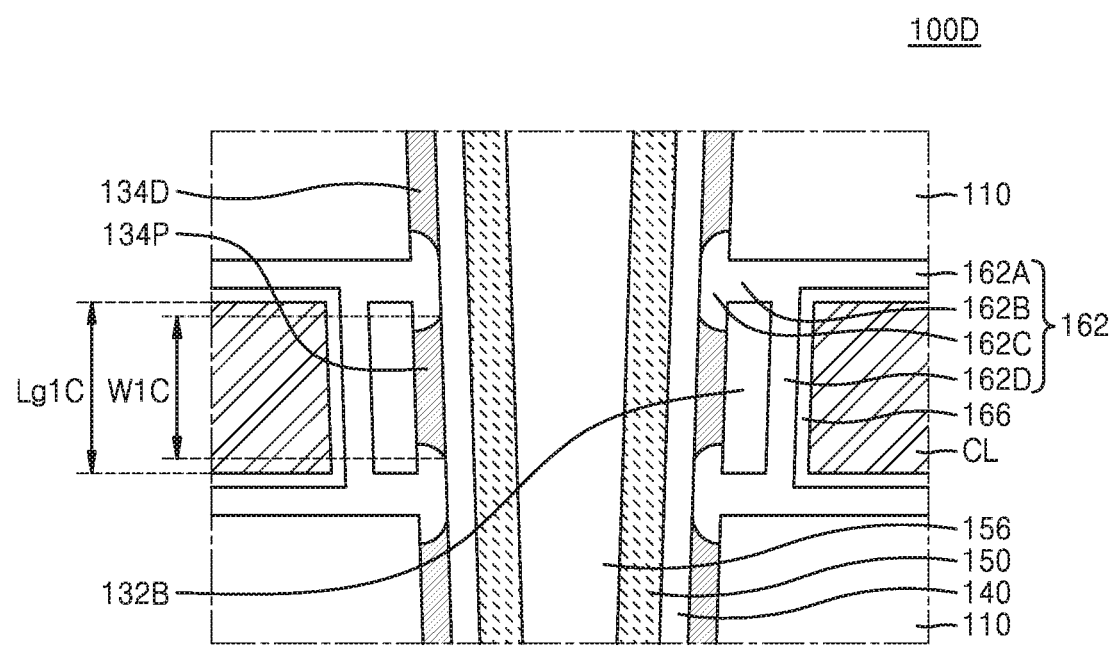
FIG. 5 is a schematic cross-sectional view of an integrated circuit device according to other embodiments.

FIG. 5 is a schematic cross-sectional view of an integrated circuit device 100D according to other embodiments. FIG. 5 illustrates an enlarged cross-sectional structure of an area corresponding to a dashed line region indicated by BX1 of FIG. 3A.

Referring to FIG. 5, the integrated circuit device 100D may have substantially the same structure as the integrated circuit device 100A illustrated in FIGS. 3A and 3B. However, the integrated circuit device 100D may further include a plurality of third blocking dielectric patterns 166. Each of the plurality of third blocking dielectric patterns 166 may be between the conductive line CL and the second blocking dielectric pattern 162. Each of the plurality of third blocking dielectric patterns 166 may include a silicon oxide layer, a high-k dielectric layer, or a combination thereof. The high-k dielectric layer may include $HfO_2$, $Al_2O_3$, or $ZrO_2$, but example embodiments are not limited thereto. For example, the plurality of second blocking dielectric patterns 162 may include silicon oxide layers and the plurality of third blocking dielectric patterns 166 may include high-k dielectric layers. As another example, the plurality of second blocking dielectric patterns 162 may include high-k dielectric layers and the plurality of third blocking dielectric patterns 166 may include silicon oxide layers.

In the integrated circuit device 100D, a vertical length W1C of the charge trap pattern 134P may be equal to or less than a vertical length Lg1C of the conductive line CL and may be equal to or higher than a half of the length Lg1C of the conductive line CL.

FIG. 5 describes an example in which the integrated circuit device 100D further includes the third blocking dielectric patterns 166 while having the same structure as the integrated circuit device 100A illustrated in FIGS. 3A and 3B. However, example embodiments are not limited thereto. For example, in some embodiments, the integrated circuit device 100D may further include the third blocking dielectric patterns 166 illustrated in FIG. 5, while having the same structure as the integrated circuit device 100C described with reference to FIG. 4B. Also, in some other embodiments, in the integrated circuit device 100D illustrated in FIG. 5, similar to the case described with reference to FIG. 4A, there may be no interface between the first blocking dielectric pattern 132B and the second blocking dielectric pattern 162. In this case, the plurality of first blocking dielectric patterns 132B and the plurality of second blocking dielectric patterns 162 may include the same material as each other. In still other embodiments, the features of the embodiments of FIGS. 4A, 4B, and 5 may be combined together.

Figure 6A:
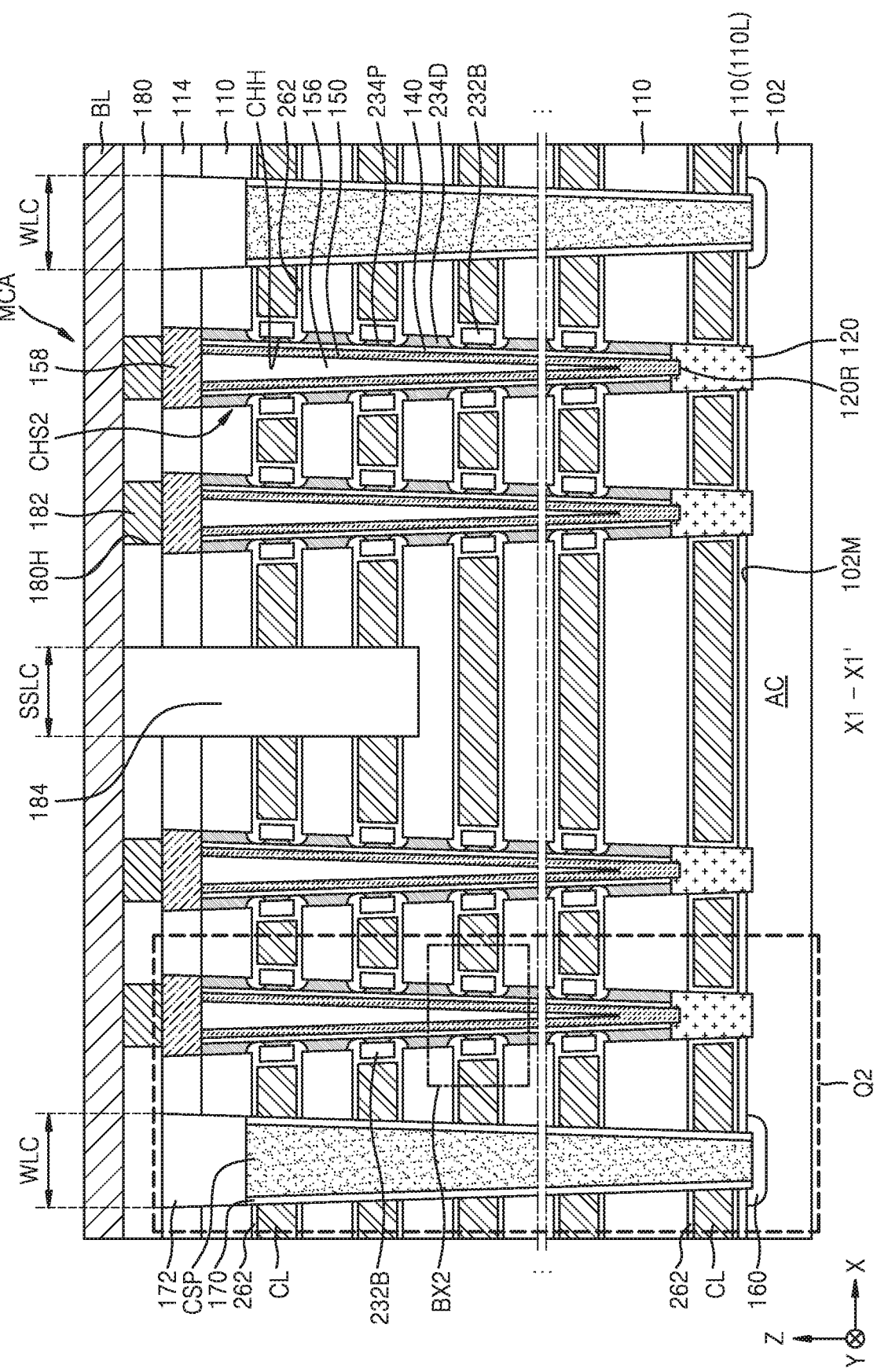
FIG. 6A is a schematic cross-sectional view of an integrated circuit device according to other embodiments and FIG. 6B is an enlarged cross-sectional view of a dashed line region indicated by BX2 of FIG. 6A.
Figure 6B:
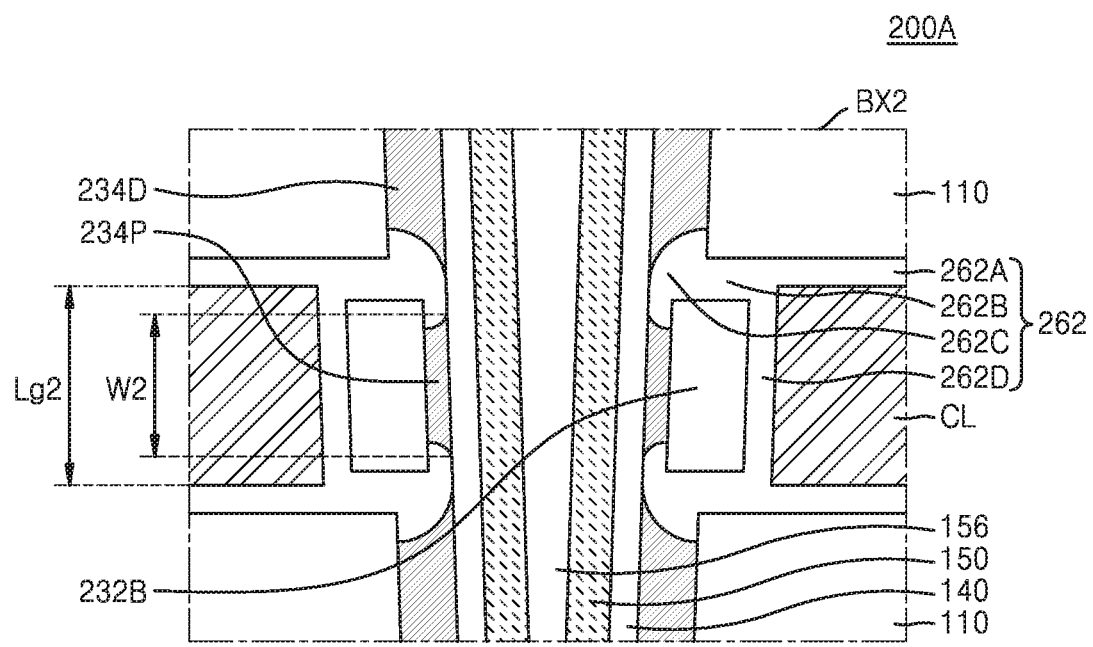

FIG. 6A is a schematic cross-sectional view of an integrated circuit device 200A according to other embodiments and FIG. 6B is an enlarged cross-sectional view of a dashed line region indicated by BX2 of FIG. 6A. FIG. 6A illustrates a cross-sectional structure of an area corresponding to a cross-section taken along line X1-X1' of FIG. 2.

Referring to FIGS. 6A and 6B, the integrated circuit device 200A may have substantially the same structure as the integrated circuit device 100A illustrated in FIGS. 3A and 3B. However, the integrated circuit device 200A may include a plurality of channel structures CHS2.

The plurality of channel structures CHS2 may have substantially the same structure as the plurality of channel structures CHS1 described with reference to FIGS. 3A and 3B. However, the plurality of channel structures CHS2 may include a plurality of charge trap patterns 234P and a plurality of dummy charge trap patterns 234D.

The plurality of charge trap patterns 234P may be between the plurality of conductive lines CL and the channel layer 150 in the channel holes CHH, while being apart from each other. The plurality of dummy charge trap patterns 234D may be between the plurality of insulating layers 110 and the channel layer 150 and may be apart from the plurality of charge trap patterns 234P. The plurality of dummy charge trap patterns 234D may be apart from each other and one charge trap pattern 234P may be between each of the plurality of dummy charge trap patterns 234D. In some embodiments, the plurality of charge trap patterns 234P and the plurality of dummy charge trap patterns 234D may extend, in the channel holes CHH, along a straight line extending in a direction away from the substrate 102, and may be respectively alternately arranged along the straight line.

The plurality of charge trap patterns 234P may have a different width in the horizontal direction from a width of the plurality of dummy charge trap patterns 234D. In some embodiments, side walls of the plurality of charge trap patterns 234P facing the channel layer 150, and side walls of the plurality of dummy charge trap patterns 234D facing the channel layer 150, may extend along a straight line. In the horizontal direction, a minimum distance between the plurality of charge trap patterns 234P and the channel layer 150 may be substantially the same as a minimum distance between the plurality of dummy charge trap patterns 234D and the channel layer 150. The plurality of charge trap patterns 234P and the plurality of dummy charge trap patterns 234D may include silicon nitride layers.

In the vertical direction, a length W2 of the charge trap pattern 234P may be equal to or less than a length Lg2 of the conductive line CL and equal to or greater than a half of the length Lg2 of the conductive line CL. The charge trap pattern 234P may not include a portion facing a corner of the conductive line CL, the corner being the closest to the insulating layer 110. Thus, adverse effects on the charge trap pattern 234P caused by an electric field concentrated at the corner of the conductive line CL may be minimized.

A plurality of first blocking dielectric patterns 232B may be arranged between the plurality of conductive lines CL and the channel structures CHS2. Each of the plurality of first blocking dielectric patterns 232B may be arranged between the each of the plurality of insulating layers 110. A portion of each of the plurality of first blocking dielectric patterns 232B may vertically overlap the plurality of insulating layers 110. Each of the plurality of first blocking dielectric patterns 232B may be between the conductive line CL and the charge trap pattern 234P. A portion of each of the plurality of first blocking dielectric patterns 232B may protrude further toward the channel layer 150 than side walls of the plurality of insulating layers 110 that face the channel layer 150. Side walls of the plurality of first blocking dielectric patterns 232B that face the channel layer 150, may be more adjacent to the channel layer 150 than the side walls of the plurality of insulating layers 110 that face the channel layer 150. The plurality of first blocking dielectric patterns 232B may include silicon oxide layers. A horizontal width of the plurality of first blocking dielectric patterns 232B may be about 3 nm to about 10 nm and, in some embodiments, may be, for example, about 3 nm to about 5 nm.

A second blocking dielectric pattern 262 surrounding a portion of the first blocking dielectric pattern 232B and a portion of the conductive line CL may be formed between each of the plurality of insulating layers 110. The second blocking dielectric pattern 262 may include a first portion 262A between the conductive line CL and the insulating layer 110, a second portion 262B between the first blocking dielectric pattern 232B and the insulating layer 110, a third portion 262C between the charge trap pattern 234P and the dummy charge trap pattern 234D, and a fourth portion 262D between the conductive line CL and the first blocking dielectric pattern 232B. The first portion 262A, the second portion 262B, the third portion 262C, and the fourth portion 262D of the second blocking dielectric pattern 262 may be integrally connected to one another. The third portion 262C of the second blocking dielectric pattern 262 may fill a respective space between the charge trap pattern 234P and the dummy charge trap pattern 234D. The second portion 262B of the second blocking dielectric pattern 262 may include a portion vertically overlapping the first blocking dielectric pattern 232B.

The charge trap patterns 234P and the tunneling dielectric layer 140 may be arranged between the plurality of first blocking dielectric patterns 232B and the channel layer 150.

According to example embodiments, the integrated circuit device 200A may further include the plurality of third blocking dielectric patterns 166, similarly to the case described with reference to FIG. 5. Each of the plurality of third blocking dielectric patterns 166 may be between the conductive line CL and the second blocking dielectric pattern 262.

In some embodiments, in the integrated circuit device 200A illustrated in FIGS. 6A and 6B, like the case described in FIG. 4A about the interface between the first blocking dielectric pattern 132B and the second blocking dielectric pattern 162, a visual interface may not exist between the first blocking dielectric pattern 232B and the second blocking dielectric pattern 262. In this case, the plurality of first blocking dielectric patterns 232B and the plurality of second blocking dielectric patterns 262 may include the same material as each other. Similarly, in some other embodiments, various combinations of the features of the embodiments shown in FIGS. 4A-6B may be provided.

Figure 7:
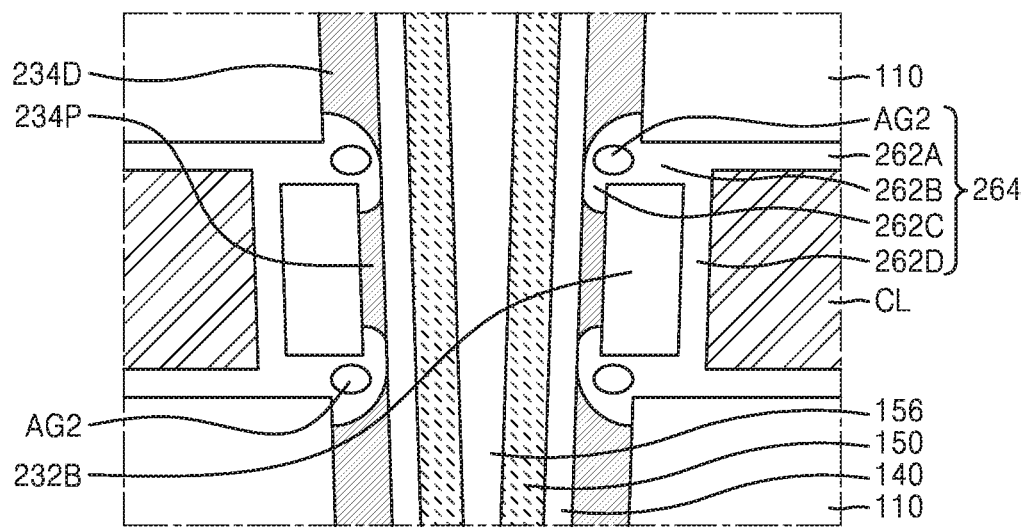
FIG. 7 is a schematic cross-sectional view of an integrated circuit device according to other embodiments.

FIG. 7 is a schematic cross-sectional view of an integrated circuit device 200B according to other embodiments. FIG. 7 illustrates an enlarged cross-sectional structure of an area corresponding to a dashed line region indicated by BX2 of FIG. 6A.

Referring to FIG. 7, the integrated circuit device 200B may have substantially the same structure as the integrated circuit device 200A illustrated in FIGS. 6A and 6B. However, the integrated circuit device 200B may include a second blocking dielectric pattern 264. The second blocking dielectric pattern 264 may have substantially the same structure as the second blocking dielectric pattern 262 illustrated in FIGS. 6A and 6B. However, the third portion 262C of the second blocking dielectric pattern 264 may include an air gap AG2. A cross-sectional shape of the air gap AG2 is not limited to the shape illustrated in FIG. 7. The air gap AG2 may have various widths and heights. Since the third portion 262C of the second blocking dielectric pattern 264 includes the air gap AG2, a dielectric constant between the plurality of charge trap patterns 234P may be lowered, and an effect of preventing cell interference caused by charge diffusion between adjacent cells in a vertical-type memory device may be improved.

In the integrated circuit device 200B illustrated in FIG. 7, like the case described in FIG. 4A about the interface between the first blocking dielectric pattern 132B and the second blocking dielectric pattern 162, a visual interface may not exist between the first blocking dielectric pattern 232B and the second blocking dielectric pattern 264. In this case, the plurality of first blocking dielectric patterns 232B and the plurality of second blocking dielectric patterns 264 may include the same material as each other. Similarly, in some other embodiments, various combinations of the features of the embodiments shown in FIGS. 4A-7 may be provided.

Figure 8A:
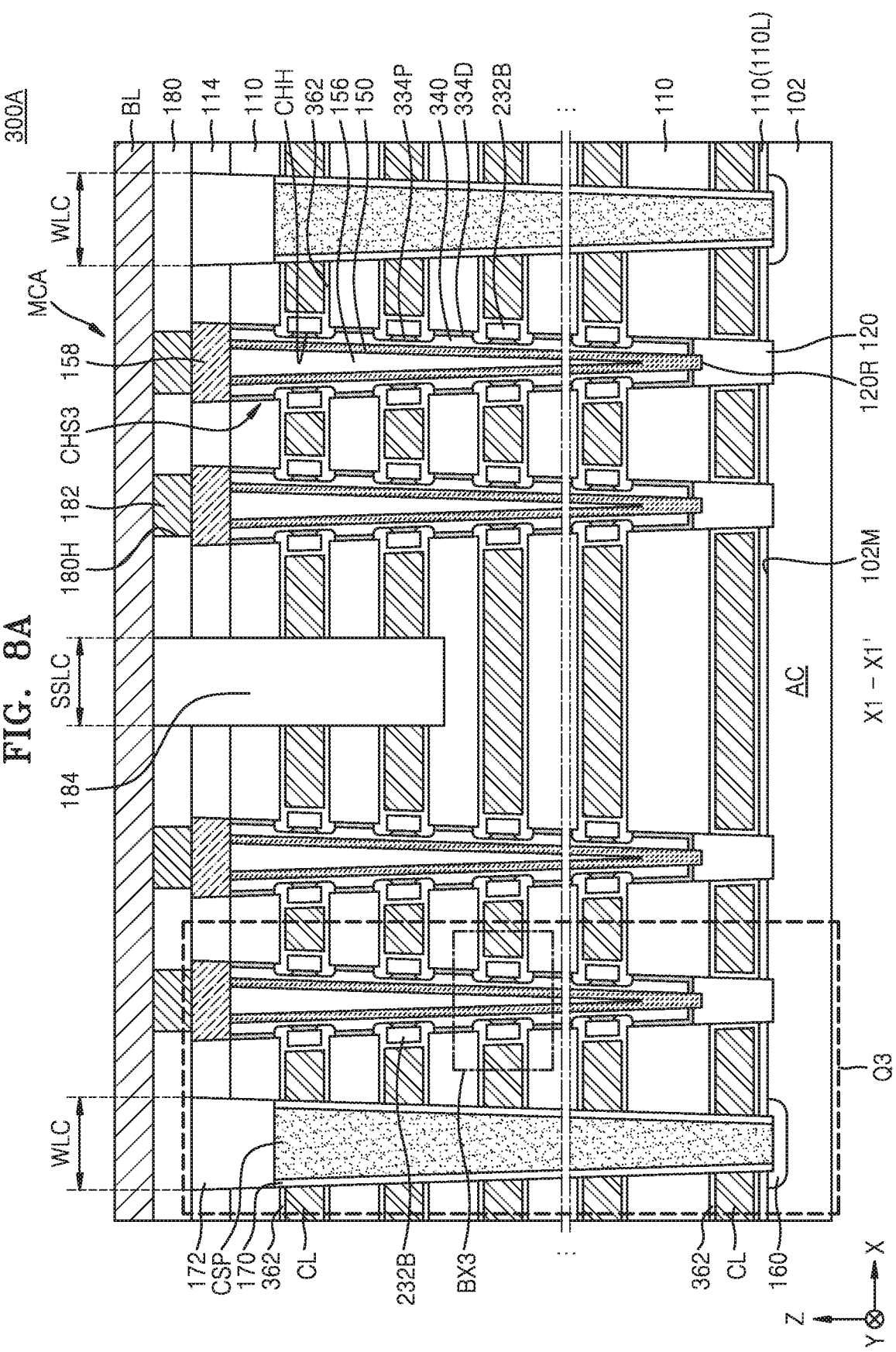
FIG. 8A is a schematic cross-sectional view of an integrated circuit device according to other embodiments and FIG. 8B is an enlarged cross-sectional view of a dashed line region indicated by BX3 of FIG. 8A.
Figure 8B:
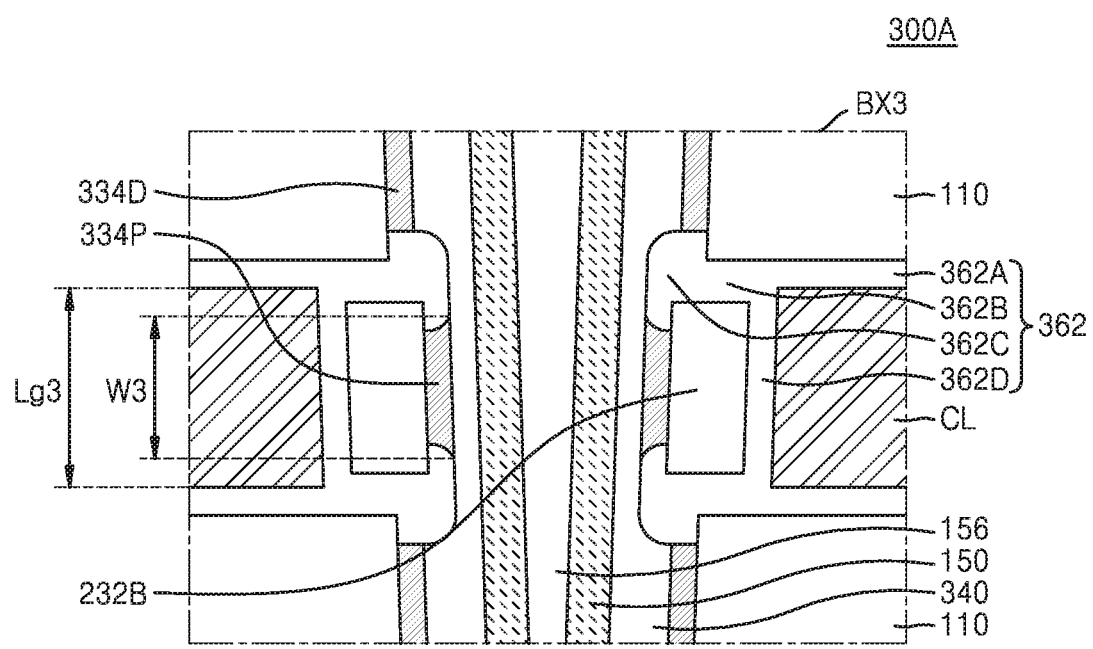

FIG. 8A is a schematic cross-sectional view of an integrated circuit device 300A according to other embodiments and FIG. 8B is an enlarged cross-sectional view of a dashed line region indicated by BX3 of FIG. 8A. FIG. 8A illustrates a cross-sectional structure of an area corresponding to the cross-section taken along line X1-X1' of FIG. 2.

Referring to FIGS. 8A and 8B, the integrated circuit device 300A may have substantially the same structure as the integrated circuit device 200A illustrated in FIGS. 6A and 6B. However, the integrated circuit device 300A may include a plurality of channel structures CHS3.

The plurality of channel structures CHS3 may have substantially the same structure as the plurality of channel structures CHS2 described with reference to FIGS. 6A and 6B. However, the plurality of channel structures CHS3 may include a plurality of charge trap patterns 334P and a plurality of dummy charge trap patterns 334D.

The plurality of charge trap patterns 334P may be between the conductive lines CL and the channel layer 150 in the channel holes CHH, while being apart from each other. The plurality of dummy charge trap patterns 334D may be between the plurality of insulating layers 110 and the channel layer 150 and may be apart from the plurality of charge trap patterns 334P. The plurality of dummy charge trap patterns 334D may be apart from each other. One charge trap pattern 334P may be between each of the plurality of dummy charge trap patterns 334D. The plurality of charge trap patterns 334P may extend in the channel holes CHH along a first straight line extending in a direction away from the substrate 102 and the plurality of dummy charge trap patterns 334D may extend in the channel holes CM along a second straight line extending in a direction away from the substrate 102, wherein the first straight line and the second straight line may not meet each other in the channel holes CHH. The plurality of charge trap patterns 334P and the plurality of dummy charge trap patterns 334D may be respectively alternately arranged in the channel holes CHH in a direction away from the substrate 102.

The plurality of charge trap patterns 334P and the plurality of dummy charge trap patterns 334D may have the same width in a horizontal direction. Side walls of the plurality of charge trap patterns 334P facing the channel layer 150 may be closer to the channel layer 150 than side walls of the plurality of dummy charge trap patterns 334D facing the channel layer 150. Thus, a minimum horizontal distance between the plurality of charge trap patterns 334P and the channel layer 150 may be smaller than a minimum horizontal distance between the plurality of dummy charge trap patterns 334D and the channel layer 150. The plurality of charge trap patterns 334P and the plurality of dummy charge trap patterns 334D may include silicon nitride layers.

In a vertical direction, a length W3 of the charge trap pattern 334P may be equal to or less than a length Lg3 of the conductive line CL and equal to or greater than a half of the length Lg3 of the conductive line CL. The charge trap pattern 334P may not include a portion facing a corner of the conductive line CL, the corner being the closest to the insulating layer 110. Thus, adverse effects on the charge trap pattern 334P caused by an electric field concentrated at the corner of the conductive line CL may be minimized.

A second blocking dielectric pattern 362 surrounding a portion of the first blocking dielectric pattern 232B and a portion of the conductive line CL may be formed between each of the plurality of insulating layers 110. The second blocking dielectric pattern 362 may include a first portion 362A between the conductive line CL and the insulating layer 110, a second portion 362B between the first blocking dielectric pattern 232B and the insulating layer 110, a third portion 362C between the charge trap pattern 334P and the dummy charge trap pattern 334D, and a fourth portion 362D between the conductive line CL and the first blocking dielectric pattern 232B. The first portion 362A, the second portion 362B, the third portion 362C, and the fourth portion 362D of the second blocking dielectric pattern 362 may be integrally connected to one another. The third portion 362C of the second blocking dielectric pattern 362 may fill respective spaces between the plurality of charge trap patterns 334P and the plurality of dummy charge trap patterns 334D.

The plurality of charge trap patterns 334P and a tunneling dielectric layer 340 may be arranged between the plurality of first blocking dielectric patterns 232B and the channel layer 150. In the embodiment illustrated in FIGS. 8A and 8B, the tunneling dielectric layer 340 may have variable widths in the channel holes CM in a direction away from the substrate 102. In the horizontal direction, a width of a portion of the tunneling dielectric layer 340 that is between the charge trap pattern 334P and the channel layer 150, may be smaller than a width of a portion of the tunneling dielectric layer 340 that is between the dummy charge trap pattern 334D and the channel layer 150. A side wall of the tunneling dielectric layer 340 that faces the channel layer 150, may flatly extend in a longitudinal direction of the channel holes CHH. A side wall of the tunneling dielectric layer 340 that faces the plurality of charge trap patterns 334P and the plurality of dummy charge trap patterns 334D, may have concavo-convex portions in the longitudinal direction of the channel holes CHH. For example, an end of the concavo-convex portions may begin at a upper portion of a dummy charge trap pattern 334D and another end of the concavo-convex portions may end at a lower portion of a next dummy charge trap pattern 334D in a direction extending away from the substrate 102. The tunneling dielectric layer 340 may include a silicon oxide layer.

According to example embodiments, the integrated circuit device 300A may further include the plurality of third blocking dielectric patterns 166, similarly to the case described with reference to FIG. 5. Each of the plurality of third blocking dielectric patterns 166 may be between the conductive line CL and the second blocking dielectric pattern 262.

In some example embodiments, in the integrated circuit device 300A illustrated in FIGS. 8A and 8B, like the case described about the interface between the first blocking dielectric pattern 132B and the second blocking dielectric pattern 162 with reference to FIG. 4A, a visual interface may not exist between the first blocking dielectric pattern 232B and the second blocking dielectric pattern 362. In this case, the plurality of first blocking dielectric patterns 232B and the plurality of second blocking dielectric patterns 362 may include the same material as each other.

Figure 9:
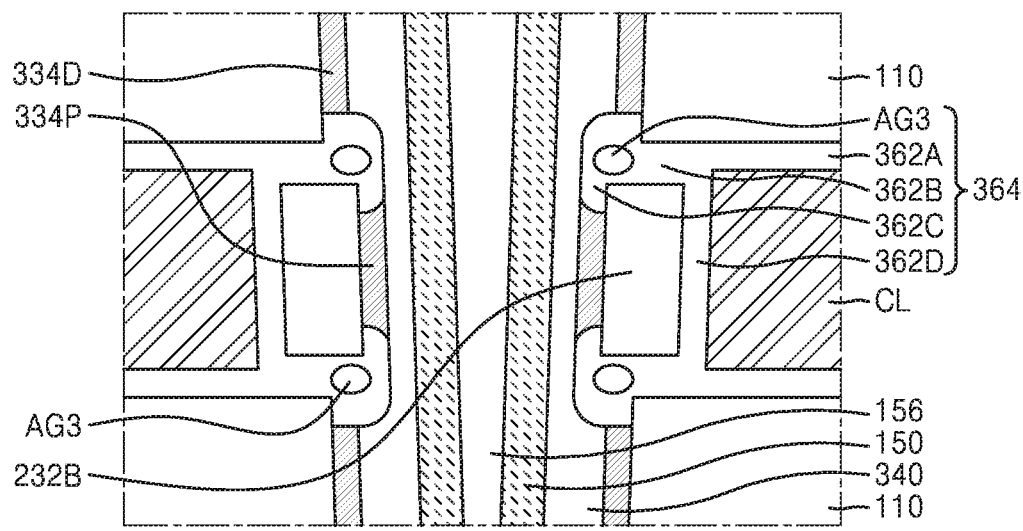
FIG. 9 is a schematic cross-sectional view of an integrated circuit device according to other embodiments.

FIG. 9 is a schematic cross-sectional view of an integrated circuit device 300B according to other embodiments. FIG. 9 illustrates an enlarged cross-sectional structure of an area corresponding to a dashed line region indicated by BX3 of FIG. 8A.

Referring to FIG. 9, the integrated circuit device 300B may have substantially the same structure as the integrated circuit device 300A illustrated in FIGS. 8A and 8B. However, the integrated circuit device 300B may include a second blocking dielectric pattern 364. The second blocking dielectric pattern 364 may have substantially the same structure as the second blocking dielectric pattern 362 illustrated in FIGS. 8A and 8B. However, the third portion 362C of the second blocking dielectric pattern 364 may include an air gap AG3. A cross-sectional shape of the air gap AG3 is not limited to the shape illustrated in FIG. 9. The air gap AG3 may have various widths and heights. Since the third portion 362C of the second blocking dielectric pattern 364 includes the air gap AG3, a dielectric constant between the plurality of charge trap patterns 334P may be lowered, and an effect of preventing cell interference caused by charge diffusion between adjacent cells in a vertical-type memory device may be improved.

In the integrated circuit device 300B illustrated in FIG. 9, like the case described in FIG. 4A about the interface between the first blocking dielectric pattern 132B and the second blocking dielectric pattern 162, a visual interface may not exist between the first blocking dielectric pattern 232B and the second blocking dielectric pattern 364. In this case, the plurality of first blocking dielectric patterns 232B and the plurality of second blocking dielectric patterns 364 may include the same material as each other. Similarly, in some other embodiments, various combinations of the features of the embodiments shown in FIGS. 4A-9 may be provided.

Figure 10A:
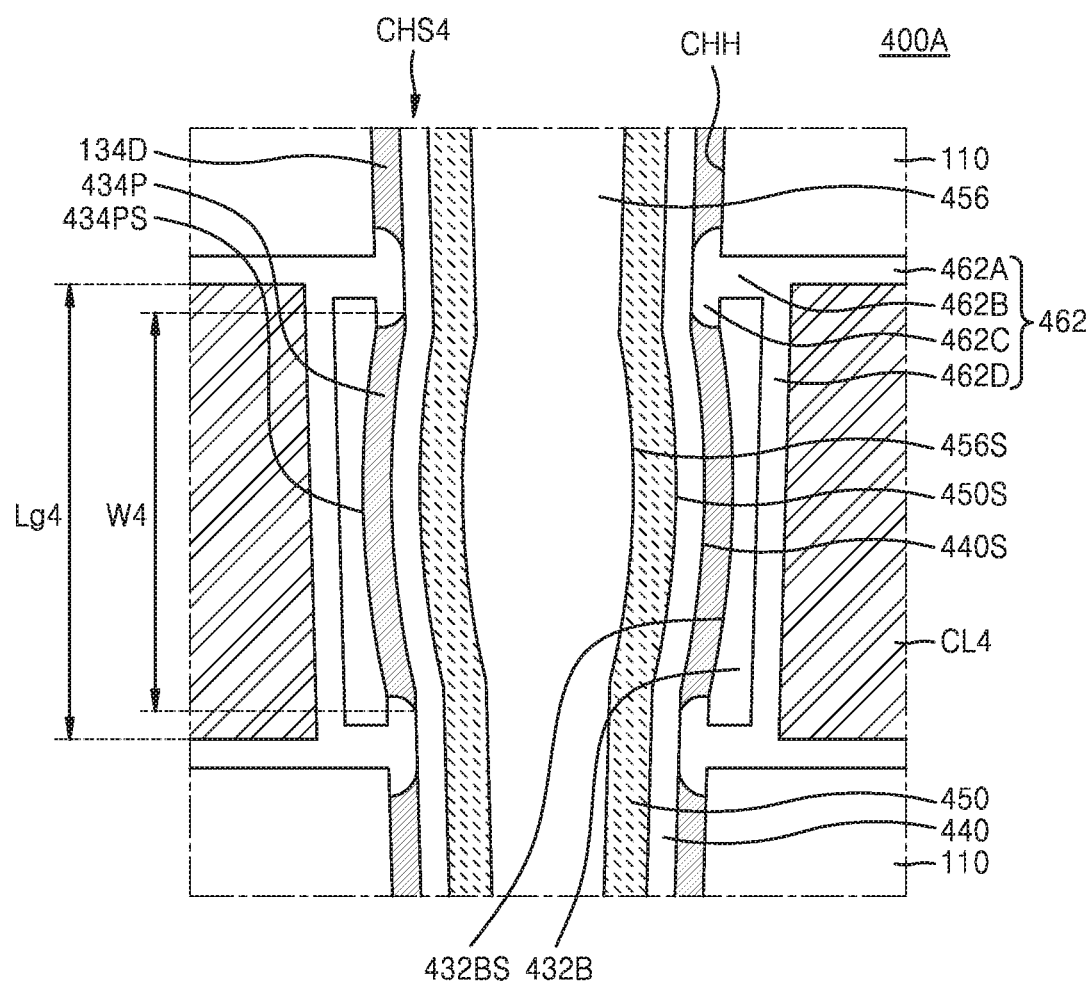
FIGS. 10A and 10B are schematic cross-sectional views of an integrated circuit device according to other embodiments.

FIG. 10A is a schematic cross-sectional view of an integrated circuit device 400A according to other embodiments. FIG. 10A illustrates an enlarged cross-sectional structure of an area corresponding to an area of FIG. 3A.

Referring to FIG. 10A, the integrated circuit device 400A may have an equivalent circuit of the memory cell array MCA of the integrated circuit device 100A illustrated in FIG. 1 and may have substantially the same structure as the integrated circuit device 100A illustrated in FIGS. 3A and 3B. In particular, a portion forming the plurality of word lines WL1, WL2, . . . , WLn-1, and WLn (WL) in FIG. 1 may have a structure as illustrated in FIGS. 3A and 3B. However, in the integrated circuit device 400A, a portion forming at least one of the ground selection line GSL and the string selection line SSL of FIG. 1 may include a conductive line CL4, rather than the conductive line CL illustrated in FIGS. 3A and 3B. A vertical thickness of the conductive line CL4 may be greater than a vertical thickness of the conductive line CL illustrated in FIGS. 3A and 3B. For example, the vertical thickness of the conductive line CL4 in the integrated circuit device 400A may be at least two times the vertical thickness of the conductive line CL (see FIGS. 3A and 3B) forming the plurality of word lines WL1, WL2, . . . , WLn-1, and WLn (WL). However, it is not limited thereto.

The integrated circuit device 400A may include a channel structure CHS4 having a portion thereof penetrating the conductive line CL4. The channel structure CHS4 may include a channel layer 450 extending in the channel hole CHH in a vertical direction and a buried insulating layer 456 filling the inner space of the channel layer 450. A first blocking dielectric pattern 432B may be arranged between the conductive line CL4 and the channel structure CHS4. The first blocking dielectric pattern 432B may be arranged between two adjacent insulating layers 110 and at least a portion of the first blocking dielectric pattern 432B may vertically overlap the insulating layer 110. The first blocking dielectric pattern 432B may have a concave side wall 432BS concave toward the channel layer 450. A horizontal width of the first blocking dielectric pattern 432B may be about 3 nm to about 10 nm, for example, about 3 nm to about 5 nm.

A charge trap pattern 434P and a tunneling dielectric layer 440 may be arranged between the first blocking dielectric pattern 432B and the channel layer 450. The tunneling dielectric layer 440 may extend in a direction in which the channel layer 450 extends, between the charge trap pattern 434P and the channel layer 450 and between the dummy charge trap pattern 134D and the channel layer 450. The charge trap pattern 434P may include a silicon oxide layer. Each of the charge trap pattern 434P, the tunneling dielectric layer 440, and the channel layer 450 may have a constant horizontal width in a longitudinal direction thereof. In the vertical direction, a length W4 of the charge trap pattern 334P may be equal to or less than a length Lg4 of the conductive line CL4 and equal to or greater than a half of the length Lg1 of the conductive line CL4. The charge trap pattern 434P may not include a portion facing a corner of the conductive line CL4, the corner being the closest to the insulating layer 110. Thus, adverse effects on the charge trap pattern 434P caused by an electric field concentrated at the corner of the conductive line CL4 may be minimized.

The charge trap pattern 434P may include a convex side wall 434PS facing a concave side wall 432BS of the first blocking dielectric pattern 432B. The convex side wall 434PS of the charge trap pattern 434P may contact the concave side wall 432BS of the first blocking dielectric pattern 432B. The tunneling dielectric layer 440 may have a convex side wall 440S facing the concave side wall 432BS of the first blocking dielectric pattern 432B. The channel layer 450 may have a convex side wall 450S facing the concave side wall 432BS of the first blocking dielectric pattern 432B. The buried insulating layer 456 may have a convex side wall 456S facing the concave side wall 432BS of the first blocking dielectric pattern 432B.

The conductive line CL4 may be surrounded by a second blocking dielectric pattern 462. The second blocking dielectric pattern 462 may include a first portion 462A between the conductive line CL4 and the insulating layer 110, a second portion 462B between the first blocking dielectric pattern 432B and the insulating layer 110, a third portion 462C between the charge trap pattern 434P and the dummy charge trap pattern 134D, and a fourth portion 462D between the conductive line CL4 and the first blocking dielectric pattern 432B. The first portion 462A, the second portion 462B, the third portion 462C, and the fourth portion 462D of the second blocking dielectric pattern 462 may be integrally connected to one another. The third portion 462C of the second blocking dielectric pattern 462 may fill respective spaces between the plurality of charge trap patterns 434P and the plurality of dummy charge trap patterns 134D. A more detailed structure of each of the first blocking dielectric pattern 432B, the charge trap pattern 434P, the tunneling dielectric layer 440, the channel layer 450, the buried insulating layer 456, the second blocking dielectric pattern 462, and the conductive line CL4 is the same as described with respect to the first blocking dielectric pattern 132B, the charge trap pattern 134P, the tunneling dielectric layer 140, the channel layer 150, the buried insulating layer 156, the second blocking dielectric pattern 162, and the conductive line CL illustrated in FIGS. 3A and 3B, and thus a repeated description thereof is omitted for conciseness.

In the integrated circuit device 400A illustrated in FIG. 10A, like the case described in FIG. 4A about the interface between the first blocking dielectric pattern 132B and the second blocking dielectric pattern 162, a visual interface may not exist between the first blocking dielectric pattern 432B and the second blocking dielectric pattern 462. In this case, the plurality of first blocking dielectric patterns 432B and the plurality of second blocking dielectric patterns 462 may include the same material as each other.

Figure 10B:
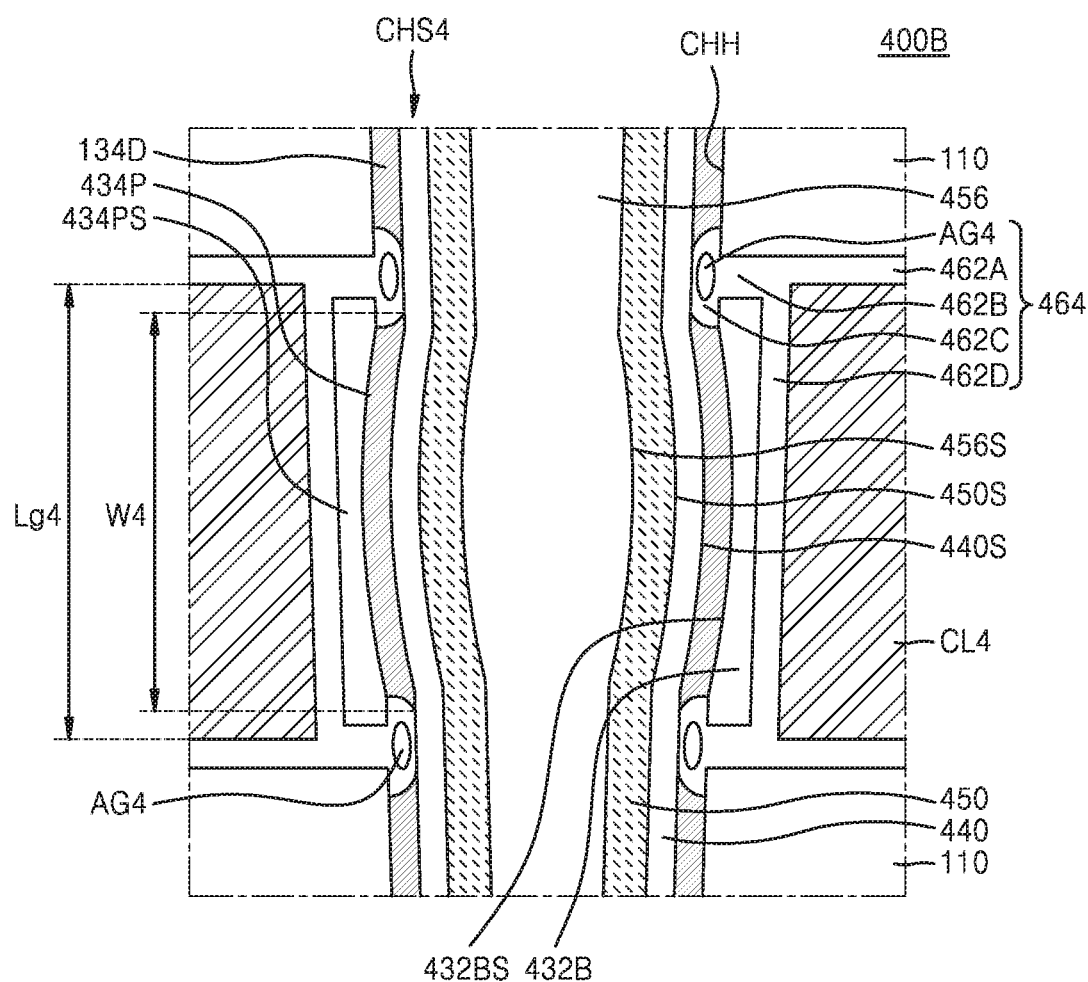

FIG. 10B is a schematic cross-sectional view of an integrated circuit device 400B according to other embodiments.

Referring to FIG. 10B, the integrated circuit device 400B may have substantially the same structure as the integrated circuit device 400A illustrated in FIG. 10A. However, the integrated circuit device 400B may include a second blocking dielectric pattern 464. The second blocking dielectric pattern 464 may have substantially the same structure as the second blocking dielectric pattern 462 illustrated in FIG. 10A. However, the third portion 462C of the second blocking dielectric pattern 464 may include an air gap AG4. A cross-sectional shape of the air gap AG4 is not limited to the shape illustrated in FIG. 10A. The air gap AG4 may have various widths and heights. Since the third portion 462C of the second blocking dielectric pattern 464 includes the air gap AG4, a dielectric constant between the plurality of charge trap patterns 434P may be lowered, and an effect of preventing cell interference caused by charge diffusion between adjacent cells in a vertical-type memory device may be improved.

In the integrated circuit device 400B illustrated in FIG. 10B, like the case described in FIG. 4A about the interface between the first blocking dielectric pattern 132B and the second blocking dielectric pattern 162, a visual interface may not exist between the first blocking dielectric pattern 432B and the second blocking dielectric pattern 464. In this case, the plurality of first blocking dielectric patterns 432B and the plurality of second blocking dielectric patterns 464 may include the same material as each other. Similarly, in some other embodiments, various combinations of the features of the embodiments shown in FIGS. 4A-10B may be provided.

Figure 11A:
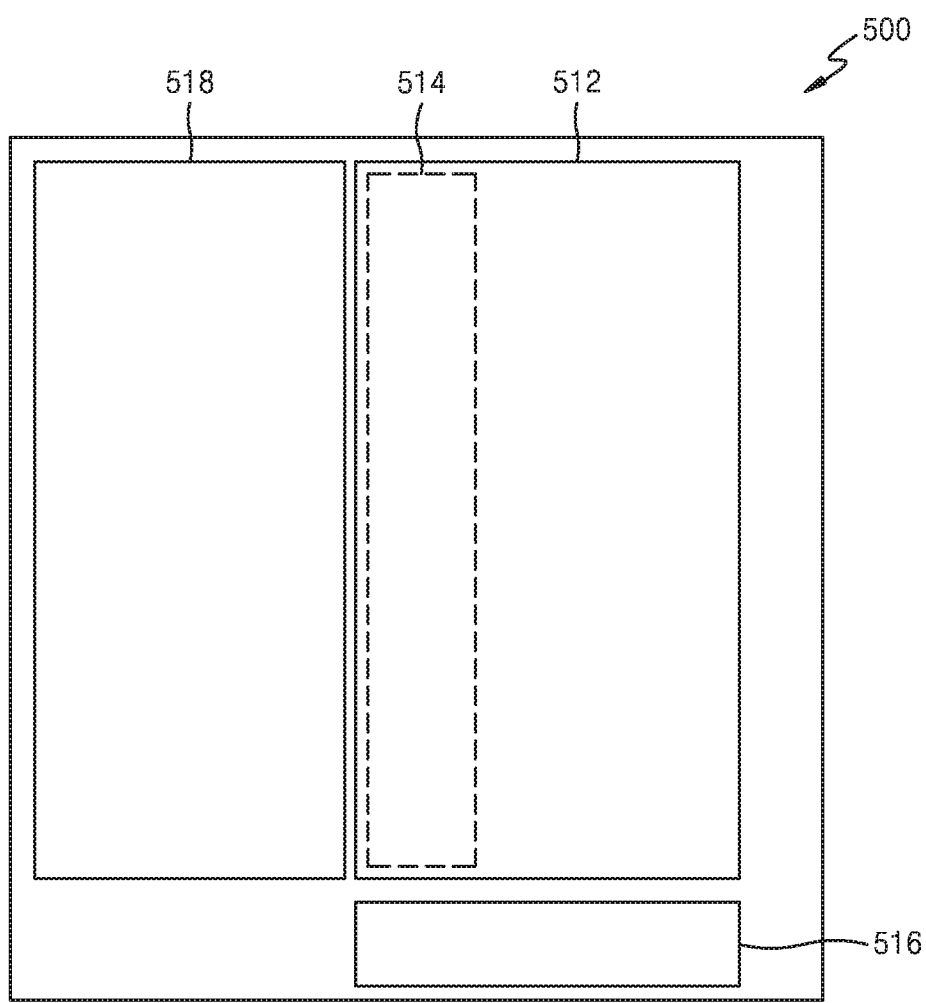
FIG. 11A is a plan layout diagram of an integrated circuit device according to other embodiments.

FIG. 11A is a planar layout diagram of an integrated circuit device 500 according to other embodiments.

Referring to FIG. 11A, the integrated circuit device 500 may include a memory cell array region 512, a first peripheral circuit region 514, a second peripheral circuit region 516, and a bonding pad region 518. The memory cell array region 512 may include the plurality of memory cell arrays MCA having the structure described with reference to FIG. 1. The first peripheral circuit region 514 and the second peripheral circuit region 516 may include a control unit that controls a data input or output to or from the memory cell array region 512. Peripheral circuits that drive vertical-type memory cells included in the memory cell array region 512 may be arranged in the first peripheral circuit region 514 and the second peripheral circuit region 516.

The first peripheral circuit region 514 may be arranged to vertically overlap the memory cell array region 512, and thus, may reduce a planar size of a chip including the integrated circuit device 500. In some embodiments, the peripheral circuits arranged in the first peripheral circuit region 514 may be circuits capable of processing data input/output to/from the memory cell array region 512 at a high speed. For example, the peripheral circuits arranged in the first peripheral circuit region 514 may include a page buffer, a latch circuit, a cache circuit, a column decoder, a sense amplifier, or a data in/out circuit.

The second peripheral circuit region 516 may be arranged below the memory cell array region 512 not to overlap the memory cell array region 512 and the first peripheral circuit region 514. The peripheral circuits formed in the second peripheral circuit region 516 may be, for example, a row decoder. In some embodiments, unlike the example illustrated in FIG. 11A, at least a portion of the second peripheral circuit region 516 may be at a side of the memory cell array region 512.

The bonding pad region 518 may be formed at the other side of the memory cell array region 512. The bonding pad region 518 may be a region where wires connected from word lines of each of the vertical-type memory cells of the memory cell array region 512 are formed.

Figure 11B:
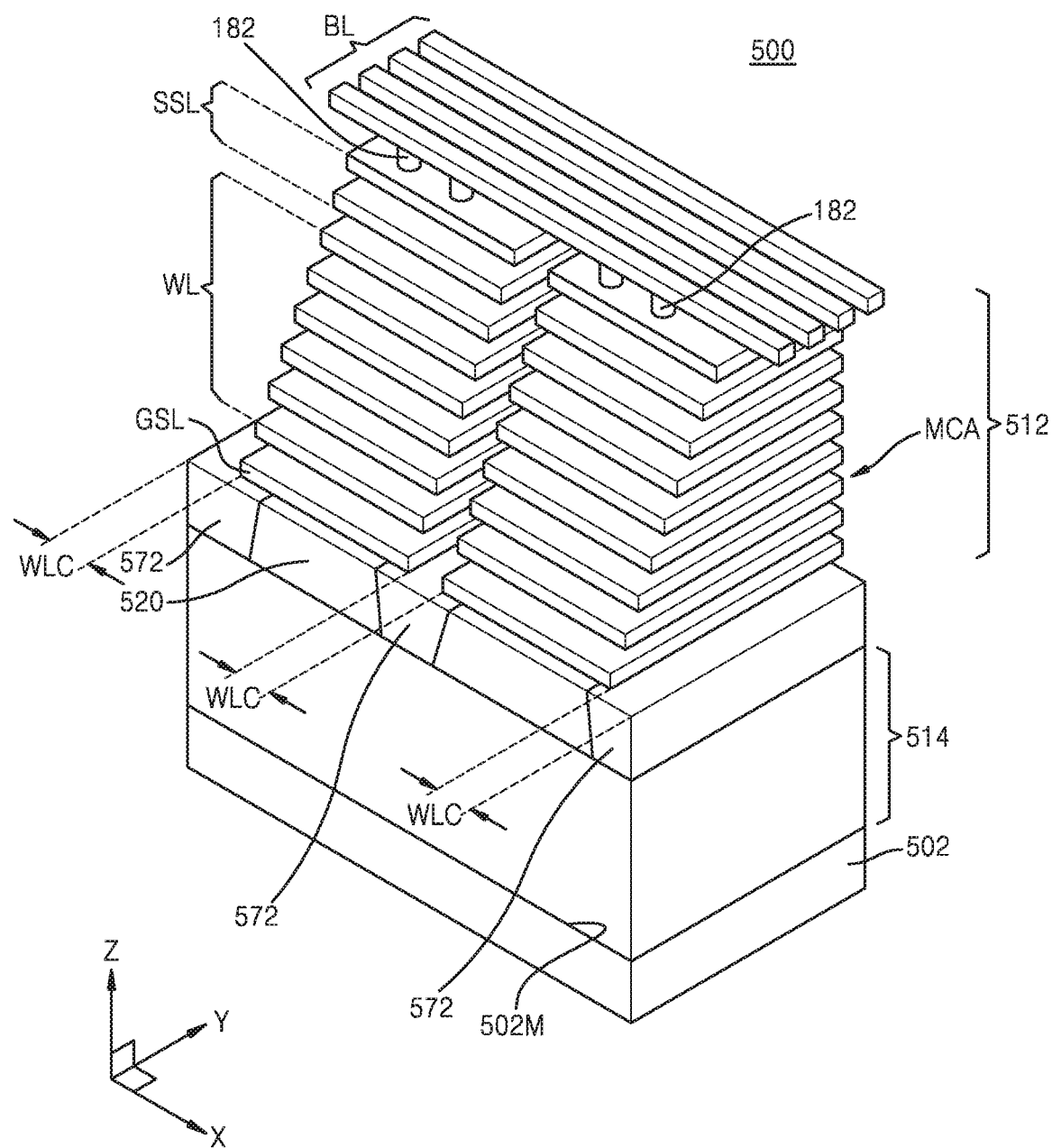
FIG. 11B is a schematic perspective view of one or more regions of the integrated circuit device illustrated in FIG. 11A.
Figure 11C:
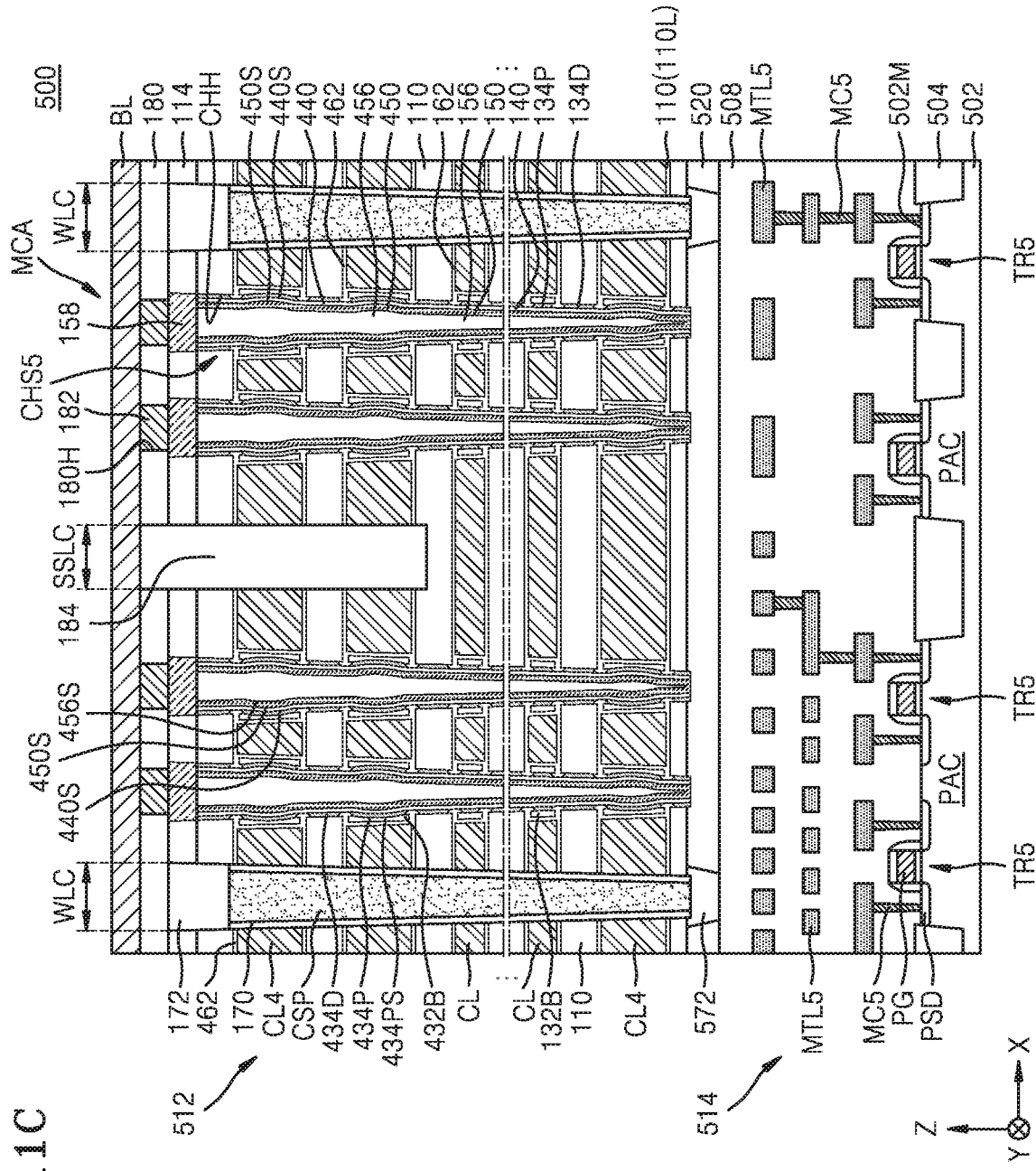
FIG. 11C is a schematic cross-sectional view of one or more regions of the integrated circuit device illustrated in FIG. 11A.

FIGS. 11B and 11C are respectively a schematic perspective view and a schematic cross-sectional view of a region of the integrated circuit device 500 illustrated in FIG. 11A. In FIGS. 11B and 11C, reference numerals that are the same as the reference numerals in FIGS. 1 through 3 indicate the same members, and their detailed descriptions will not be repeated for conciseness.

Referring to FIGS. 11B and 11C, the integrated circuit device 500 may include the first peripheral circuit region 514 formed at a first level on a substrate 502 and the memory cell array region 512 formed at a second level on the substrate 502, wherein the second level is higher than the first level. Here, the term "level" denotes a height in a vertical direction (a Z direction in FIGS. 11B and 11C) with reference to the substrate 502. In other words, the first level on the substrate 502 is closer to the substrate 502 than the second level.

The substrate 502 may have a main surface 502M extending in an X direction and a Y direction. A more detailed aspect of the substrate 502 is substantially the same as the detailed aspect of the substrate 102 described with reference to FIGS. 3A and 3B. A peripheral active region PAC may be defined on the substrate 502 by a device isolating layer 504. A plurality of transistors TR5 forming the first peripheral circuit region 514 may be formed above the peripheral active region PAC of the substrate 502. Each of the plurality of transistors TR5 may include a peripheral gate PG and a peripheral source/drain region PSD formed in the peripheral active region PAC at both sides of the peripheral gate PG. In some embodiments, unit devices, such as a resistor, a capacitor, etc., may further be arranged in the first peripheral circuit region 514. A peripheral interlayer insulating layer 508 may be formed above the plurality of transistors TR5. The peripheral interlayer insulating layer 508 may include silicon oxide, SiON, SiOCN, etc.

The first peripheral circuit region 514 may include a plurality of peripheral circuit wiring layers MTL5 and a plurality of peripheral circuit contacts MC5. Some of the plurality of peripheral circuit wiring layers MTL5 may be formed to be electrically connected to the plurality of transistors TR5. The plurality of peripheral circuit contacts MC5 may be formed to inter-connect some peripheral circuit wiring layers selected from among the plurality of peripheral circuit wiring layers MTL5. The plurality of peripheral circuit wiring layers MTL5 and the plurality of peripheral circuit contacts MC5 may be covered by the peripheral circuit interlayer insulating layer 508.

Each of the plurality of peripheral circuit wiring layers MTL5 and the plurality of peripheral circuit contacts MC5 may include metal, conductive metal nitride, metal silicide, or a combination thereof. For example, each of the plurality of peripheral circuit wiring layers MTL5 and the plurality of peripheral circuit contacts MC5 may include a conductive material, such as tungsten, molybdenum, titanium, cobalt, tantalum, nickel, tungsten silicide, titanium silicide, cobalt silicide, tantalum silicide, nickel silicide, etc. FIG. 11C illustrates that the plurality of peripheral circuit wiring layers MTL5 have a triple-layered wiring structure in the vertical direction (the Z direction). However, the inventive concept is not limited to the example illustrated in FIG. 11C. For example, the plurality of peripheral circuit wiring layers MTL5 may have a multi-layered wiring structure, such as a double-layered wiring structure or a quadruple or higher-layered wiring structure.

A semiconductor layer 520 covering the peripheral interlayer insulating layer 508 may be formed above the first peripheral circuit region 514. The semiconductor layer 520 may include Si, Ge, or a combination thereof. The semiconductor layer 520 may include a doped semiconductor or an un-doped semiconductor. The semiconductor layer 520 may have a mono-crystalline structure, an amorphous structure, or a poly-crystalline structure. A plurality of common source regions 572 may be formed on the semiconductor layer 520. A more detailed structure of the plurality of common source regions 572 is substantially the same as the structure of the common source region 160 described with reference to FIGS. 3A and 3B. The plurality of common source regions 572 may be formed in the semiconductor layer 520 by doping impurities.

The memory cell array region 512 may be formed on the semiconductor layer 520. The memory cell array region 512 may have substantially the same structure as the memory cell array MCA of the integrated circuit device 100A described with reference to FIGS. 3A and 3B. In particular, portions of the memory cell array region 512, which correspond to the plurality of word lines WL1, WL2, . . . , WLn−1, and WLn (WL) in FIG. 1, may have the same structure as illustrated in FIGS. 3A and 3B. However, in the integrated circuit device 500, portions corresponding to the ground selection line GSL and the common source line CSL of FIG. 1 may have the same structure as described with reference to FIG. 10A.

In more detail, in the integrated circuit device 500, the portions corresponding to the plurality of word lines WL1, WL2, . . . , WLn−1, and WLn (WL) in FIG. 1 may include the conductive lines CL illustrated in FIGS. 3A and 3B, FIGS. 6A and 6B, or FIGS. 8A and 8B, and the portions corresponding to the ground selection line GSL and the common source line CSL in FIG. 1 may include the conductive lines CL4 illustrated in FIG. 10A. The integrated circuit device 500 may include the plurality conductive lines CL, the plurality of conductive lines CL4, and a channel structure CHS5 penetrating the plurality of conductive lines CL and CL4. Portions of the channel structure CHS5, the portions penetrating the plurality of conductive lines CL, may have the same structure as the channel structure CHS1 described with reference to FIGS. 3A and 3B and, in other embodiments may incorporate the features of the example embodiments illustrated in FIGS. 4A-9. Portions of the channel structure CHS5, the portions penetrating the plurality of conductive lines CL4, may have the same structure as the channel structure CHS4 described with reference to FIG. 10A or 10B.

Next, a method of manufacturing an integrated circuit device, according to embodiments, will be described in detail.

FIGS. 12A through 12M are cross-sectional views illustrated according to a process order for describing a method of manufacturing the integrated circuit device 100A, according to embodiments. An example method of manufacturing the integrated circuit device 100A described with reference to FIGS. 3A and 3B will be described. FIGS. 12A through 12M illustrate, according to a process order, an enlarged cross-sectional structure of an area corresponding to a dashed line region indicated by Q1 of FIG. 3A.

Figure 12A:
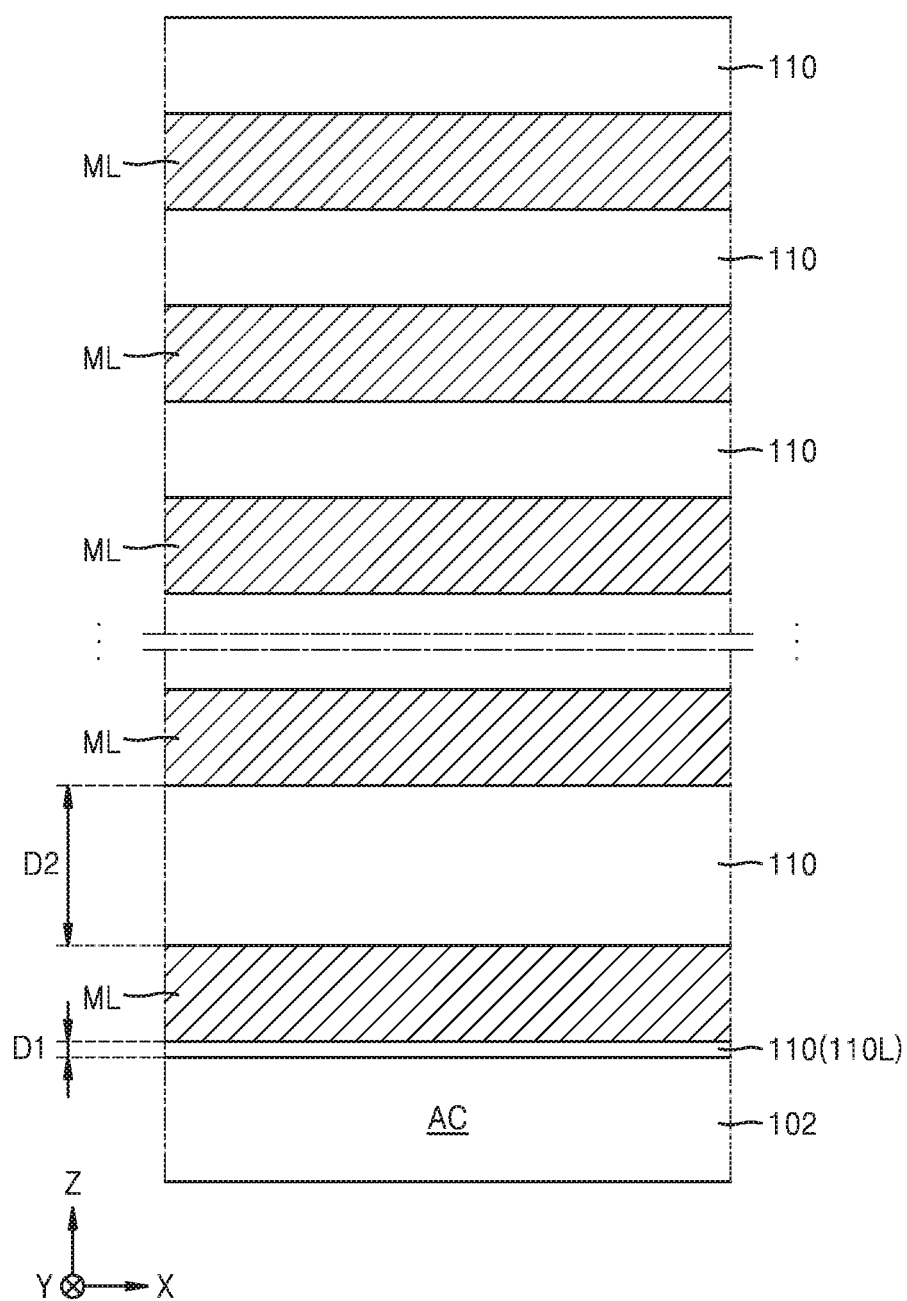
FIGS. 12A through 12M are cross-sectional views illustrated according to a process order for describing a method of manufacturing an integrated circuit device, according to embodiments.

Referring to FIG. 12A, the active region AC may be defined on the substrate 102 and the plurality of insulating layers 110 and a plurality of mold layers ML may be respectively alternately stacked on the substrate 102. A lowermost insulating layer 110L from among the plurality of insulating layers 110, which contacts the substrate 102, may have a smaller thickness D1 than the other insulating layers 110. The plurality of insulating layers 110 may include a silicon oxide layer and the plurality of mold layers ML may include a silicon nitride layer.

The plurality of mold layers ML may provide spaces for forming the ground selection line GSL, the plurality of word lines WL, and the plurality of string selection lines SSL, respectively, in sequential processes. A first mold layer ML closest to the substrate 102, from among the plurality of mold layers ML, may provide the space for forming the ground selection line GSL. An insulating layer from among the plurality of insulating layers 110, which contacts an upper surface of the first mold layer ML, may have a greater thickness D2 than the other insulating layers 110. Each of the plurality of insulating layers 110 and the plurality of mold layers ML may be formed by using chemical vapor deposition (CVD), plasma enhanced CVD (PECVD), or atomic layer deposition (ALD).

Figure 12B:
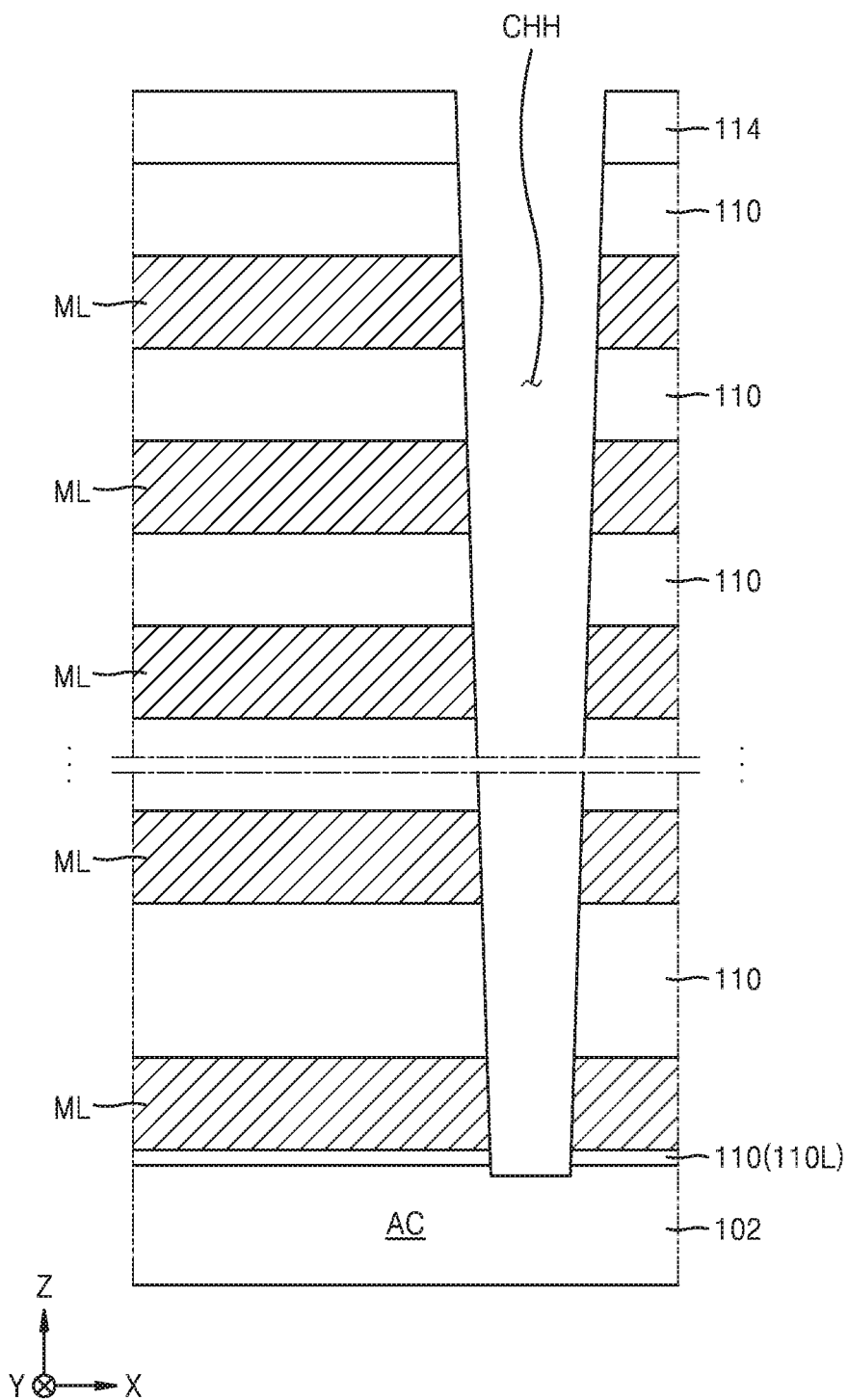

Referring to FIG. 12B, after the insulating pattern 114 is formed on an uppermost insulating layer 110 from among the plurality of insulating layers 110, anisotropic etching may be performed on the plurality of insulating layers 110 and the plurality of mold layers ML by using the insulating pattern 114 as an etch mask, in order to form the channel hole CHH exposing the substrate 102.

Horizontal widths of the channel hole CHH may be decreased toward the substrate 102. In other words, a horizontal width of the channel hole CHH may gradually decreases as a distance from the substrate 102 decreases. The insulating pattern 114 may include a single layer or multiple layers including an oxide layer, a nitride layer, or a combination thereof.

Figure 12C:
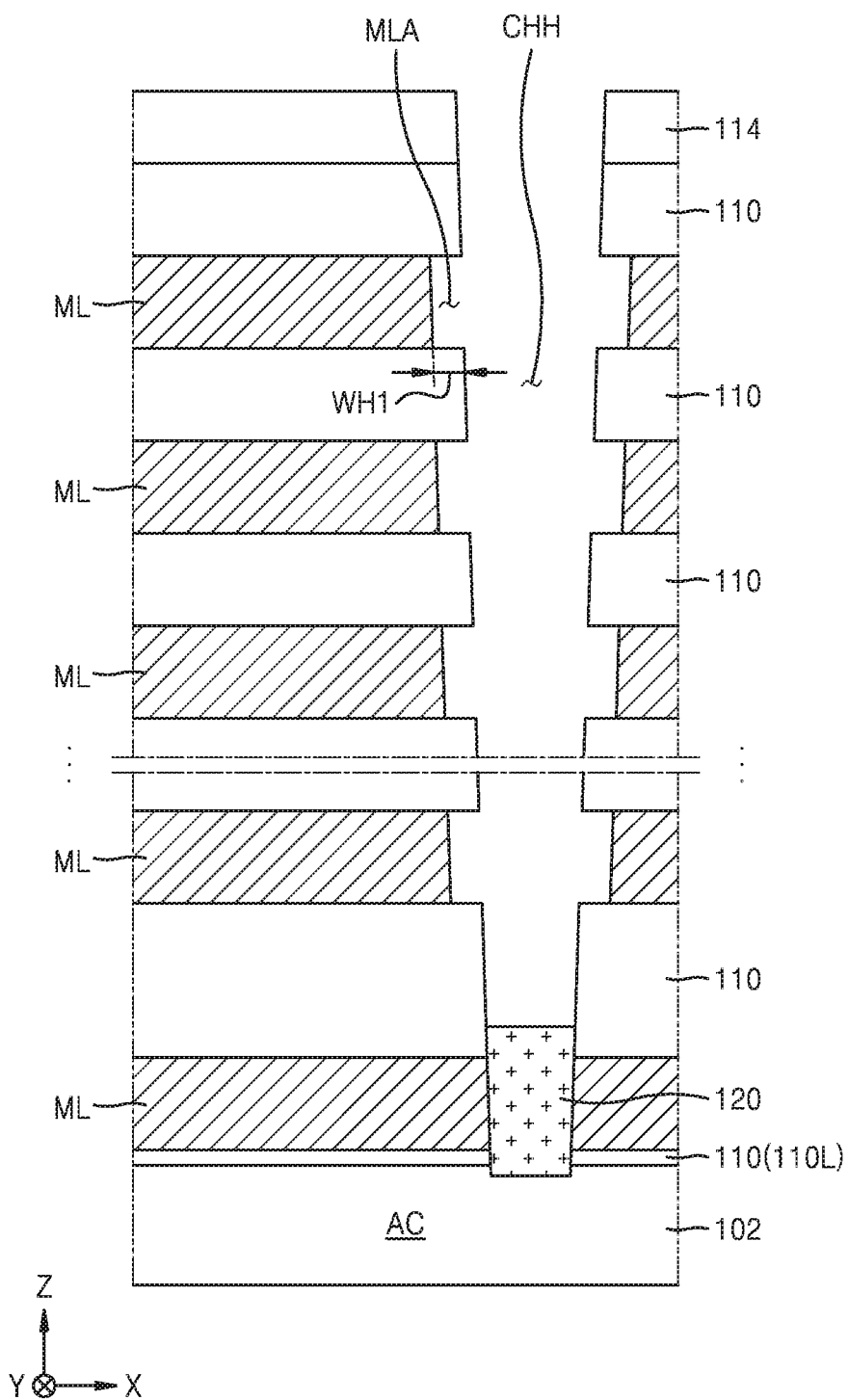

Referring to FIG. 12C, the semiconductor pattern 120 partially filling the channel hole CHH may be formed by performing a selective epitaxial growth process from the bottom of the channel hole CHH. The semiconductor pattern 120 may include a doped semiconductor layer, for example, a doped Si layer or a doped Ge layer.

A portion of each of the plurality of mold layers ML may be selectively trimmed from a side wall of each of the plurality of mold layers ML that is exposed through the channel hole CHH. Accordingly, a plurality of mold indents MLA connected to the channel hole CHH between each of the plurality of insulating layers 110 may be formed. A horizontal width WH1 of each of the plurality of mold indents MLA may be about 3 nm to about 10 nm. In some embodiments, the horizontal width WH1 may be, for example, about 3 nm to about 5 nm.

An etching process for selectively etching the plurality of mold layers ML from among the plurality of mold layers ML and the plurality of insulating layers 110 may be used to trim the plurality of mold layers ML. For example, when the plurality of mold layers ML include silicon nitride layers and the plurality of insulating layers 110 include silicon oxide layers, an etchant, such as an ammonia-based etchant, a phosphoric acid-based etchant, a sulfuric acid-based etchant, an acetic acid-based etchant, or a combination thereof, may be used to selectively trim the portion of each of the plurality of mold layers ML. The process of trimming the plurality of mold layers ML may be performed while the semiconductor pattern 120 is covered by a protective layer (not shown).

Figure 12D:
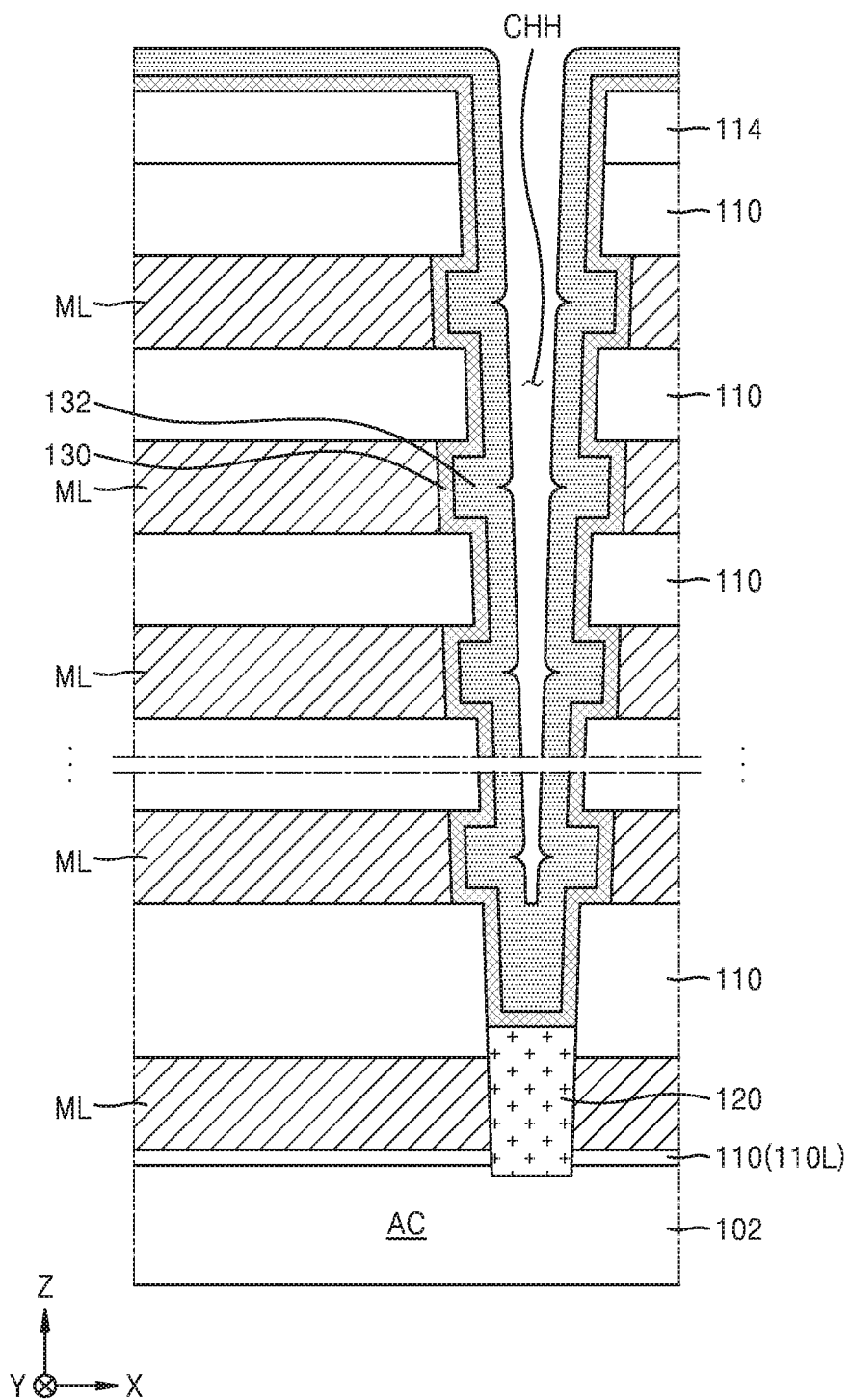

Referring to FIG. 12D, the sacrificial layer 130 and a preliminary blocking insulating layer 132 may be sequentially formed on the resultant structure generated according to FIG. 12C.

The sacrificial layer 130 may be formed to conformally cover surfaces exposed through the channel hole CHH and the plurality of mold indents MLA. The sacrificial layer 130 may include the same material as the plurality of mold layers ML, or a material having the same or substantially the same etch characteristics as a material of the plurality of mold layers ML. For example, the sacrificial layer 130 may include a silicon nitride layer. The sacrificial layer 130 may be formed to have a horizontal width of about 3 nm to about 10 nm. The preliminary blocking insulating layer 132 may extend long in the channel CHH in a longitudinal direction of the channel hole CHH and fill a portion of each of the plurality of mold indents MLA on the sacrificial layer 130. The preliminary blocking insulating layer 132 may include a doped polysilicon layer or an un-doped polysilicon layer. The preliminary blocking insulating layer 132 may have a sufficient thickness to fill the plurality of mold indents MLA on the sacrificial layer 130. In order to form the sacrificial layer 130 and the preliminary blocking insulating layer 132, an ALD process, a CVD process, or a combination thereof may be used.

Figure 12E:
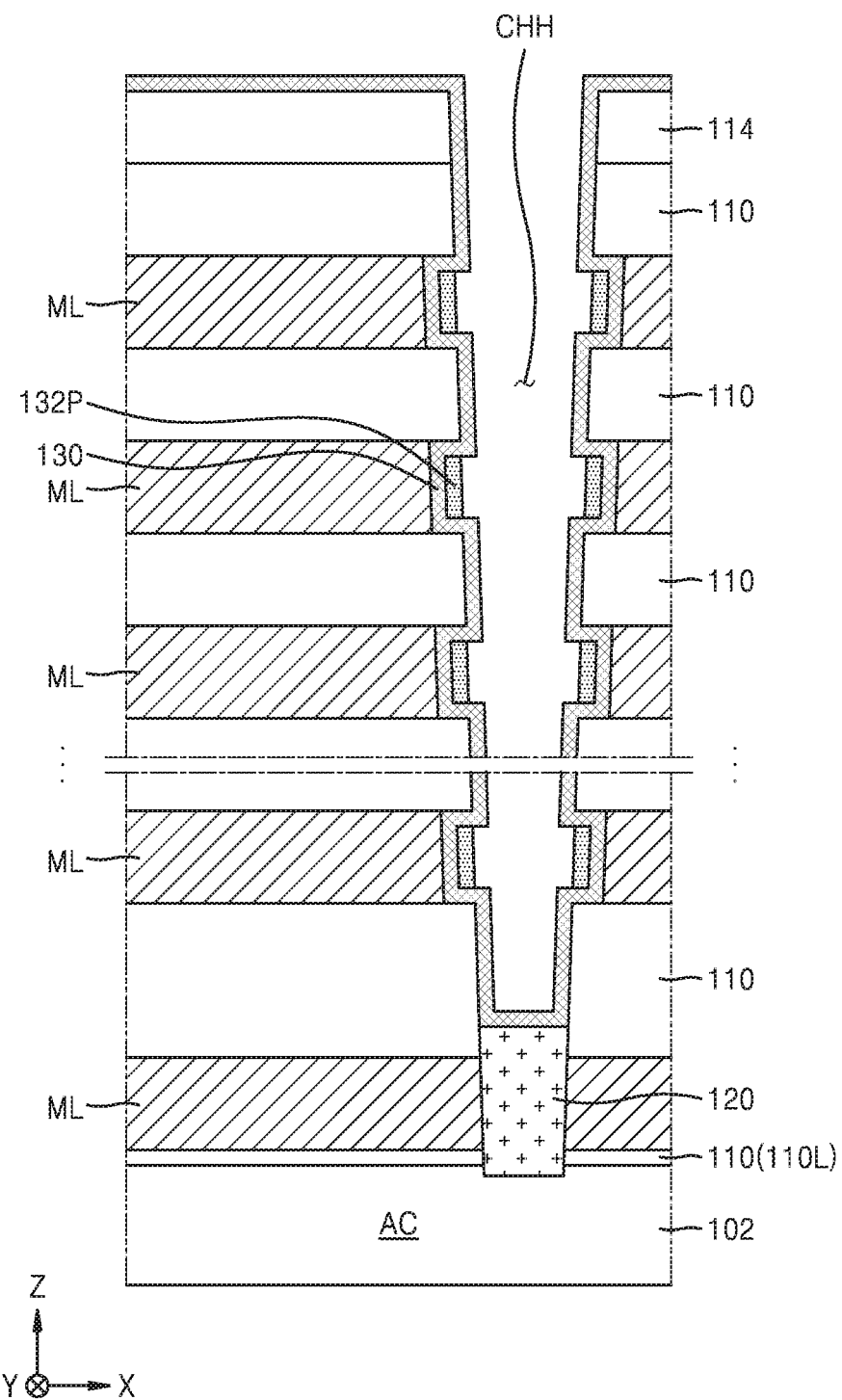

Referring to FIG. 12E, with respect to the resultant structure generated according to the FIG. 12D, the preliminary blocking insulating layer 132 may be trimmed such that only the portions of the preliminary blocking insulating layer 132 that fill the plurality of mold indents MLA remain. As a result, a plurality of preliminary blocking dielectric patterns 132P formed of the remaining portions of the preliminary blocking insulating layer 132 may be left in the plurality of mold indents MLA. Each of the plurality of preliminary blocking dielectric patterns 132P may fill only the inner space of the plurality of mold indents MLA without protruding into the channel hole CM.

A wet etching process using an etchant may be used to trim the preliminary blocking insulating layer 132. The etchant may include a mixture solution including nitric acid and hydrofluoric acid; a mixture solution including ammonia, peroxide, and water; or a mixture solution including a hydroxide alkylammonium compound, peroxide, and water. However, example embodiments are not limited thereto.

Figure 12F:
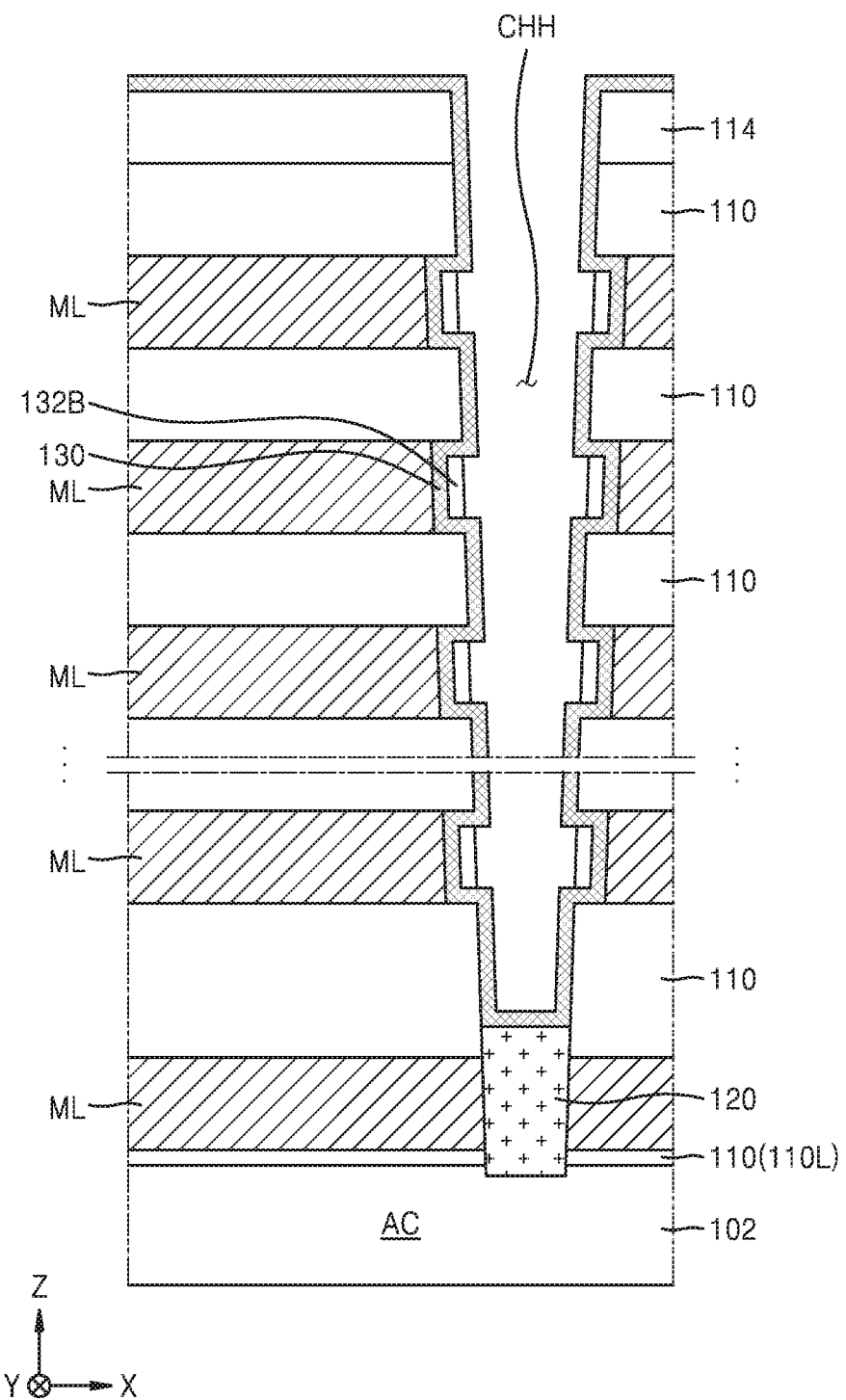

Referring to FIG. 12F, the first blocking dielectric patterns 132B including the oxide layers may be formed by oxidizing the plurality of preliminary blocking dielectric patterns 132P, with respect to the resultant structure generated according to FIG. 12E. When the plurality of preliminary blocking dielectric patterns 132P include polysilicon layers, the first blocking dielectric patterns 132B may include silicon oxide layers.

In order to oxidize the plurality of preliminary blocking dielectric patterns 132P, a dry oxidization process or a wet oxidization process may be used. For example, when the plurality of preliminary blocking dielectric patterns 132P are dry-oxidized, a plasma oxidization process, or a gas flow process using a gas, such as $O_2$, $N_2O$, NO, or a combination thereof, may be used.

Figure 12G:
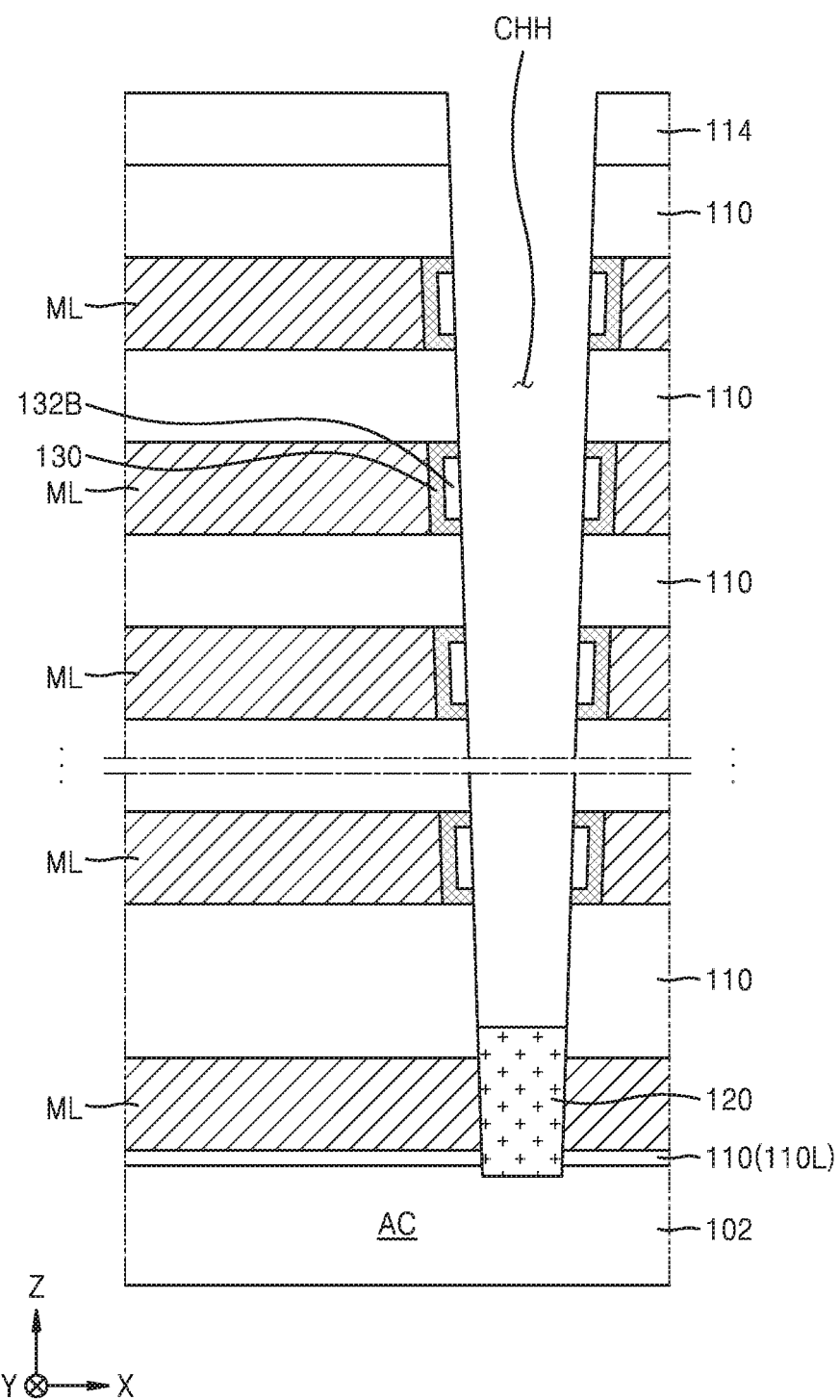

Referring to FIG. 12G, a trimming process may be performed on the resultant structure generated according to FIG. 12F to remove portions of the sacrificial layer 130 that are exposed inside the channel hole CHH and through an upper surface of the insulating pattern 114. Thus, side walls of the plurality of insulating layers 110 may be exposed in the channel hole CHH, and the upper surface of the insulating pattern 114 may be exposed. For trimming the sacrificial layer 130, an etchant, such as an ammonia-based etchant, a phosphoric acid-based etchant, a sulfuric acid-based etchant, an acetic acid-based etchant, or a combination thereof, may be used.

Figure 12H:
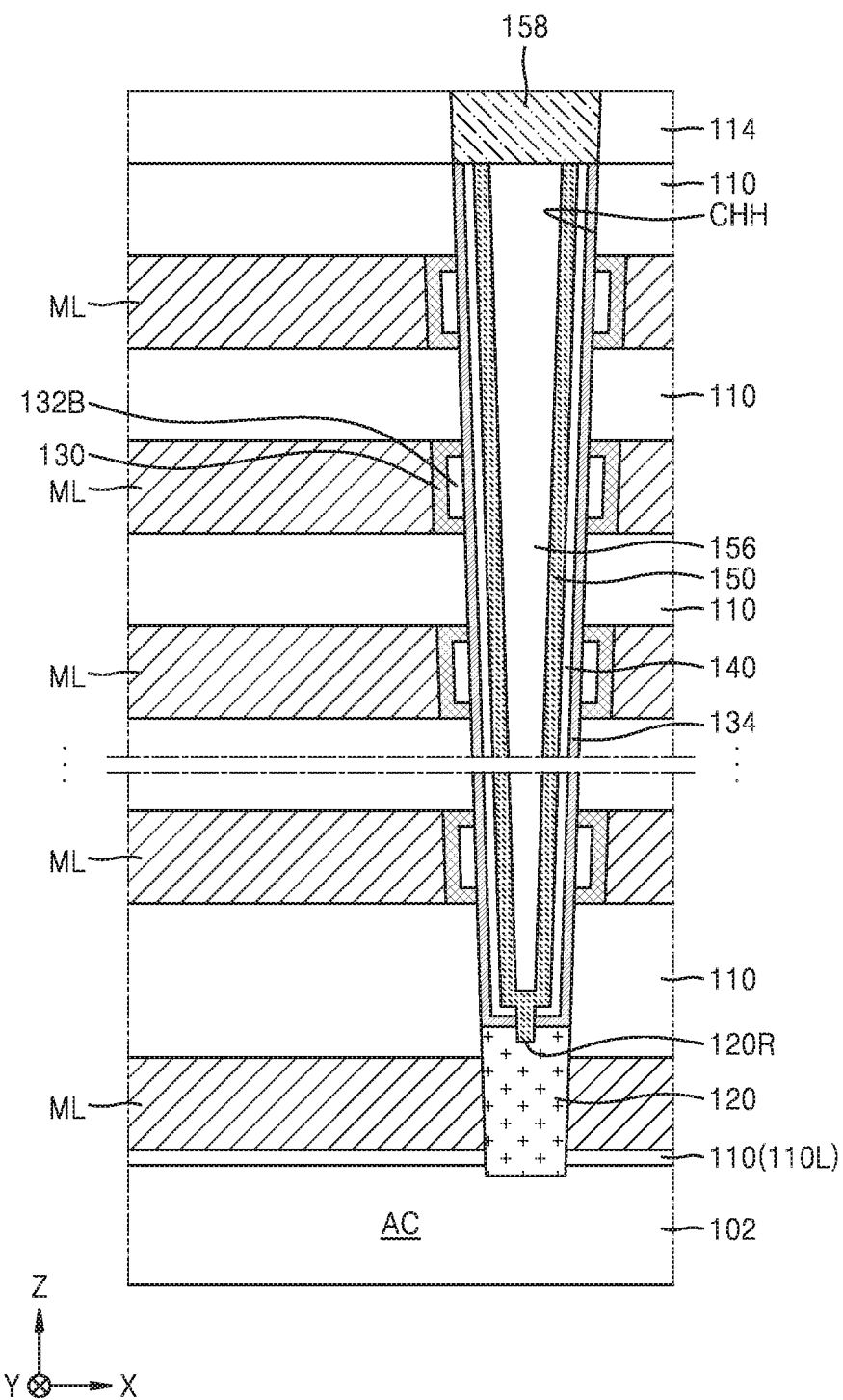

Referring to FIG. 12H, a charge trap layer 134, the tunneling dielectric layer 140, the channel layer 150, and the buried insulating layer 156 may be sequentially formed in the channel hole CHH, based on the resultant structure generated according to FIG. 12G, and the drain region 158 filling an upper entrance portion of the channel hole CHH may be formed. The term "charge trap layer" used in this specification may be interchangeably used with respect to the term "charge storage layer," and the "charge trap layer" and the "charge storage layer" are used to denote the same object.

Each of the charge trap layer 134, the tunneling dielectric layer 140, and the channel layer 150 may have a cylindrical shape in the channel hole CHH. In the process of forming the charge trap layer 134, the tunneling dielectric layer 140, and the channel layer 150, a portion of an upper surface of the semiconductor pattern 120 may be removed, and thus, a recess surface 120R may be formed on the upper surface of the semiconductor pattern 120. The channel layer 150 may contact the recess surface 120R of the semiconductor pattern 120.

A deposition process and an etch-back process may be performed multiple times in order to form the charge trap layer 134, the tunneling dielectric layer 140, the channel layer 150, and the buried insulating layer 156. The deposition process may include CVD, lower pressure CVD (LPCVD), or ALD. The charge trap layer 134 may include a silicon nitride layer. The tunneling dielectric layer 140 may include a silicon oxide layer. The channel layer 150 may include doped polysilicon or un-doped polysilicon. The buried insulating layer 156 may include silicon oxide, silicon nitride, silicon oxynitride, or a combination thereof. The drain region 158 may include doped polysilicon, metal, conductive metal nitride, or a combination thereof. The metal included in the drain region 158 may include tungsten, nickel, cobalt, or tantalum.

Figure 12I:
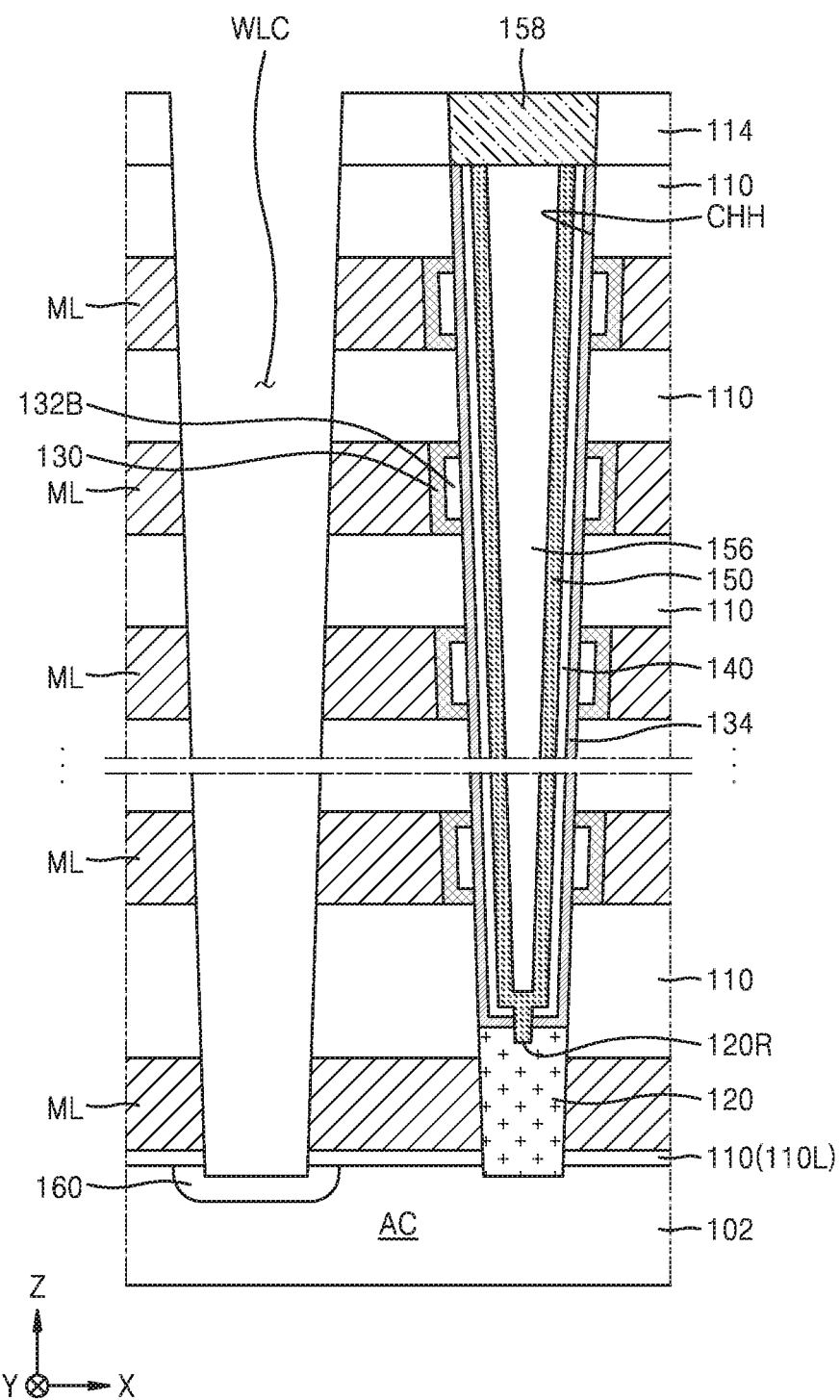

Referring to FIG. 12I, the insulating pattern 114, the plurality of insulating layers 110, and the plurality of mold layers ML may be anisotropic-etched to form the word line cut regions WLC exposing the substrate 102 by penetrating the insulating pattern 114, the plurality of insulating layers 110, and the plurality of mold layers ML, and then, impurity ions may be injected to the substrate 102 through the word line cut regions WLC to form the common source region 160.

Figure 12J:
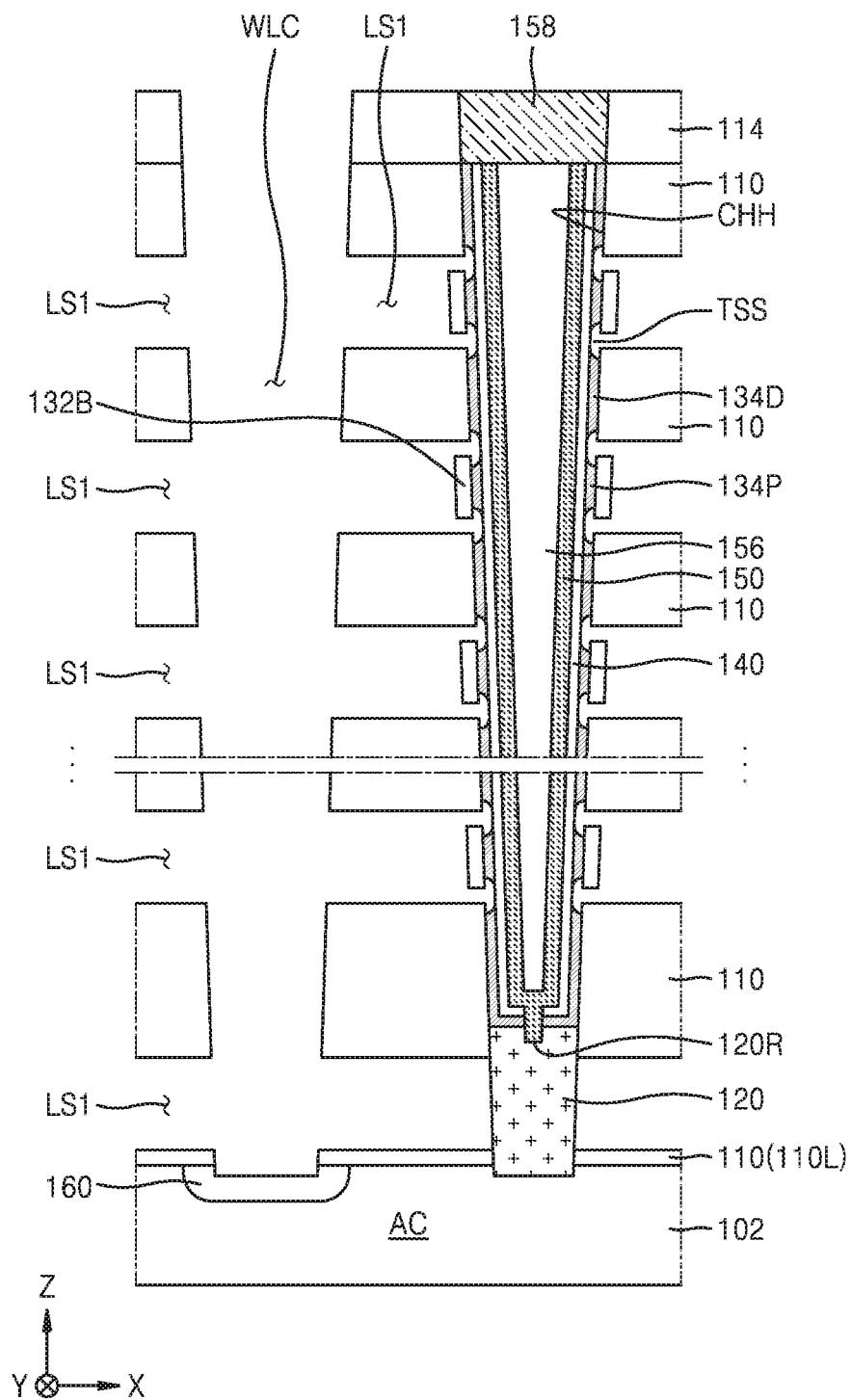

Referring to FIG. 12J, the plurality of mold layers ML may be removed through the word line cut regions WLC to form a plurality of conductive spaces LS1 and the exposed sacrificial layer 130 may be removed through the plurality of conductive spaces LS1. Next, a portion of the charge trap layer 134, the portion being exposed because the sacrificial layer 130 is removed, may be removed, to separate the charge trap layer 134 into the plurality of charge trap patterns 134P and the plurality of dummy charge trap patterns 134D. Respective separating spaces TSS may be formed between the plurality of charge trap patterns 134P and the plurality of dummy charge trap patterns 134D.

When each of the plurality of mold layers ML, the sacrificial layer 130, and the charge trap layer 134 includes a silicon nitride layer, a phosphoric acid-based etchant may be used to form the conductive spaces LS1 and the separating spaces TSS.

Figure 12K:
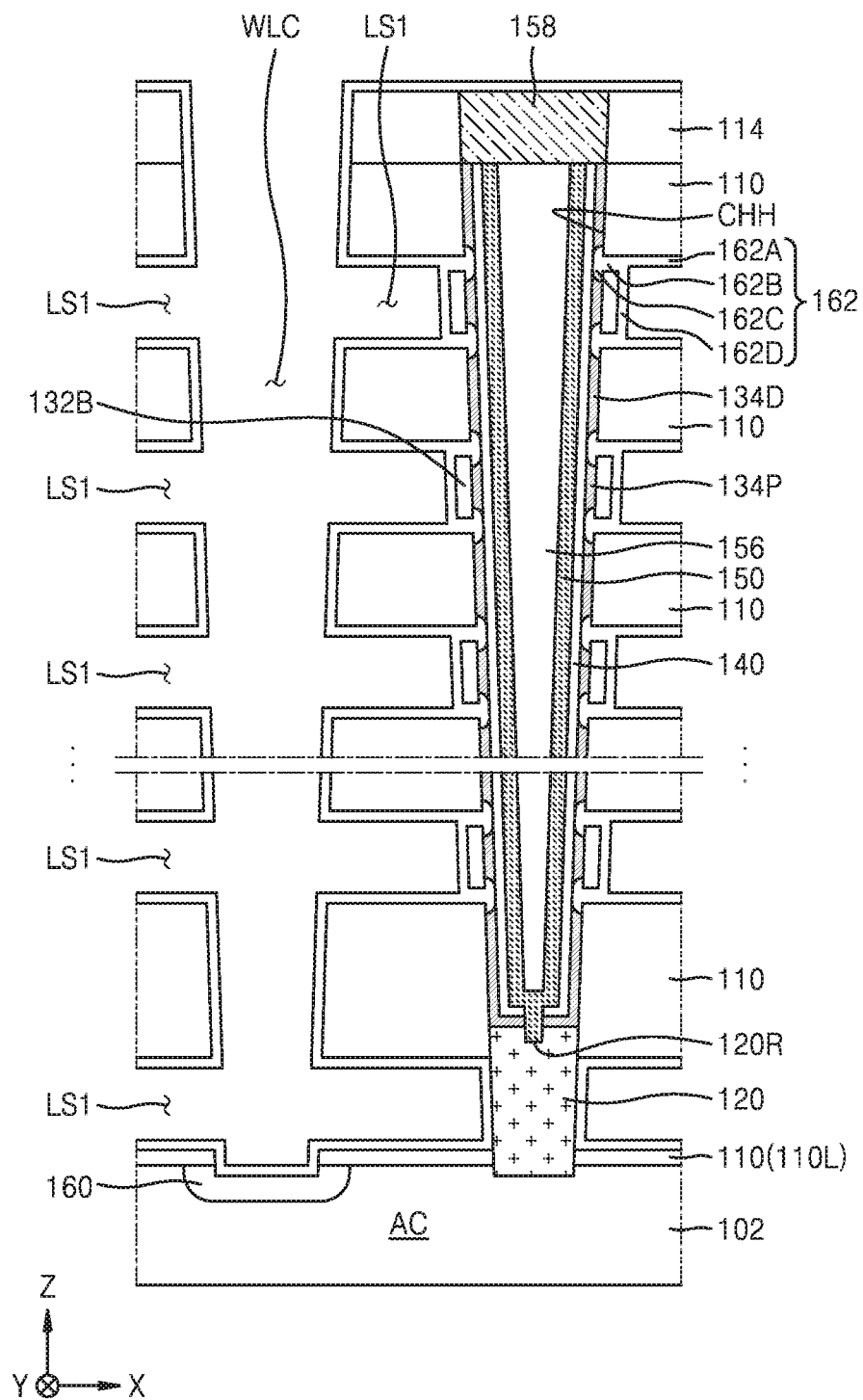

Referring to FIG. 12K, the second blocking dielectric pattern 162 may be formed on the resultant structure generated according to FIG. 12J. The second blocking dielectric pattern 162 may be formed to conformally cover surfaces exposed through the conductive spaces LS1 and the word line cut regions WLC, while filling the separating spaces TSS. The second blocking dielectric pattern 162 may include the first portion 162A covering the insulating layer 110, the second portion 162B between the first blocking dielectric pattern 132B and the insulating layer 110, the third portion 162C filling the separating space TSS between the charge trap pattern 134P and the dummy charge trap pattern 134D, and the fourth portion 162D covering a side wall of the first blocking dielectric pattern 132B facing the conductive space LS1. An ALD process, a CVD process, or a plasma oxidization process may be used to form the second blocking dielectric pattern 162.

Figure 12L:
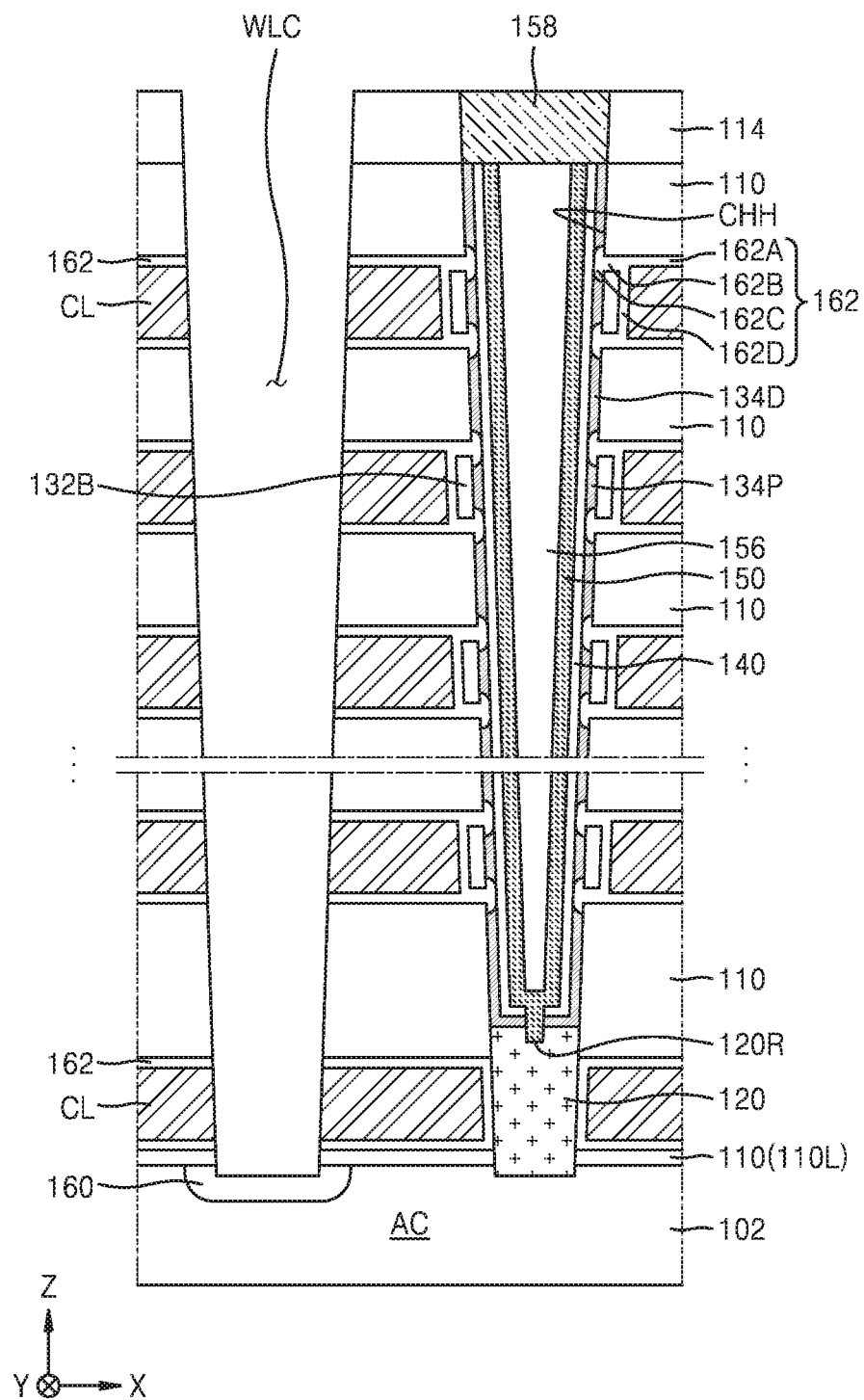

Referring to FIG. 12L, the plurality of conductive lines CL may be formed in the plurality of conductive spaces LS1. To this end, regions of the plurality of conductive spaces LS1 that are defined by the second blocking dielectric pattern 162 through the plurality of word line cut regions WLC, may be filled with conductive layers. The conductive layers may include a metal, for example, tungsten. A side wall, a bottom surface, and an upper surface of the conductive line CL may be covered by the second blocking dielectric pattern 162, in the conductive space LS1.

Figure 12M:
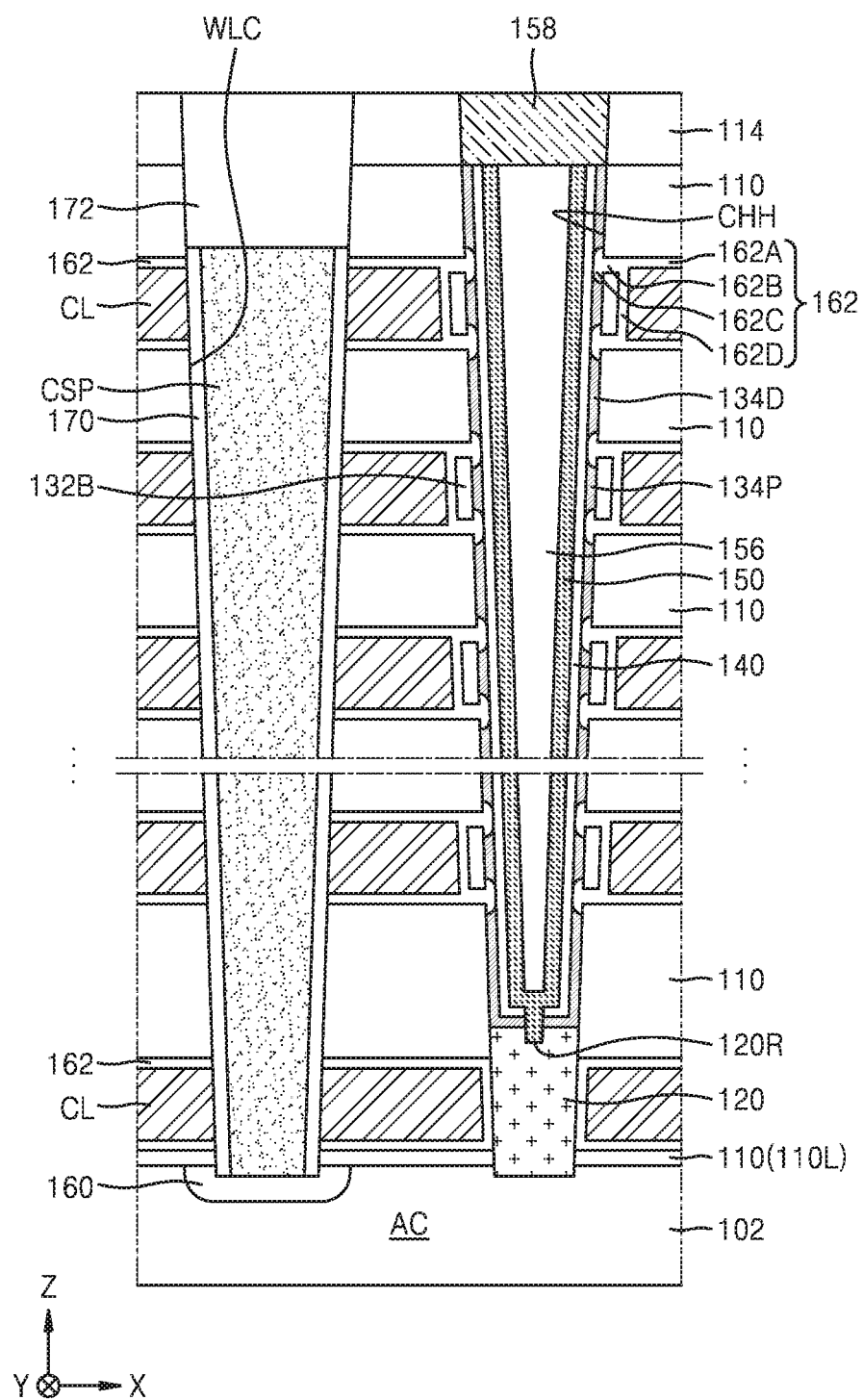

Referring to FIG. 12M, the insulating spacer 170, the common source pattern CSP, and the capping insulating layer 172 may be formed in the word line cut region WLC.

According to example embodiments, in order to form the insulating spacer 170 in the word line cut region WLC, first, a spacer insulating layer covering an inner wall of the word line cut region WLC may be formed. Thereafter, the spacer insulating layer may be etch-backed to expose the common source region 160 through a lower surface of the word line cut region WLC, and thus, the insulating spacer 170 may remain at an inner side wall of the word line cut region WLC.

A conductive layer may be formed inside and outside the word line cut region WLC to fill a space in the word line cut regions WLC that is defined by the insulating spacer 170, with a conductive material, and then, unnecessary portions of the conductive layer may be removed via chemical mechanical polishing (CMP) or an etch-back process, in order to form the common source pattern CSP.

An insulating layer filling a remaining space of the word line cut region WLC may be formed on the resultant object with respect to the insulating spacer 170 and the common source pattern CSP, and then, a portion of the insulating layer may be removed via CMP or an etch-back process to expose an upper surface of the insulating pattern 114 and an upper surface of the drain region 158, in order to form the capping insulating layer 172.

Thereafter, as illustrated in FIG. 3A, the insulating layer 180 covering the insulating pattern 114, the drain region 158, and the capping insulating layer 172 may be formed, and a portion of the insulating layer 180, a portion of the insulating pattern 114, a portion of the insulating layer 110, and a portion of two upper word lines WL of the plurality of word lines WL may be removed to form the string selection line cut region SSLC (see FIG. 3A), and the string selection line cut region SSLC may be filled with an insulating layer 184.

Thereafter, a plurality of bit line contact holes 180H penetrating some regions of the insulating layer 180 may be formed and conductive materials may be buried in the plurality of bit line contact holes 180H to form the plurality of bit line contact pads 182, and the plurality of bit lines BL connected to the plurality of bit line contact pads 182 may be formed above the insulating layer 180 to manufacture the integrated circuit device 100A illustrated in FIG. 3A.

In order to manufacture the integrated circuit device 100C illustrated in FIG. 4B, the processes described with reference to FIGS. 12A through 12M may be used. However, in the process described with reference to FIG. 12K, the second blocking dielectric pattern 164 including the air gap AG1 occupying some regions of the separating spaces TSS (FIG. 12J), rather than the second blocking dielectric pattern 162, may be formed. In order to form the second blocking dielectric pattern 164 including the air gap AG1, a deposition process atmosphere for forming the second blocking dielectric pattern 164, for example, a deposition temperature, a deposition pressure, etc. may be controlled.

In order to manufacture the integrated circuit device 100D illustrated in FIG. 5, the processes described with reference to FIGS. 12A through 12M may be used. However, after forming the second blocking dielectric pattern 162 as described with reference to FIG. 12K, before forming the plurality of conductive lines CL as described with reference to FIG. 12L, the third blocking dielectric patterns 166 conformally covering the second blocking dielectric pattern 162 in the plurality of conductive spaces LS1 and the word line cut regions WLC may further be formed. Thereafter, in the process of forming the plurality of conductive lines CL as described with reference to FIG. 12L, portions of the third blocking dielectric pattern 166 that are outside the conductive spaces LS1, may be removed, and the plurality of third blocking dielectric patterns 166 and the plurality of conductive lines CL may remain in the plurality of conductive spaces LS1.

FIGS. 13A through 13I are cross-sectional views illustrated according to a process order for describing a method of manufacturing the integrated circuit device 200A, according to other embodiments. The method of manufacturing the integrated circuit device 200A illustrated in FIGS. 6A and 6B will be described. FIGS. 13A through 13I illustrate, according to a process order, an enlarged cross-sectional structure of an area corresponding to a dashed line region indicated by Q2 of FIG. 6A. In FIGS. 13A through 13I, the same reference numerals as FIGS. 12A through 12M are used to indicate the same members as FIGS. 12A through 12M, and their detailed descriptions will not be repeated for conciseness.

Figure 13A:
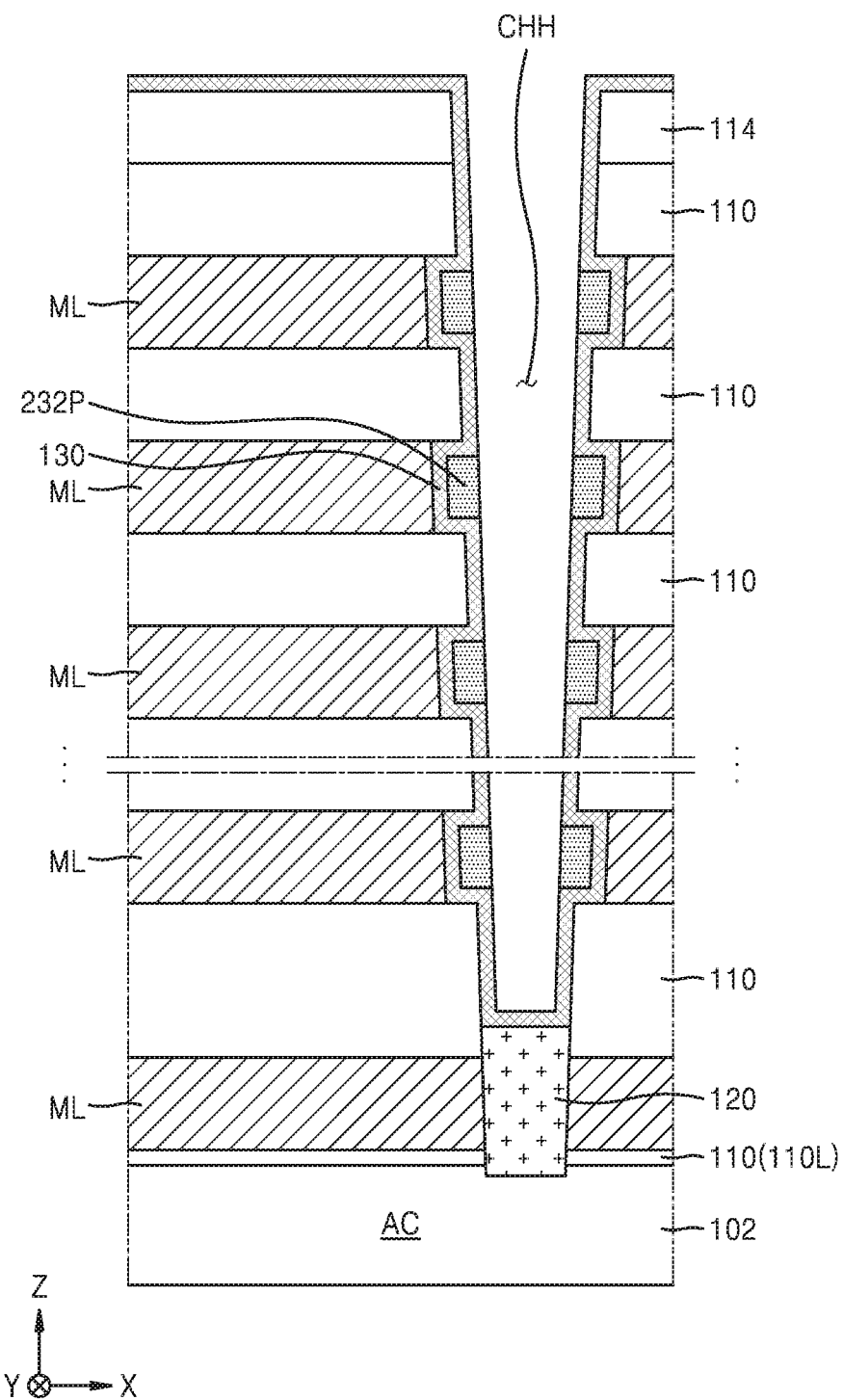
FIGS. 13A through 13I are cross-sectional views illustrated according to a process order for describing a method of manufacturing an integrated circuit device, according to other embodiments.

Referring to FIG. 13A, after the sacrificial layer 130 conformally covering the surfaces exposed through the channel holes CHH and the plurality of mold indents MLA, and the preliminary blocking insulating layer 232 filling a portion of each of the plurality of mold indents MLA on the sacrificial layer 130 may be formed by performing the processes described with reference to FIGS. 12A through 12D, the preliminary blocking insulating layer 232 may be trimmed by using substantially the same method as the method described with reference to FIG. 12E. However, in this example, after the preliminary blocking insulating layer 232 is trimmed, a plurality of preliminary blocking dielectric patterns 232P may remain in the plurality of mold indents MLA. Each of the plurality of preliminary blocking dielectric patterns 232P may include a portion filling the mold indent MLA and a portion extending from the mold indent MLA into the channel hole CHH.

Figure 13B:
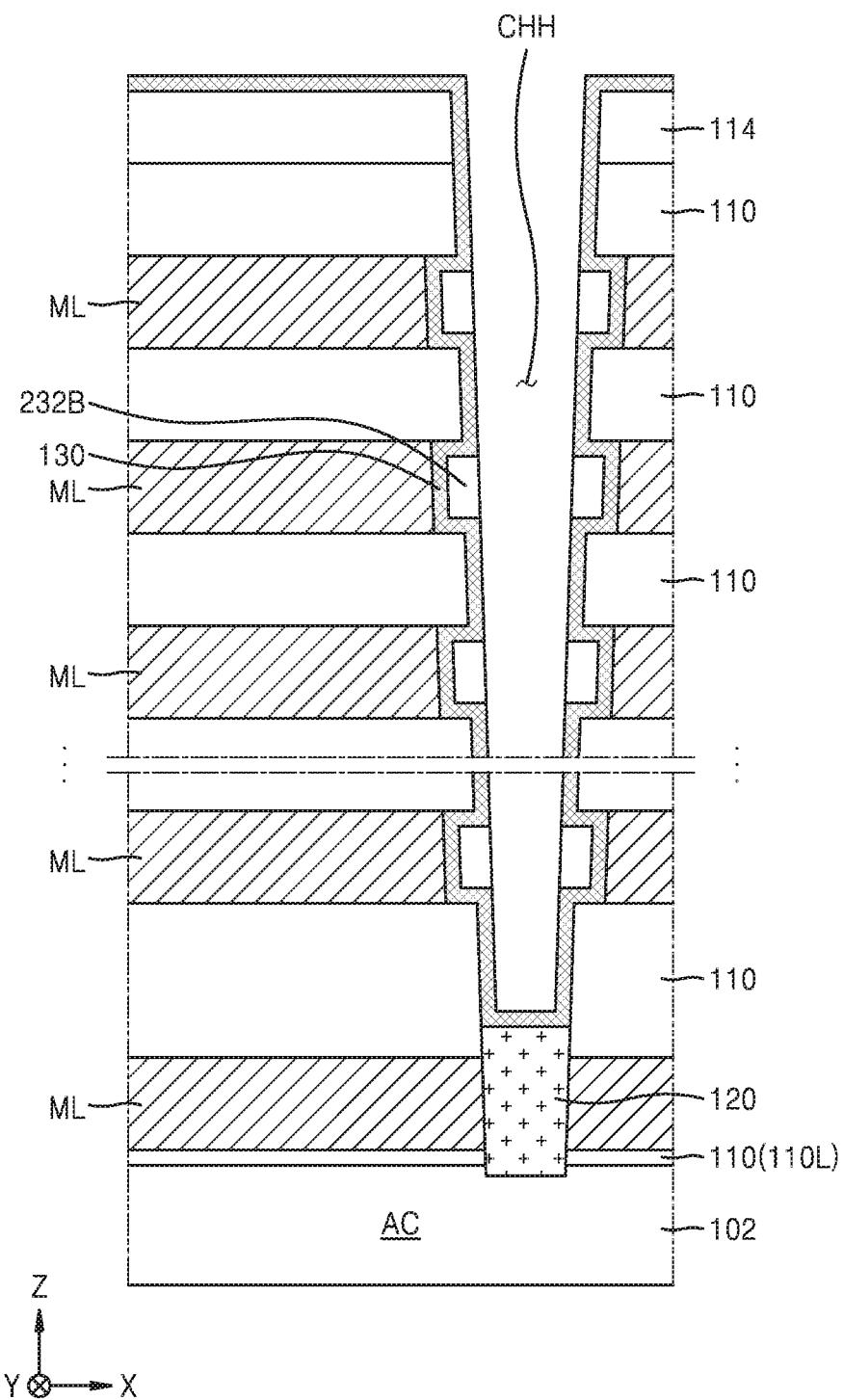

Referring to FIG. 13B, the first blocking dielectric patterns 232B including oxide layers may be formed by oxidizing the plurality of preliminary blocking dielectric patterns 232P, with respect to a resultant object according to FIG. 13A, by using substantially the same method as the method described with reference to FIG. 12F. The first blocking dielectric patterns 232B may include silicon oxide layers.

Figure 13C:
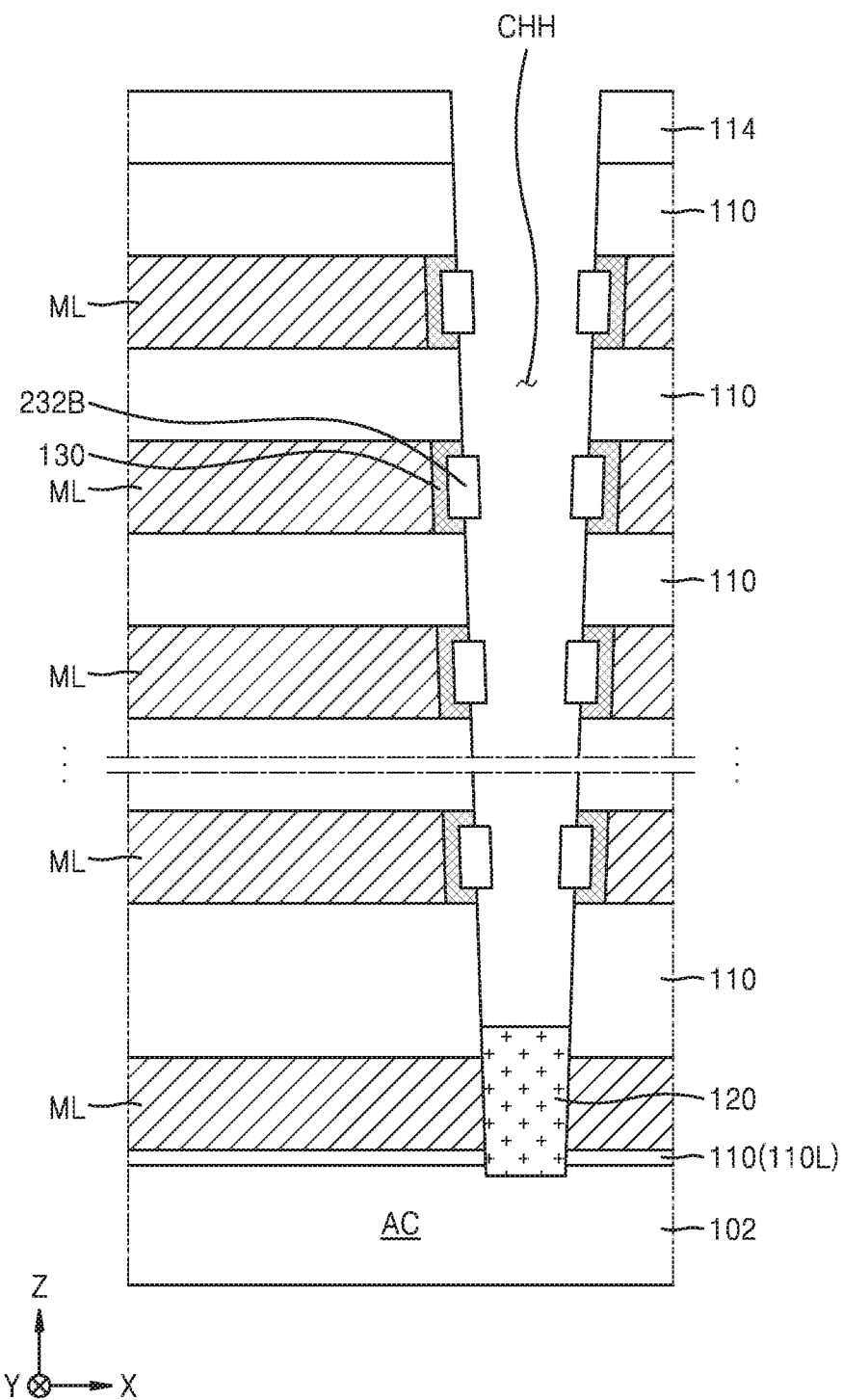

Referring to FIG. 13C, a trimming process may be performed on the resultant structure generated according to FIG. 13B to remove exposed portions of the sacrificial layer 130 by using substantially the same method as the method described with reference to FIG. 12G. Thus, side walls of the plurality of insulating layers 110 may be exposed in the channel hole CHH, and the upper surface of the insulating pattern 114 may be exposed. After the sacrificial layer 130 is trimmed, the plurality of first blocking dielectric patterns 232B may protrude horizontally further toward a central axis of the channel holes CHH than side walls of the plurality of insulating layers 110 that are exposed in the channel hole CHH.

Figure 13D:
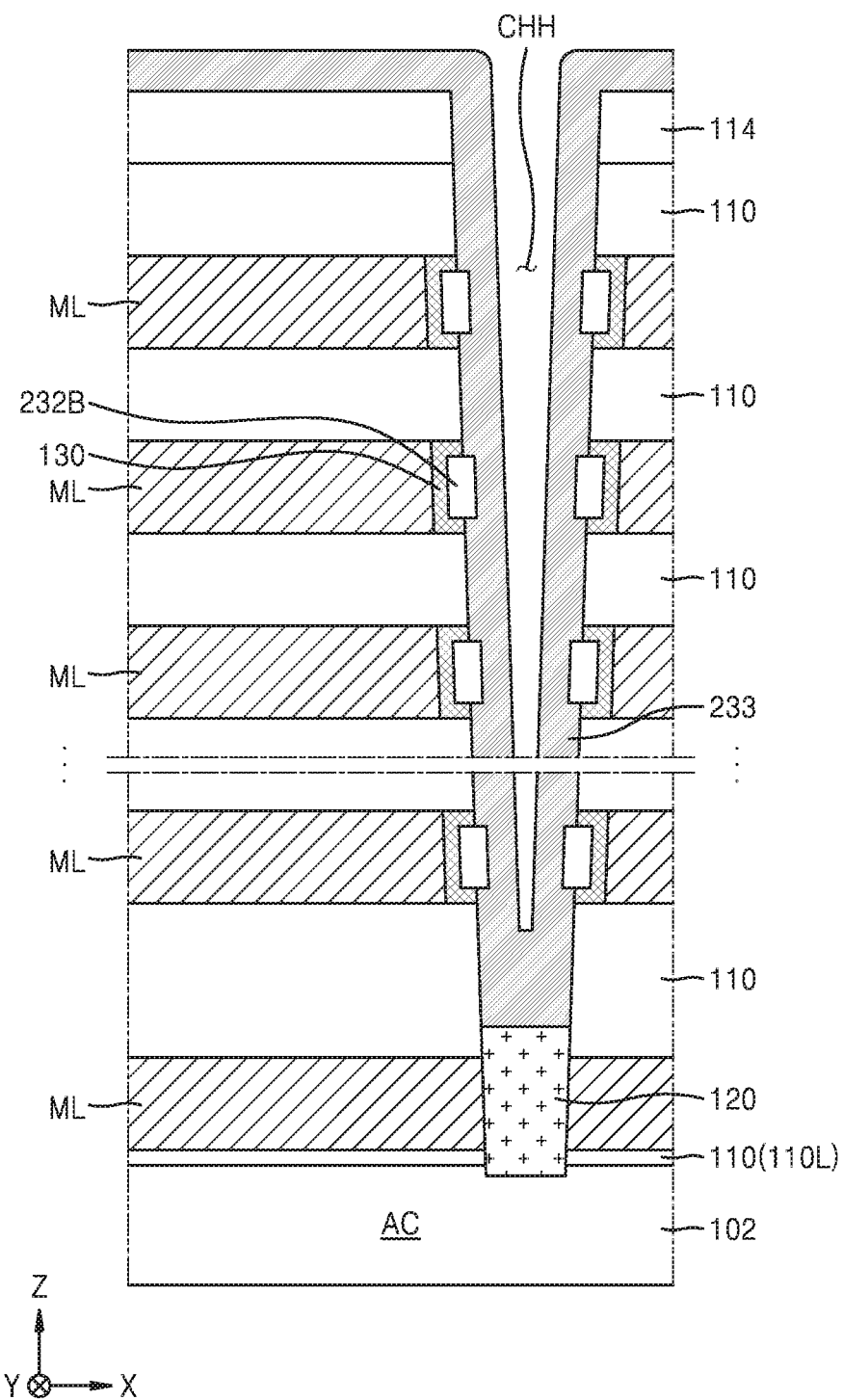

Referring to FIG. 13D, a charge trap layer 233 may be formed in the channel hole CHH, with respect to the resultant structure generated according to FIG. 13C. The charge trap layer 233 may be formed to have a thickness greater than a horizontal thickness of a charge trap layer 234 to be formed sequentially later in the process order. A side wall profile of the side wall of the charge trap layer 233 that faces the inside of the channel hole CHH, may substantially extend along a straight line in a direction away from the substrate 102. The charge trap layer 233 may include a silicon nitride layer. In order to form the charge trap layer 233, a CVD process may be used. In the process of forming the charge trap layer 233, while a deposition process may be performed at a region relatively adjacent to the first blocking dielectric pattern 232B, the side wall profile of the side wall of the charge trap layer 233 that faces the inside of the channel hole CHH, may have a concavo-convex portion corresponding to a cross-sectional outline of the first blocking dielectric pattern 232B. In this state, when the deposition process for forming the charge trap layer 233 is further performed to increase a horizontal thickness of the charge trap layer 233, the side wall profile of the side wall of the charge trap layer 233 that faces the inside of the channel hole CM, may have the shape substantially extending along the straight line in the direction away from the substrate 102.

Figure 13E:
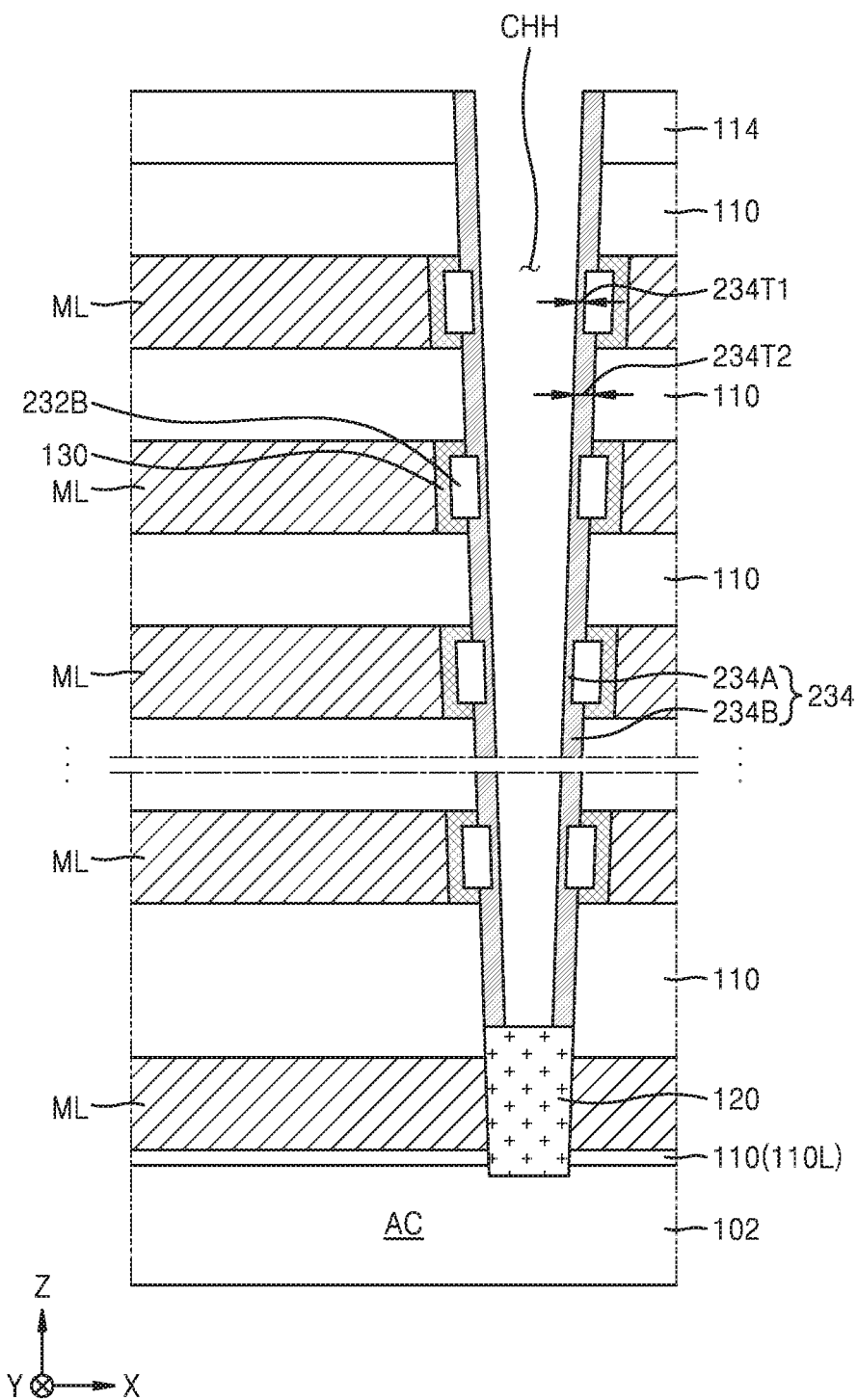

Referring to FIG. 13E, with respect to the resultant structure generated according to FIG. 13D, the charge trap layer 233 may be etch-backed to form the charge trap layer 234 in the channel hole CHH. A side wall profile of the side wall of the charge trap layer 234 that faces the inside of the channel hole CHH, may substantially extend along a straight line in a direction away from the substrate 102.

The charge trap layer 234 may extend to have variable widths in a longitudinal direction (a Z direction) of the channel hole CHH. The charge trap layer 234 may include a first charge trap layer portion 234A covering the first blocking dielectric pattern 232B by a first width 234T1, and a second charge trap layer portion 234B covering the insulating layer 110 by a second width 234T2, which is greater than the first width 234T1. A more detailed structure and method of manufacturing the charge trap layer 234 is substantially the same as the case of the charge trap layer 134, described with reference to FIG. 12H, and thus a repeated description thereof is omitted for conciseness.

Figure 13F:
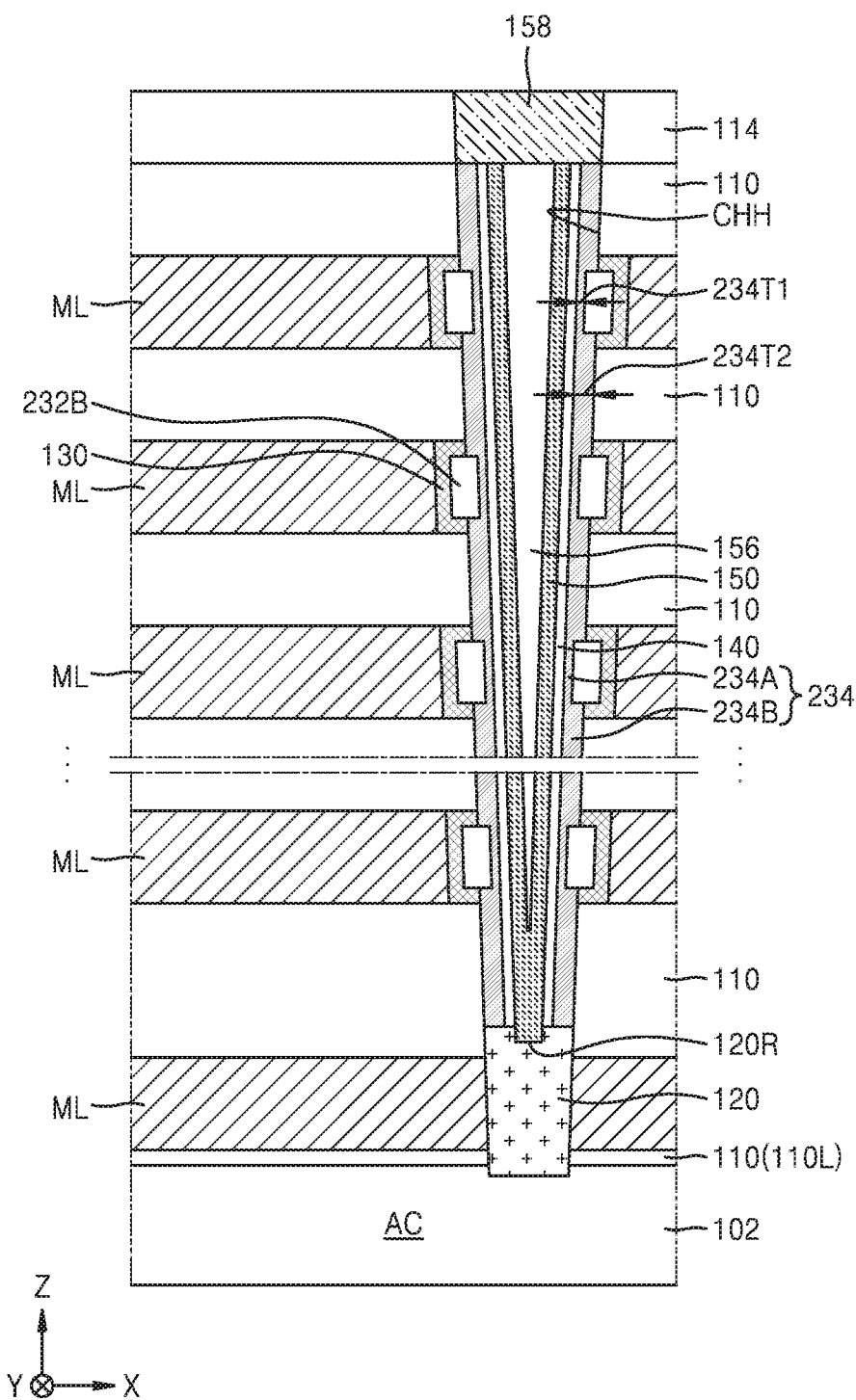

Referring to FIG. 13F, the tunneling dielectric layer 140 covering the charge trap layer 234, the channel layer 150, and the buried insulating layer 156 may be sequentially formed in the channel hole CHH, based on the resultant structure generated according to FIG. 13E, and the drain region 158 filling an upper entrance portion of the channel hole CHH may be formed, by using the same method as the method described with reference to FIG. 12H.

Figure 13G:
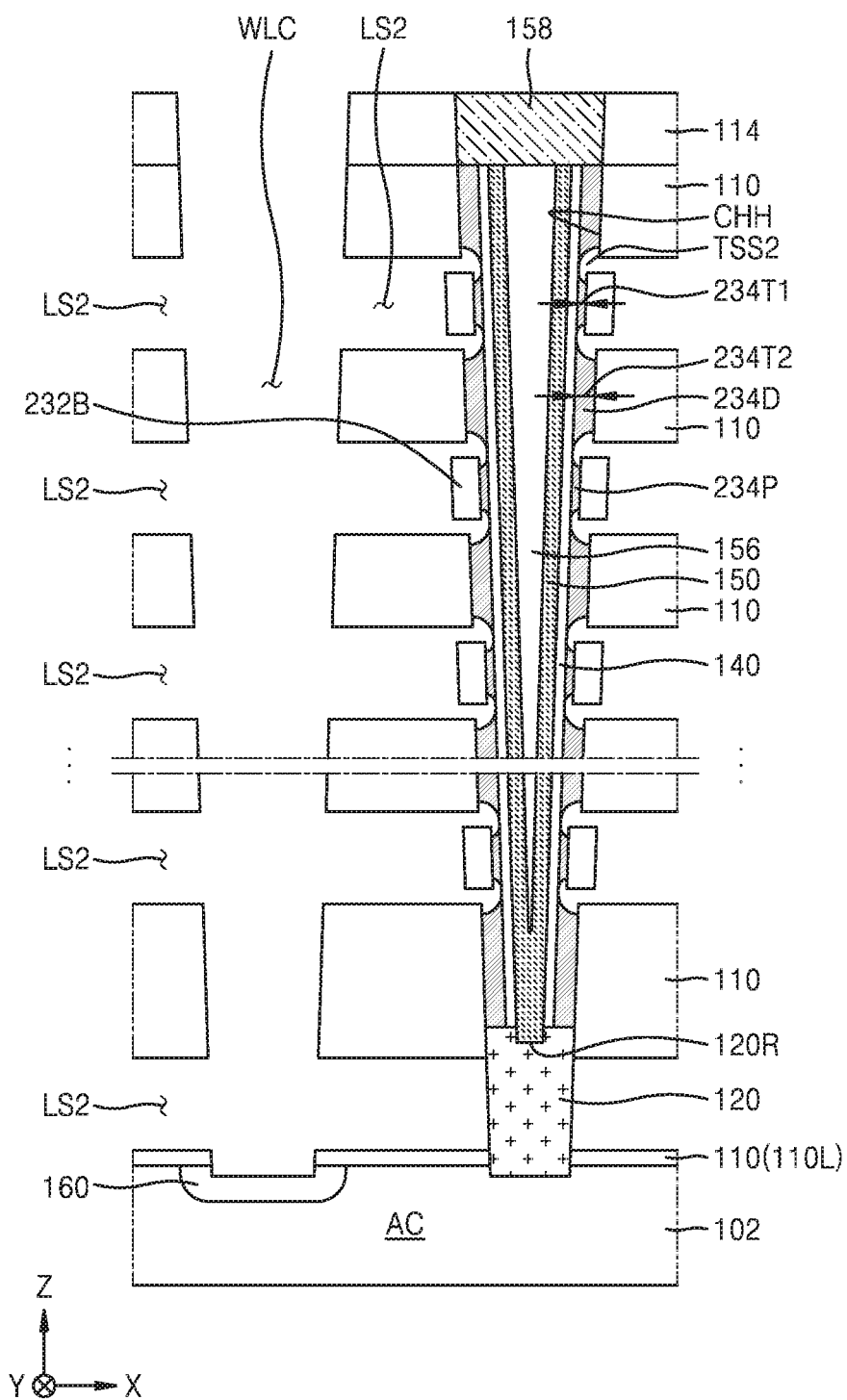

Referring to FIG. 13G, the word line cut region WLC and the common source region 160 may be formed based on the resultant structure generated according to FIG. 13F, by using the same method as the method described with reference to FIG. 12I. Thereafter, by using the same method as the method described with reference to FIG. 12J, the plurality of mold layers ML may be removed through the word line cut regions WLC to form a plurality of conductive spaces LS2 and the exposed sacrificial layer 130 may be removed through the plurality of conductive spaces LS2. Thereafter, a portion of the charge trap layer 234 that is exposed because of the removal of the sacrificial layer 130, may be removed, to separate the charge trap layer 234 into the plurality of charge trap patterns 234P and the plurality of dummy charge trap patterns 234D. The plurality of charge trap patterns 234P and the plurality of dummy charge trap patterns 234D may be respectively alternately arranged in the longitudinal direction (the Z direction) of the channel hole CM. In a horizontal direction, the plurality of charge trap patterns 234P may have the first width 234T1 and the plurality of dummy charge trap patterns 234D may have the second width 234T2, which is greater than the first width 234T1. Respective separating spaces TSS2 may be formed between the plurality of charge trap patterns 234P and the plurality of dummy charge trap patterns 234D.

Figure 13H:
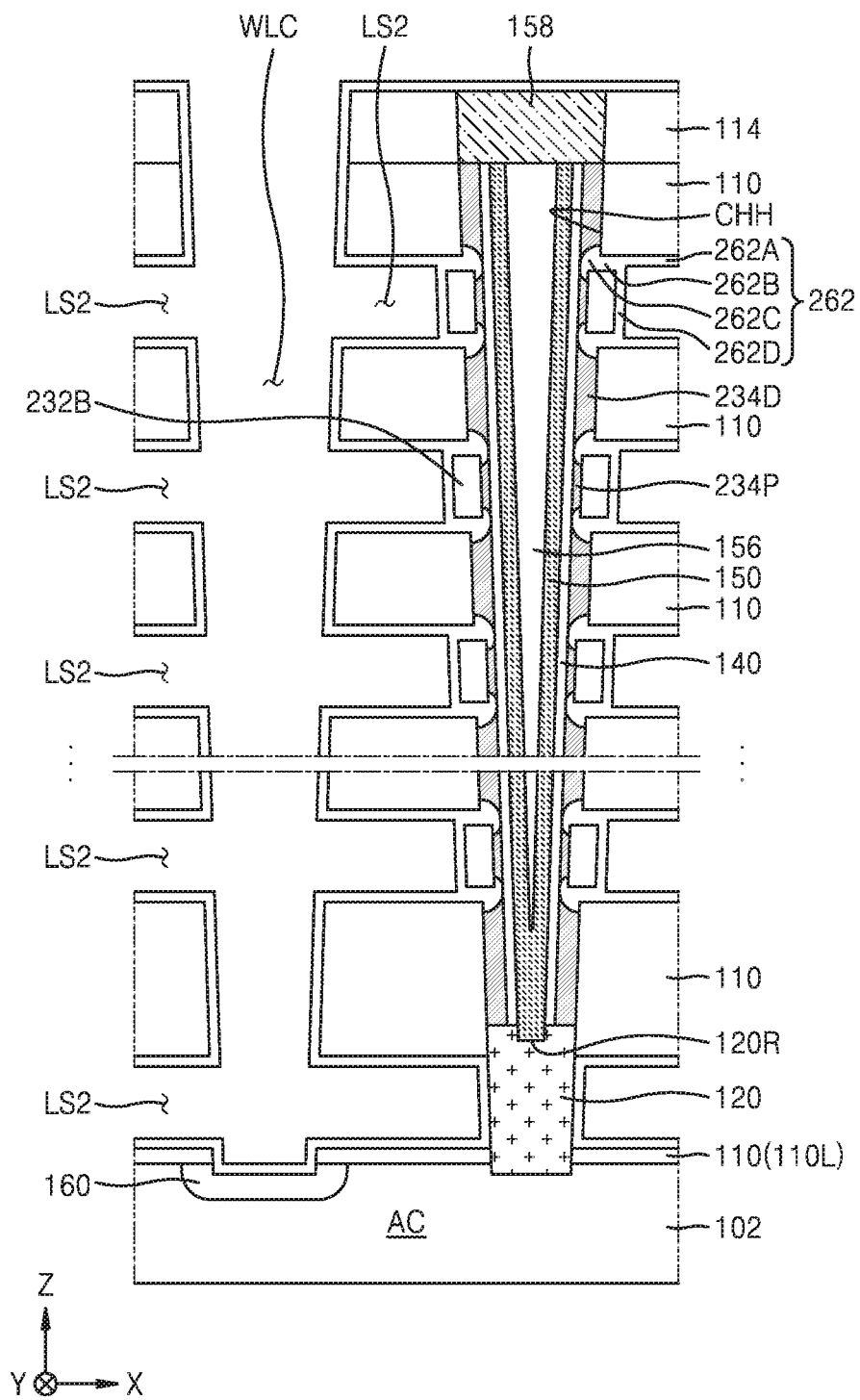

Referring to FIG. 13H, the second blocking dielectric pattern 262 may be formed on the resultant structure generated according to FIG. 13G, by using substantially the same method as the method of forming the second blocking dielectric pattern 162 described with reference to FIG. 12K.

The second blocking dielectric pattern 262 may be formed to conformally cover surfaces exposed through the conductive spaces LS2 and the word line cut regions WLC, while filling the separating spaces TSS2. The second blocking dielectric pattern 262 may include the first portion 262A covering the insulating layer 110, the second portion 262B between the first blocking dielectric pattern 232B and the insulating layer 110, the third portion 262C filling the separating space TSS2 between the charge trap pattern 234P and the dummy charge trap pattern 234D, and the fourth portion 262D covering a side wall of the first blocking dielectric pattern 232B, the side wall facing the conductive space LS2.

Figure 13I:
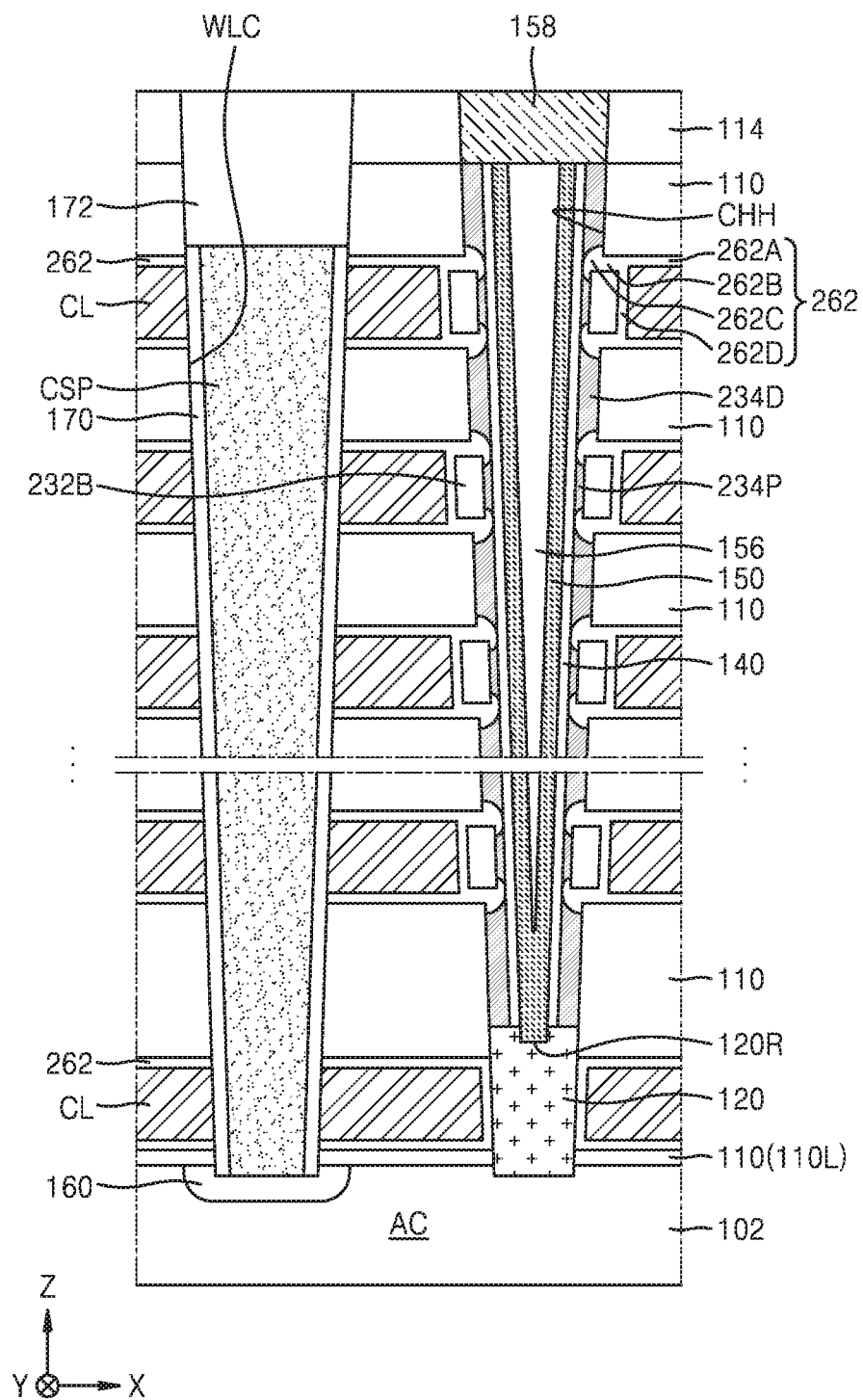

Referring to FIG. 13I, with respect to the resultant structure generated according to FIG. 13H, the plurality of conductive lines CL may be formed in the plurality of conductive spaces LS2, and the insulating spacer 170, the common source pattern CSP, and the capping insulating layer 172 may be formed in the word line cut region WLC, by using the same method as the method described with reference to FIG. 12L, and the sequential processes described with reference to FIG. 12M may be performed to manufacture the integrated circuit device 200A illustrated in FIGS. 6A and 6B.

In order to manufacture the integrated circuit device 200B illustrated in FIG. 7, the processes described with reference to FIGS. 13A through 13I may be used. However, in the process described with reference to FIG. 13H, the second blocking dielectric pattern 264 including the air gap AG2, rather than the second blocking dielectric pattern 262, may be formed. The air gap AG2 may occupy a portion of the separating space TSS2 (see FIG. 13G). In order to form the second blocking dielectric pattern 264 including the air gap AG2, a deposition process atmosphere for forming the second blocking dielectric pattern 264, for example, a deposition temperature, a deposition pressure, etc. may be controlled.

FIGS. 14A through 14D are cross-sectional views illustrated according to a process order for describing a method of manufacturing the integrated circuit device 300A, according to other embodiments. The method of manufacturing the integrated circuit device 300A illustrated in FIGS. 8A and 8B will be described. FIGS. 14A through 14D illustrate, according to a process order, an enlarged cross-sectional structure of an area corresponding to a dashed line region indicated by Q3 of FIG. 8A. In FIGS. 14A through 14D, reference numerals that are the same as the reference numerals in FIGS. 12A through 12M and FIGS. 13A through 13I denote members that are the same as the members in FIGS. 12A through 12M and FIGS. 13A through 13I, and their detailed descriptions will not be repeated for conciseness.

Figure 14A:
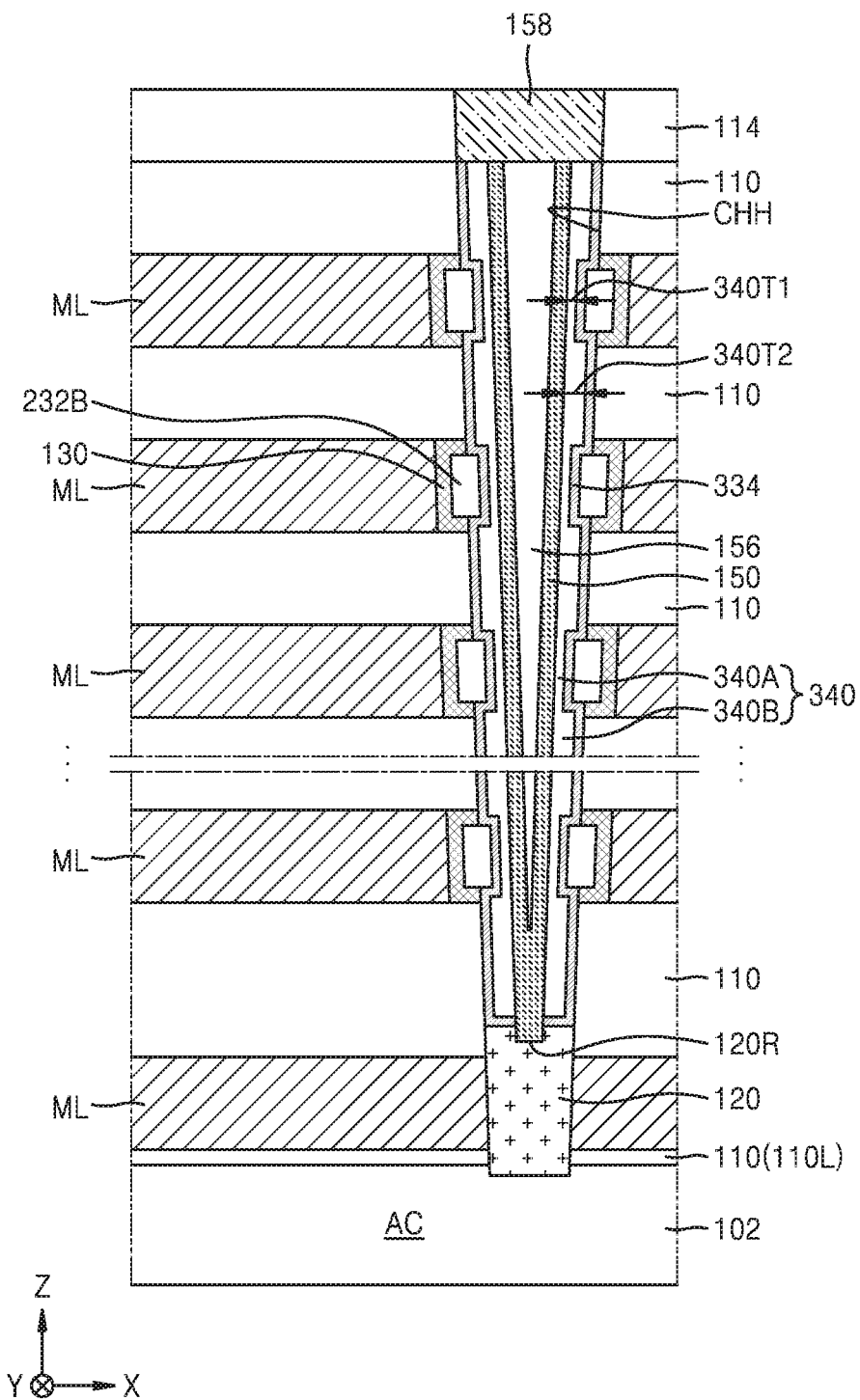
FIGS. 14A through 14D are cross-sectional views illustrated according to a process order for describing a method of manufacturing an integrated circuit device, according to other embodiments.

Referring to FIG. 14A, by using the same method as the method described with reference to FIGS. 13A through 13C, the plurality of first blocking dielectric patterns 232B may be formed to protrude horizontally further toward the central axis of the channel hole CHH than the side walls of the plurality of insulating layers 110 that are exposed in the channel hole CHH on the substrate 102. Further, the side walls of the plurality of insulating layers 110 may be exposed in the channel hole CHH. Thereafter, a charge trap layer 334 conformally covering surfaces of the plurality of first blocking dielectric patterns 232B that are exposed in the channel hole CHH and the side walls of the plurality of insulating layers 110 that are exposed in the channel hole CHH, may be formed by using substantially the same method as described with reference to FIG. 13D. Next, the tunneling dielectric layer 340, the channel layer 150, and the buried insulating layer 156 sequentially covering the charge trap layer 334 in the channel hole CHH may be sequentially formed, and the drain region 158 filling an upper entrance portion of the channel hole CHH may be formed.

The charge trap layer 334 may be formed to have a constant horizontal width in a longitudinal direction (a Y direction) of the channel hole CHH. The tunneling dielectric layer 340 may have variable widths in the channel holes CHH in a direction away from the substrate 102. In a horizontal direction, a first width 340T1 of a portion of the tunneling dielectric layer 340 between the mold layer ML and the channel layer 150, may be smaller than a second width 340T2 of a portion of the tunneling dielectric layer 340 between the insulating layer 110 and the channel layer 150.

Figure 14B:
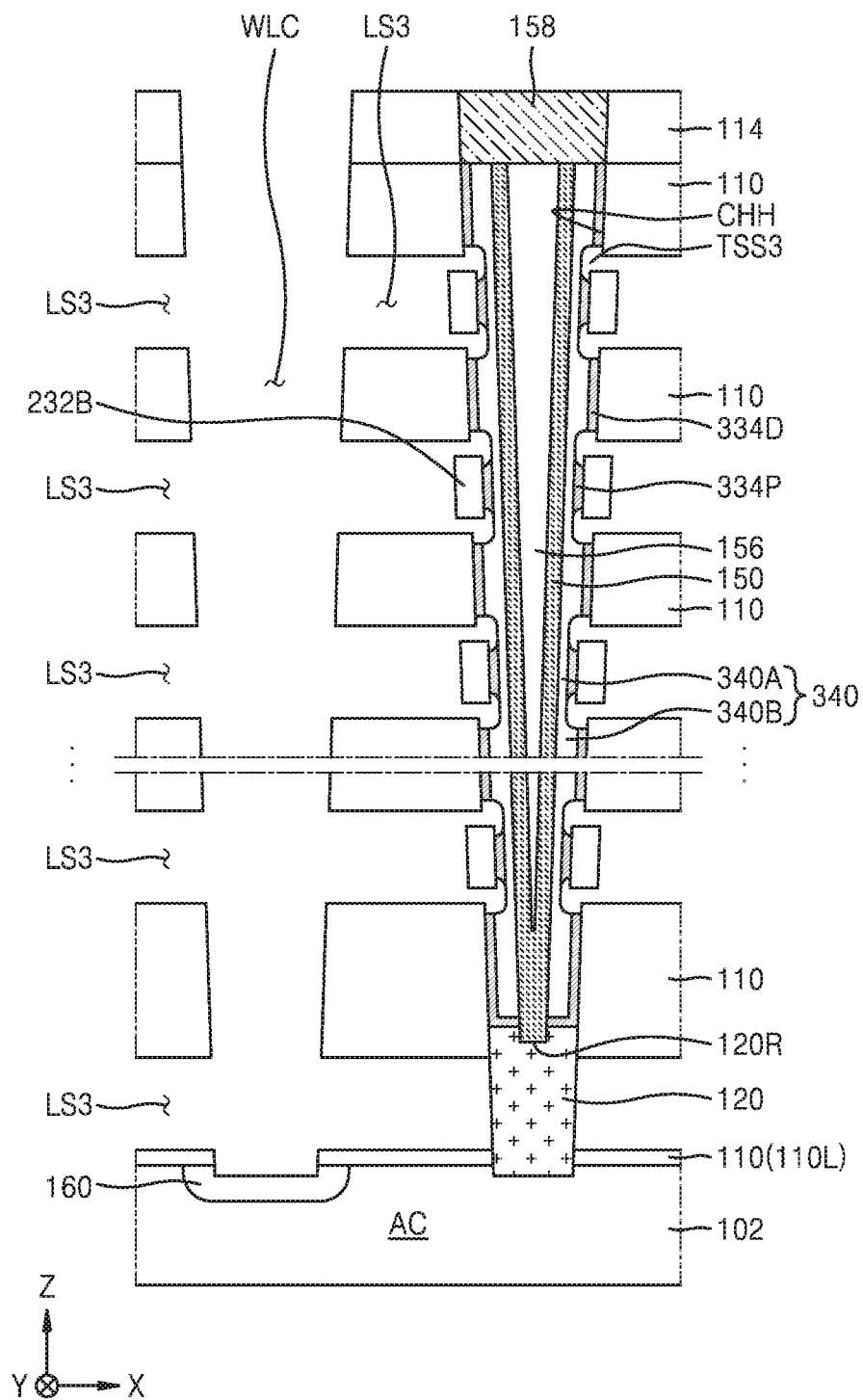

Referring to FIG. 14B, with respect to the resultant structure generated according to FIG. 14A, by using substantially the same method as described with reference to FIG. 13G, the word line cut region WLC and the common source region 160 may be formed, the plurality of mold layers ML may be removed through the word line cut region WLC to form a plurality of conductive spaces LS3, the exposed sacrificial layer 130 may be removed through the plurality of conductive spaces LS3, and a portion of the charge trap layer 334 that is exposed as a result of the removing of the sacrificial layer 130, may be removed to separate the charge trap layer 334 into the plurality of charge trap patterns 334P and the plurality of dummy charge trap patterns 334D. As a result, respective separating spaces TSS2 may be formed between the plurality of charge trap patterns 234P and the plurality of dummy charge trap patterns 234D.

Figure 14C:
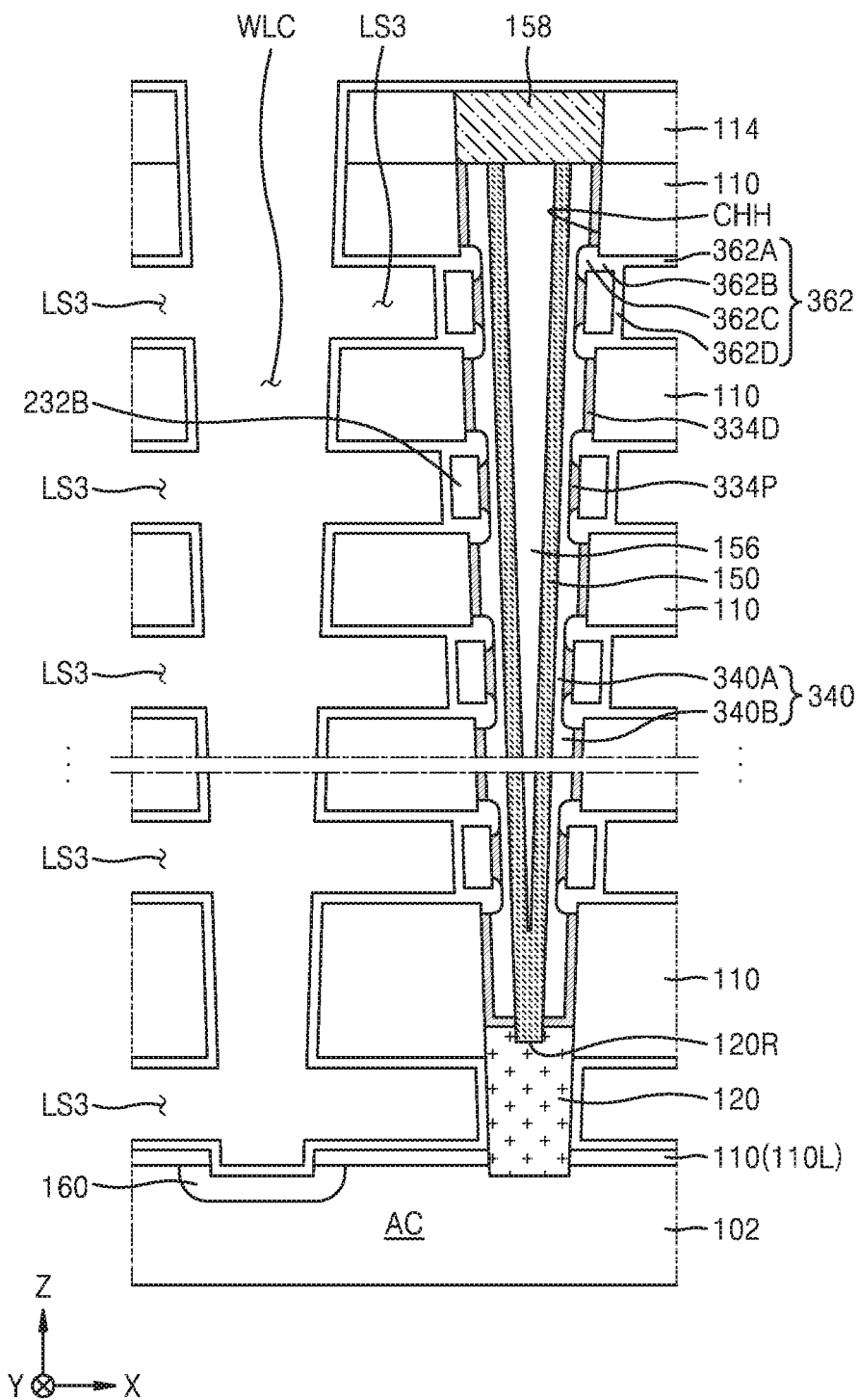

Referring to FIG. 14C, the second blocking dielectric pattern 362 may be formed on the resultant structure generated according to FIG. 14B, by using substantially the same method as the method of forming the second blocking dielectric pattern 162 described with reference to FIG. 12K.

The second blocking dielectric pattern 362 may be formed to conformally cover surfaces exposed through the conductive spaces LS3 and the word line cut regions WLC, while filling the separating spaces TSS3. The second blocking dielectric pattern 362 may include the first portion 362A covering the insulating layer 110, the second portion 362B between the first blocking dielectric pattern 232B and the insulating layer 110, the third portion 362C filling the separating space TSS3 between the charge trap pattern 334P and the dummy charge trap pattern 334D, and the fourth portion 362D covering a side wall of the first blocking dielectric pattern 232B, the side wall facing the conductive space LS3.

Figure 14D:
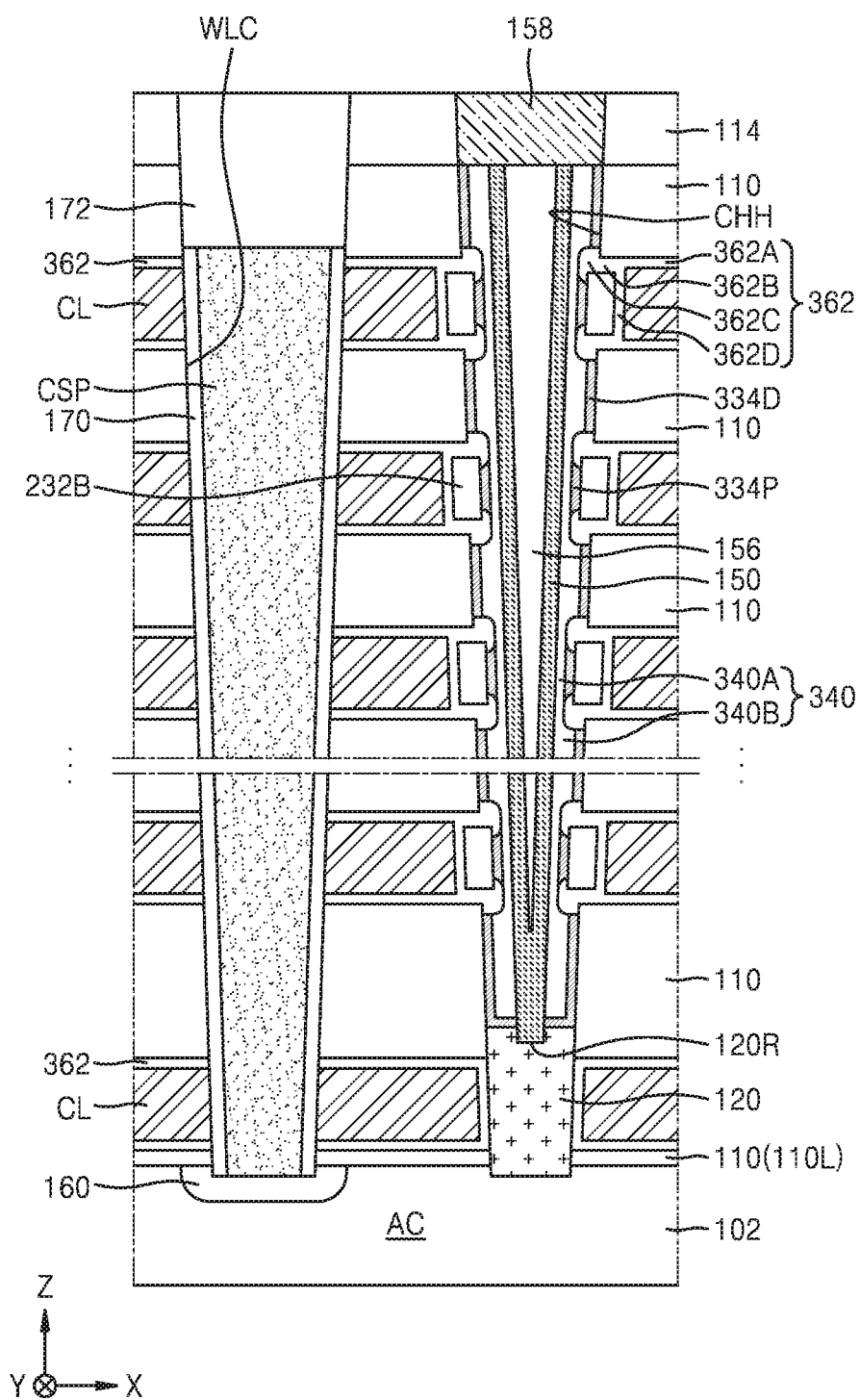

Referring to FIG. 14D, with respect to the resultant structure generated according to FIG. 14C, the plurality of conductive lines CL may be formed in the plurality of conductive spaces LS3, and the insulating spacer 170, the common source pattern CSP, and the capping insulating layer 172 may be formed in the word line cut region WLC, by using the same method as described with reference to FIG. 12L, and the sequential processes described with reference to FIG. 12M may be performed to manufacture the integrated circuit device 300A illustrated in FIGS. 8A and 8B.

In order to manufacture the integrated circuit device 300B illustrated in FIG. 9, the processes described with reference to FIGS. 14A and 14B may be used. However, in the process described with reference to FIG. 14C, the second blocking dielectric pattern 364 including the air gap AG3, rather than the second blocking dielectric pattern 362, may be formed. The air gap AG3 may occupy a portion of the separating space TSS3 (see FIG. 14B). In order to form the second blocking dielectric pattern 364 including the air gap AG3, a deposition process atmosphere for forming the second blocking dielectric pattern 364, for example, a deposition temperature, a deposition pressure, etc. may be controlled.

Figure 15A:
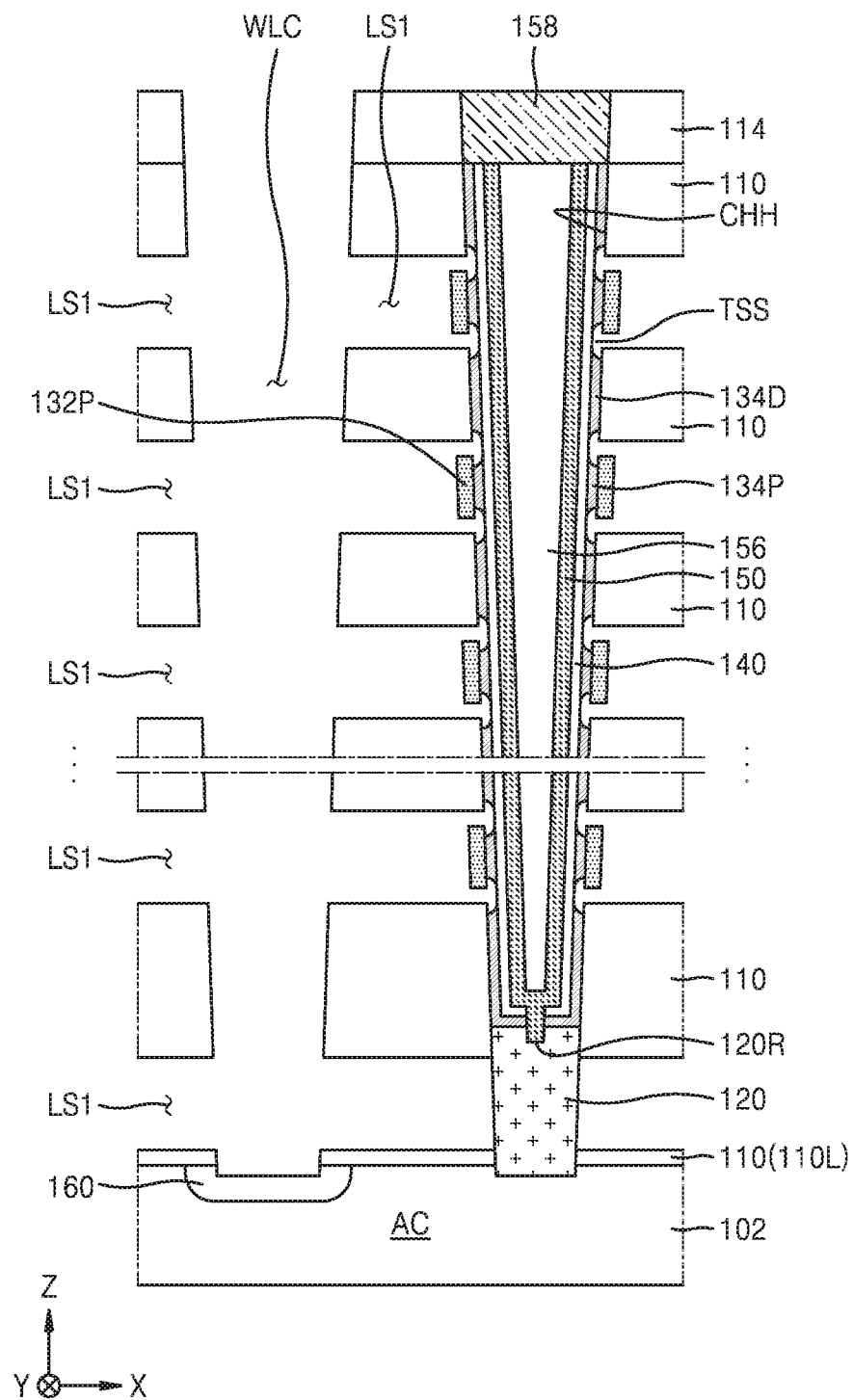
FIGS. 15A and 15B are cross-sectional views illustrated according to a process order for describing a method of manufacturing an integrated circuit device, according to other embodiments.
Figure 15B:
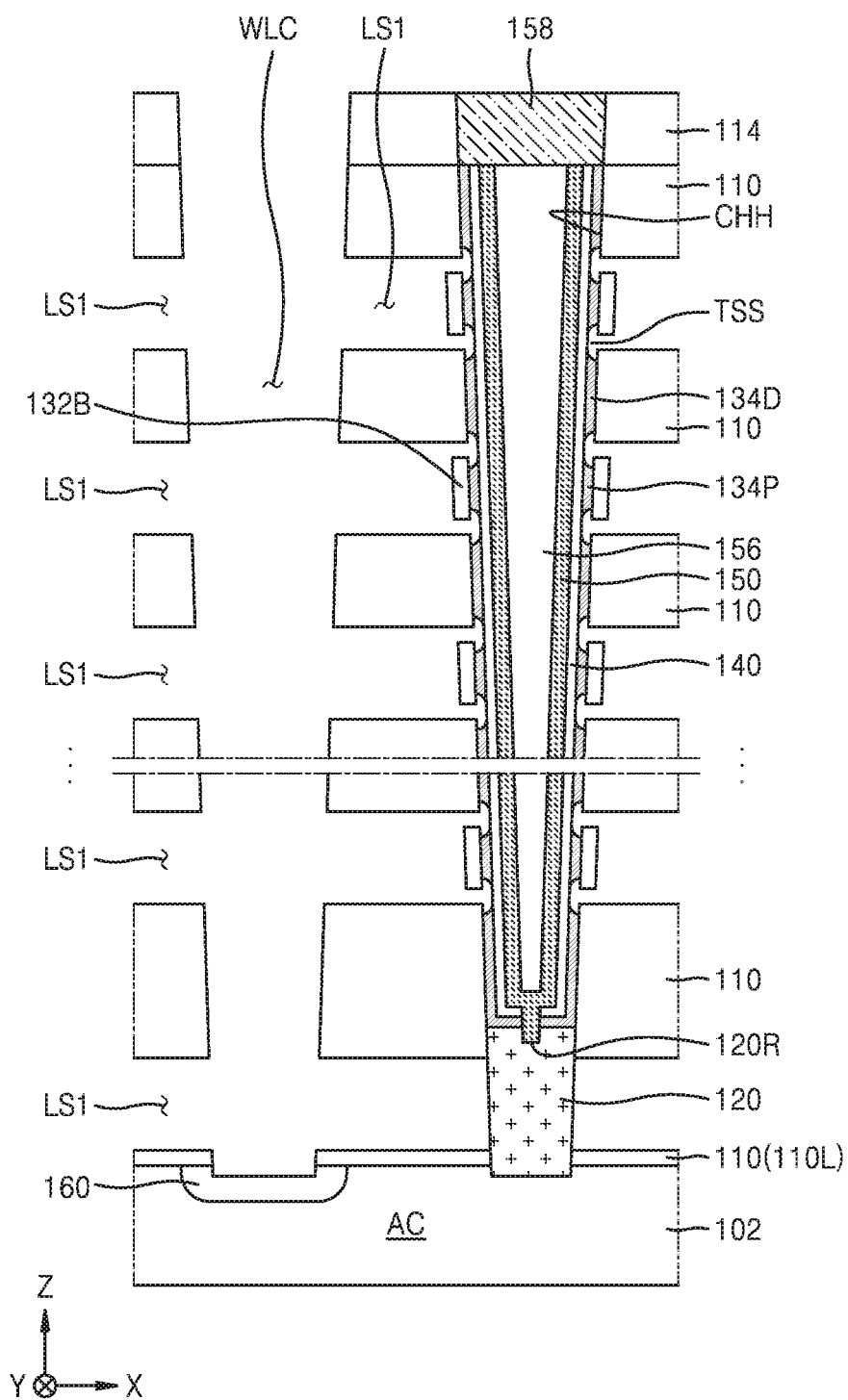

FIGS. 15A and 15B are cross-sectional views illustrated according to a process order for describing a method of manufacturing the integrated circuit device 100A, according to other embodiments. Another example method of manufacturing the integrated circuit device 100A described with reference to FIGS. 3A and 3B will be described. FIGS. 15A and 15B illustrate, according to a process order, an enlarged cross-sectional structure of an area corresponding to a dashed line region indicated by Q1 of FIG. 3A. In FIGS. 15A and 15B, reference numerals that are the same as the reference numerals in FIGS. 12A through 12M denote members that are the same as the members in FIGS. 12A through 12M, and their detailed descriptions will not be repeated for conciseness.

Referring to FIG. 15A, the processes of forming the word line cut region WLC, the plurality of conductive space LS1, and the plurality of separating spaces TSS may be performed by using the same method as the method described with reference to FIGS. 12A through 12J. However, in this example, the process described with reference to FIG. 12F, that is, the process of forming the first blocking dielectric patterns 132B by oxidizing the plurality of preliminary blocking dielectric patterns 132P may be omitted and the process described with reference to FIG. 12G may be performed on the resultant structure generated according to FIG. 12E, in which the plurality of preliminary blocking dielectric patterns 132P remain. Thus, when the charge trap layer 134, the tunneling dielectric layer 140, the channel layer 150, and the buried insulating layer 156 are formed by using the same method as the method described with reference to FIG. 12H, the charge trap layer 134, the tunneling dielectric layer 140, the channel layer 150, and the buried insulating layer 156 may be formed above the plurality of preliminary blocking dielectric patterns 132P. After the plurality of conductive spaces LS1 and the plurality of separating spaces TSS are formed, the plurality of preliminary blocking dielectric patterns 132P may be exposed through the plurality of conductive spaces LS1 as illustrated in FIG. 15A.

Referring to FIG. 15B, with respect to the resultant structure generated according to FIG. 15A, the first blocking dielectric patterns 132B including oxide layers may be formed by oxidizing the plurality of preliminary blocking dielectric patterns 132P by using substantially the same method as the method described with reference to FIG. 12F.

Thereafter, the processes described with reference to FIGS. 12K through 12M may be performed to manufacture the integrated circuit device 100A illustrated in FIGS. 3A and 3B.

Figure 16:
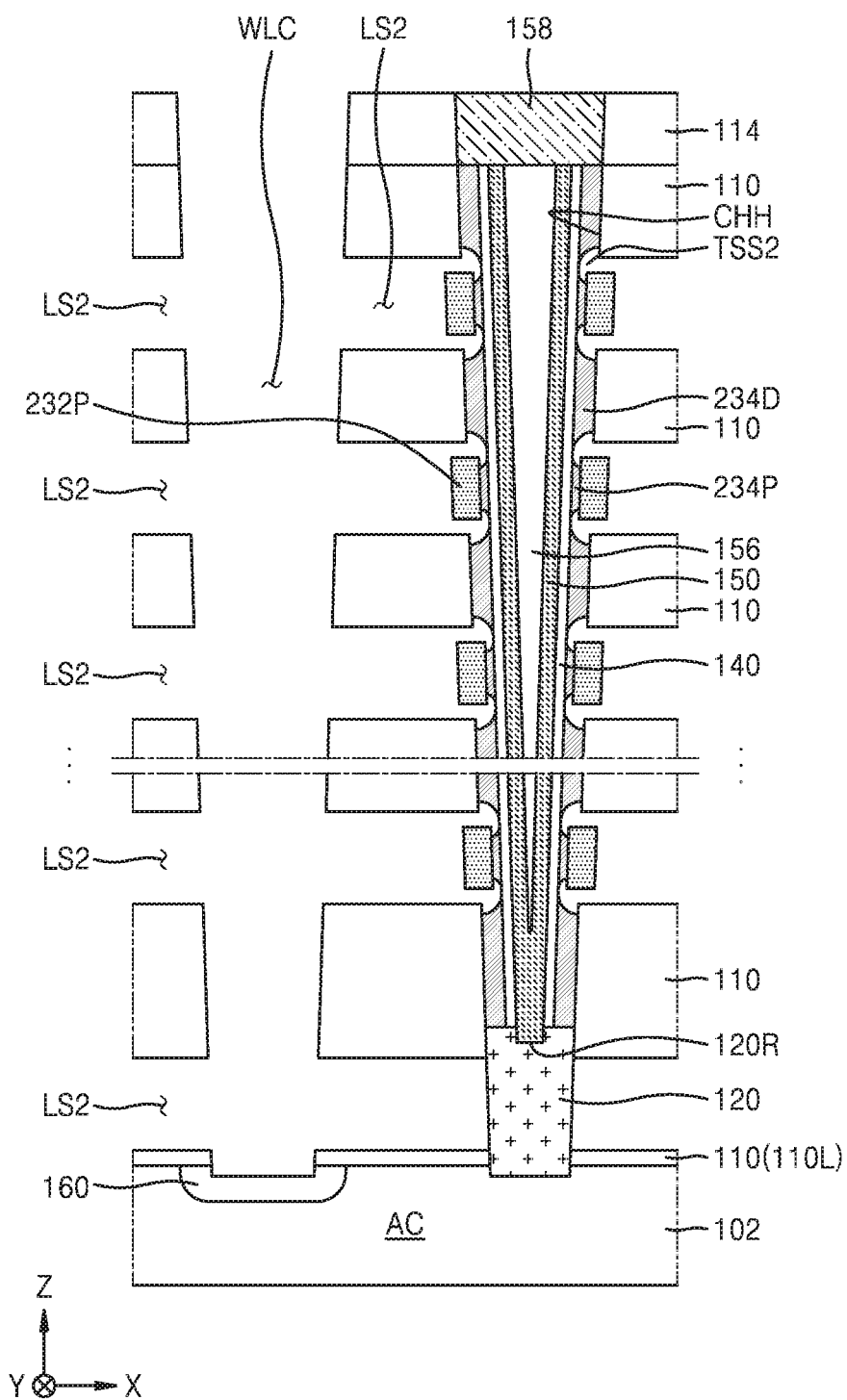
FIG. 16 is a cross-sectional view illustrated according to a process order for describing a method of manufacturing an integrated circuit device, according to other embodiments.

FIG. 16 is a cross-sectional view illustrated according to a process order for describing a method of manufacturing the integrated circuit device 200A, according to other embodiments. Another example method of manufacturing the integrated circuit device 200A described with reference to FIGS. 6A and 6B will be described. FIG. 16 illustrates, according to a process order, an enlarged cross-sectional structure of an area corresponding to a dashed line region indicated by Q2 of FIG. 6A. In FIG. 16, reference numerals that are the same as the reference numerals in FIGS. 13A through 13I denote members that are the same as the members in FIGS. 13A through 13I, and their detailed descriptions will not be repeated for conciseness.

Referring to FIG. 16, the processes of forming the word line cut region WLC, the plurality of conductive space LS2, and the plurality of separating spaces TSS2 may be formed by using the same method as the method described with reference to FIGS. 13A through 13G. However, in this example, the process described with reference to FIG. 13B, that is, the process of forming the first blocking dielectric patterns 232B by oxidizing the plurality of preliminary blocking dielectric patterns 232P may be omitted and the process described with reference to FIG. 13C may be performed on the resultant structure generated according to FIG. 13A, in which the plurality of preliminary blocking dielectric patterns 232P remain. Thus, when the charge trap layer 233 is formed by using the same method as the method described with reference to FIG. 13D, the charge trap layer 233 may be formed above the plurality of preliminary blocking dielectric patterns 232P. Also, after the plurality of conductive spaces LS2 and the plurality of separating spaces TSS2 are formed, the plurality of preliminary blocking dielectric patterns 232P may be exposed through the plurality of conductive spaces LS2 as illustrated in FIG. 16.

Thereafter, with respect to the resultant structure generated according to FIG. 16, the first blocking dielectric patterns 232B including oxide layers may be formed by oxidizing the plurality of preliminary blocking dielectric patterns 232P by using substantially the same method as the method described with reference to FIG. 13B. Thereafter, the processes described with reference to FIGS. 13H and 13I may be performed to manufacture the integrated circuit device 200A illustrated in FIGS. 6A and 6B.

Figure 17A:
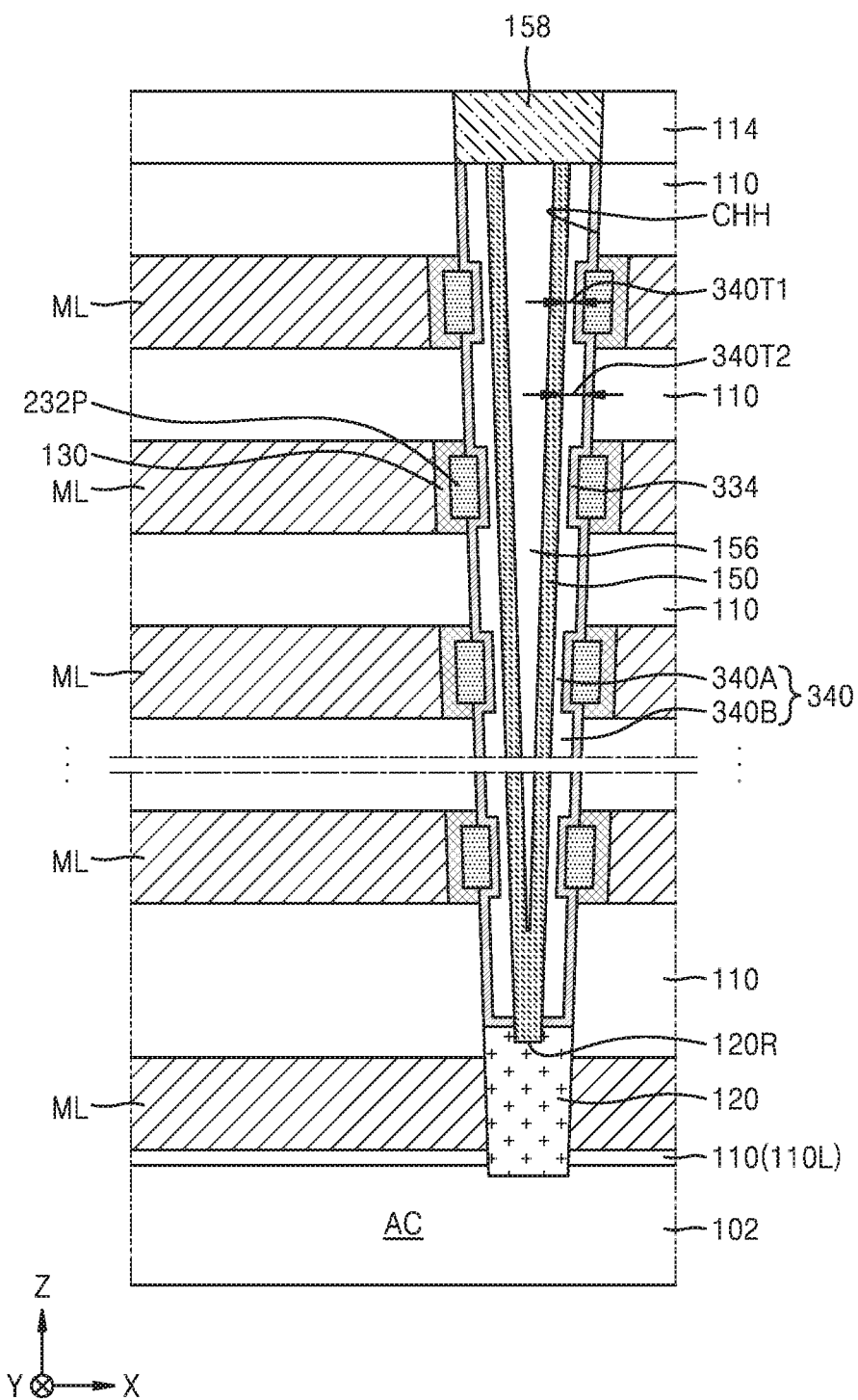
FIGS. 17A through 17C are cross-sectional views illustrated according to a process order for describing a method of manufacturing an integrated circuit device, according to other embodiments.
Figure 17B:
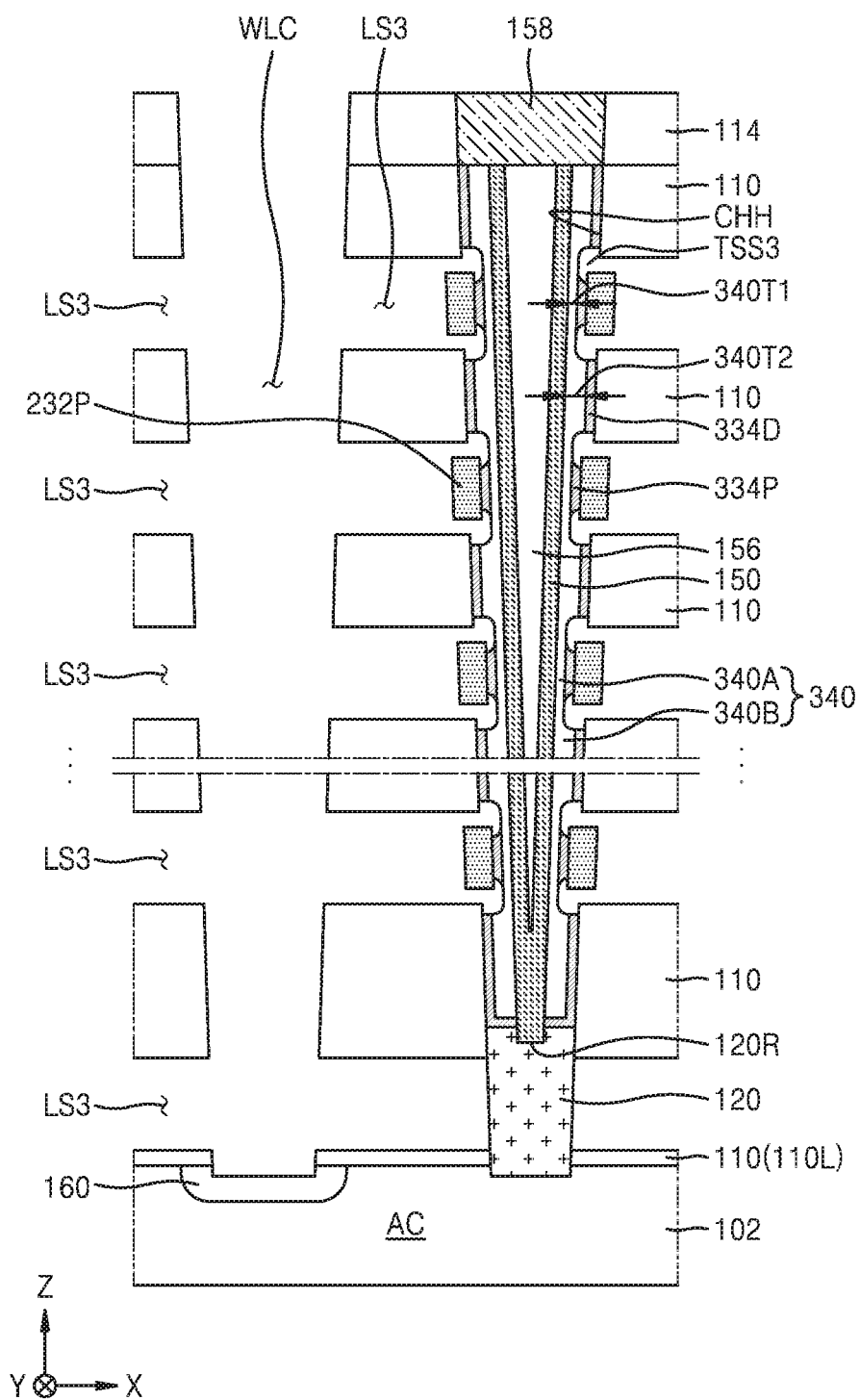
Figure 17C:
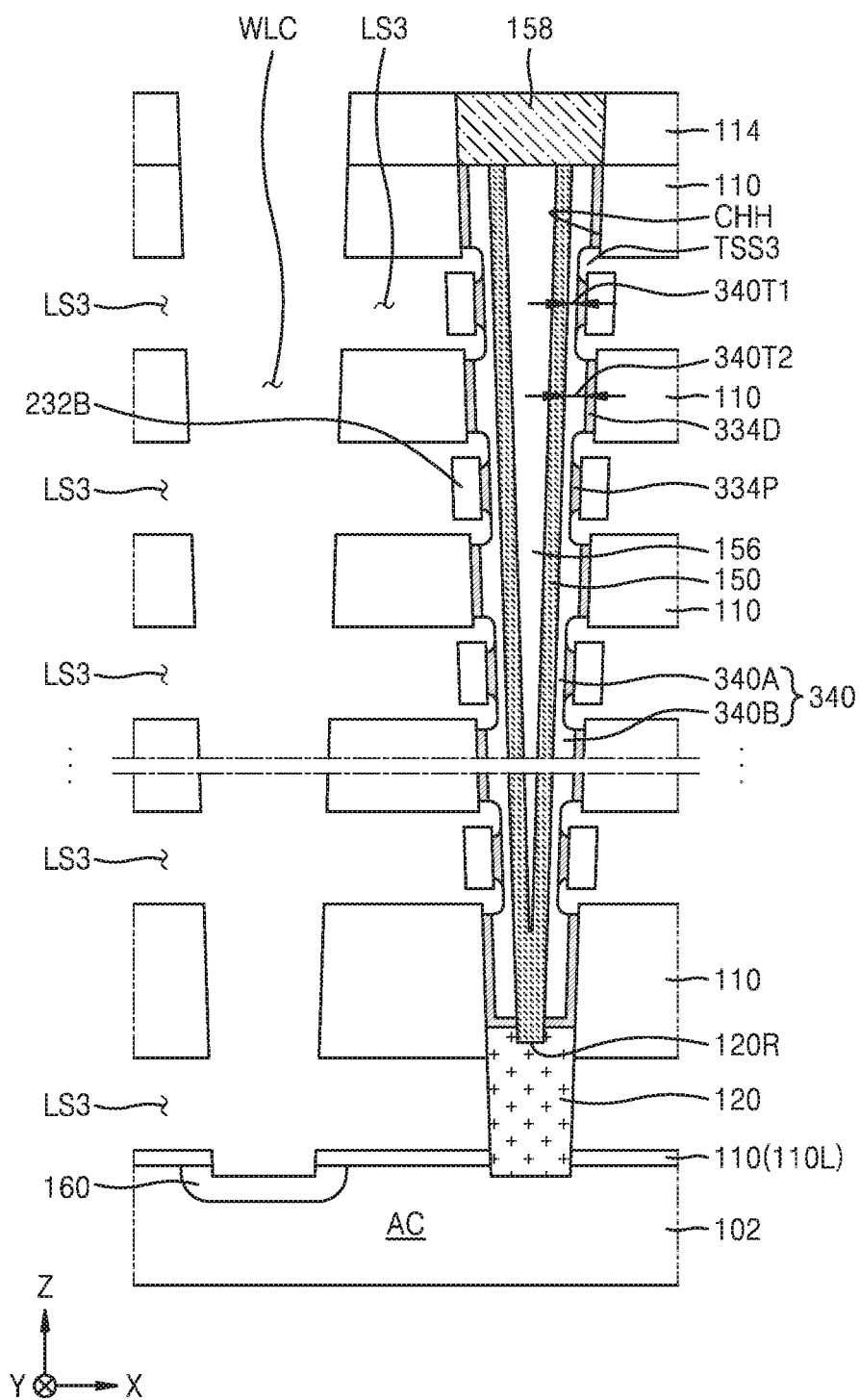

FIGS. 17A through 17C are cross-sectional views illustrated according to a process order for describing a method of manufacturing the integrated circuit device 300A, according to other embodiments. Another example method of manufacturing the integrated circuit device 300A described with reference to FIGS. 8A and 8B will be described. FIGS. 17A through 17C illustrate, according to a process order, an enlarged cross-sectional structure of an area corresponding to a dashed line region indicated by Q3 of FIG. 8A. In FIGS. 17A through 17C, reference numerals that are the same as the reference numerals in FIGS. 12A through 12M, FIGS. 13A through 13I, and FIGS. 14A through 14D denote members that are the same as the members in FIGS. 12A through 12M, FIGS. 13A through 13I, and FIGS. 14A through 14D, and their detailed descriptions will not be repeated for conciseness.

Referring to FIG. 17A, the processes described with reference to FIGS. 13A through 13D may be performed. However, in this example, the process of oxidizing the plurality of preliminary blocking dielectric patterns 232P described with reference to FIG. 13B may be omitted and the process described with reference to FIG. 13C may be performed on the resultant structure generated according to FIG. 13A, in which the plurality of preliminary blocking dielectric patterns 232P remain. Thereafter, in the state in which the plurality of preliminary blocking dielectric patterns 232P formed by the process described with reference to FIG. 13A remain on the substrate 102, the charge trap layer 334 may be formed above the plurality of preliminary blocking dielectric patterns 232P by using substantially the same method as the method of manufacturing the charge trap layer 334 described with respect to FIG. 14A, and then, the tunneling dielectric layer 340, the channel layer 150, and the buried insulating layer 156 may be sequentially formed above the charge trap layer 334.

Referring to FIG. 17B, with respect to the resultant structure generated according to FIG. 17A, the process of forming the word line cut region WLC, the plurality of conductive space LS3, and the plurality of separating spaces TSS3 may be formed by using the same method as the method described with reference to FIG. 14B. After the plurality of conductive spaces LS3 and the plurality of separating spaces TSS3 are formed, the plurality of preliminary blocking dielectric patterns 232P may be exposed through the plurality of conductive spaces LS3.

Referring to FIG. 17C, with respect to the resultant structure generated according to FIG. 17B, the first blocking dielectric pattern 232B may be formed by oxidizing the plurality of preliminary blocking dielectric patterns 232P by using substantially the same method as the method described with reference to FIG. 13B. Thereafter, the processes described with reference to FIGS. 14C and 14D may be performed to manufacture the integrated circuit device 300A illustrated in FIGS. 8A and 8B.

Figure 18A:
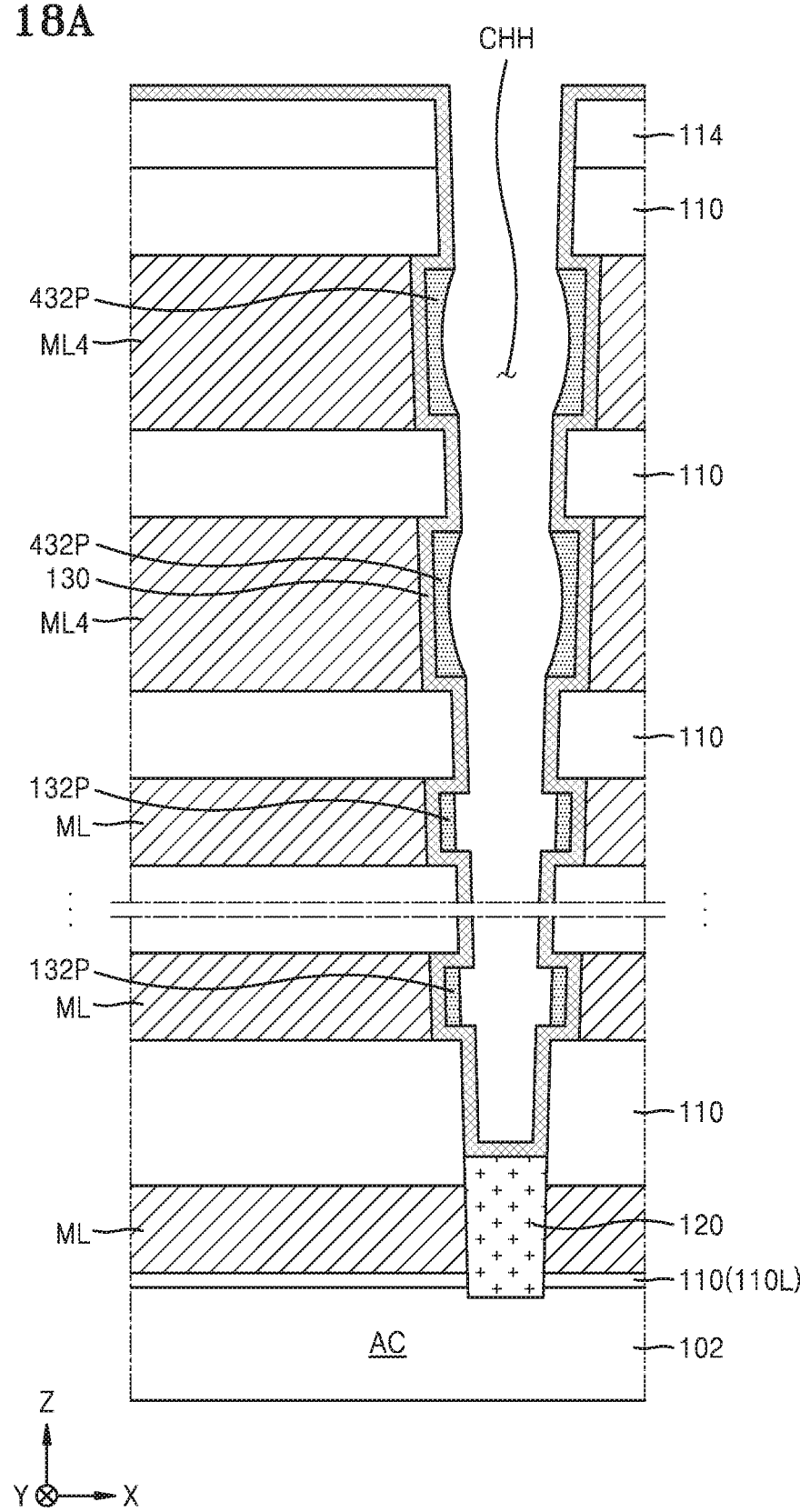
FIGS. 18A and 18B are cross-sectional views illustrated according to a process order for describing a method of manufacturing an integrated circuit device, according to other embodiments.
Figure 18B:
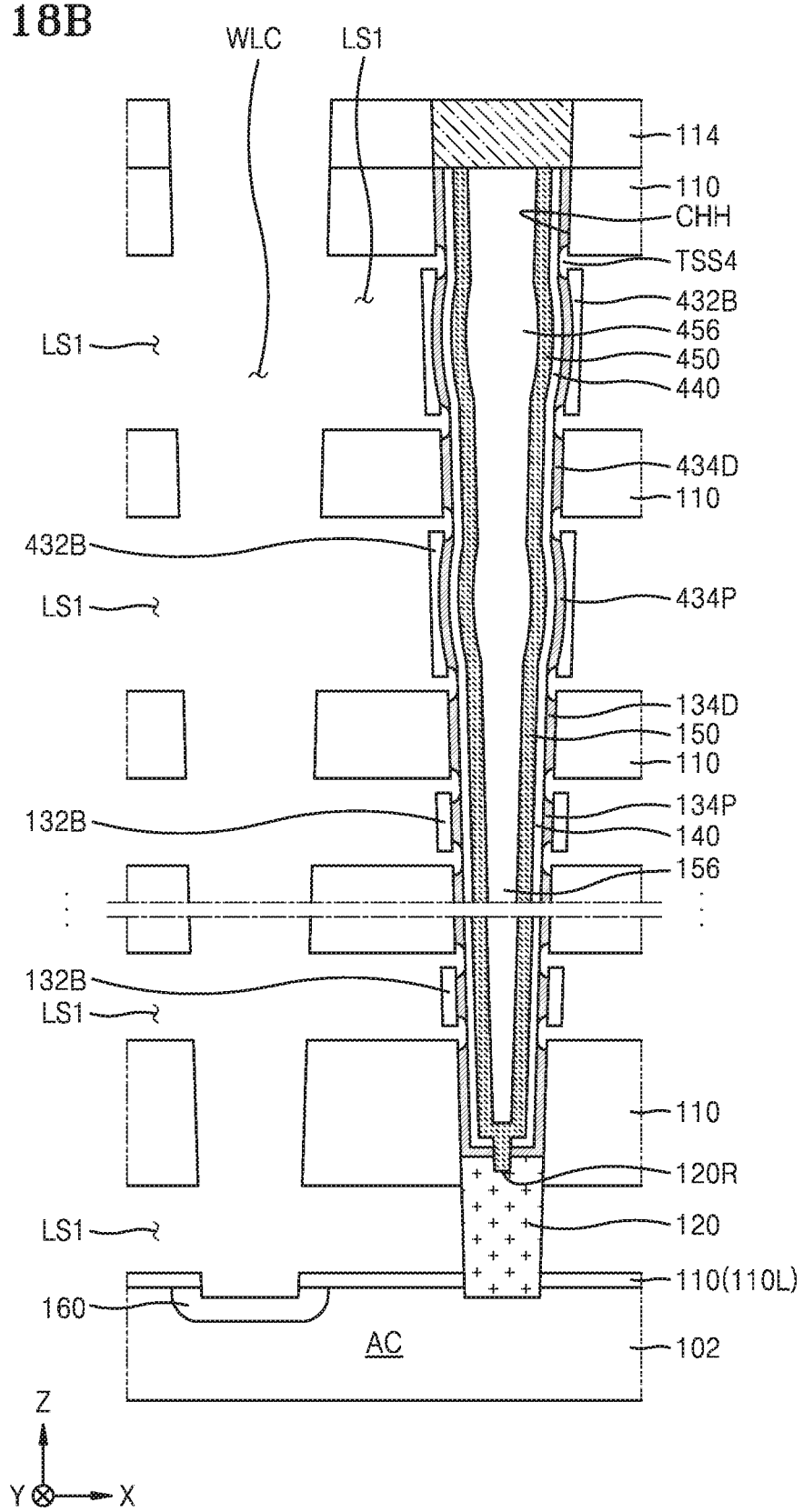

FIGS. 18A and 18B are cross-sectional views illustrated according to a process order for describing a method of manufacturing the integrated circuit device 400A, according to other embodiments. The method of manufacturing the integrated circuit device 400A illustrated in FIG. 10A will be described.

Referring to FIG. 18A, the processes described with reference to FIGS. 12A through 12E may be performed. However, in this example, a mold layer ML4 having a relatively larger thickness that the other mold layers ML may be formed at a portion corresponding to a region in which the string selection line SSL (see FIG. 1) is to be formed, in the process described with reference to FIG. 12A. According to example embodiments, a first thickness of the mold layer ML4 may be greater than a second thickness of the mold layer ML formed at a portion corresponding to a region in which the plurality of word lines WL (see FIG. 1) are to be formed. For example, the first thickness may be at least two times the second thickness. However, example embodiments are not limited thereto.

Since the thickness of the mold layer ML4 is greater than the thickness of the mold layer ML, after the process of FIG. 12E is completed, the plurality of preliminary blocking dielectric patterns 432P formed at a side wall of the mold layer ML4 that faces the inside of the channel hole CHH, may have a side wall that is concave toward the inside of the channel hole CHH. However, in some embodiments, the plurality of preliminary blocking dielectric patterns 132P formed at the side wall of the mold layer ML may have a flat side wall facing the inside of the channel hole CHH.

Referring to FIG. 18B, with respect to the resultant structure generated according to FIG. 18A, the processes described with reference to FIGS. 12F through 12J or the processes described with reference to FIGS. 15A and 15B may be performed to form a structure in which the first blocking dielectric patterns 432B and the first blocking dielectric patterns 132B are exposed through the plurality of conductive spaces LS1. The first blocking dielectric patterns 432B and the first blocking dielectric patterns 132B may be obtained by oxidizing the plurality of preliminary blocking dielectric patterns 432P and the plurality of preliminary blocking dielectric patterns 132P. Thereafter, processes that are substantially the same as the processes described with reference to FIGS. 12K through 12M may be performed to manufacture the integrated circuit device 400A illustrated in FIG. 10A.

In order to manufacture the integrated circuit device 400B illustrated in FIG. 10B, in some embodiments, the second blocking dielectric pattern 464 including the air gap AG4, rather than the second blocking dielectric pattern 462 illustrated in FIG. 10A, may be formed. In order to form the second blocking dielectric pattern 464 including the air gap AG4, a deposition process atmosphere for forming the second blocking dielectric pattern 464, for example, a deposition temperature, a deposition pressure, etc. may be controlled.

According to the methods of manufacturing the integrated circuit devices, according to the various example embodiments described above, the structure for improving the reliability by preventing cell interference caused by charge diffusion between cells vertically adjacent to each other in the channel hole in the vertical-type memory device even when gaps between the adjacent cells are relatively small, is provided.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a conductive pattern extending on a substrate in a horizontal direction that is parallel to a surface of the substrate;
   an insulating layer extending on the substrate in the horizontal direction, adjacent to and in parallel to the conductive pattern;
   a channel layer extending in a channel hole penetrating the conductive pattern and the insulating layer, in a vertical direction that is perpendicular to the surface of the substrate;
   a charge storage pattern inside the channel hole between the conductive pattern and the channel layer; and
   a dummy charge storage pattern inside the channel hole between the insulating layer and the channel layer, the dummy charge storage pattern being spaced apart from the charge storage pattern in the vertical direction,
   wherein the charge storage pattern and the dummy charge storage pattern extend along a straight line.

2. The integrated circuit device of claim 1, further comprising:
   a first blocking dielectric pattern between the conductive pattern and the charge storage pattern; and
   a second blocking dielectric pattern having a first portion between the conductive pattern and the insulating layer, a second portion between the first blocking dielectric pattern and the insulating layer, and a third portion between the charge storage pattern and the dummy charge storage pattern,
   wherein the first portion, the second portion and the third portion are integrally connected.

3. The integrated circuit device of claim 2, wherein the third portion of the second blocking dielectric pattern has an air gap between the charge storage pattern and the dummy charge storage pattern.

4. The integrated circuit device of claim 1, further comprising:
   a blocking dielectric pattern spaced apart from the channel layer with the charge storage pattern therebetween, wherein
   a side wall of the charge storage pattern that faces the conductive pattern, is closer to the channel layer than a side wall of the dummy charge storage pattern that faces the insulating layer, and
   the blocking dielectric pattern has a first surface nearest to the channel layer and the insulating layer has a second surface nearest to the channel layer, and the first surface is nearer than the second surface to the channel layer.

5. The integrated circuit device of claim 1 further comprising:
   a blocking dielectric pattern spaced apart from the channel layer with the charge storage pattern therebetween,
   wherein the blocking dielectric pattern has a concave side wall contacting a side wall of the charge storage pattern that faces the conductive pattern.

6. The integrated circuit device of claim 1, further comprising:
   a first blocking dielectric pattern between the conductive pattern and the charge storage pattern;
   a second blocking dielectric pattern having a first portion between the conductive pattern and the insulating layer, a second portion between the first blocking dielectric pattern and the insulating layer, and a third portion between the charge storage pattern and the dummy charge storage pattern; and
   a third blocking dielectric pattern spaced apart from the first blocking dielectric pattern and the insulating layer with the second blocking dielectric pattern therebetween, the third blocking dielectric pattern surrounding a portion of the conductive pattern,
   wherein the first blocking dielectric pattern comprises a silicon oxide layer, and
   each of the second blocking dielectric pattern and the third blocking dielectric pattern comprises a silicon oxide layer, a high-k dielectric layer, or a combination of the silicon oxide layer and the high-k dielectric layer.

7. The integrated circuit device of claim 1, further comprising:
   a blocking dielectric pattern comprising a first pattern portion contacting a side wall of the charge storage pattern that faces the conductive pattern, and a second pattern portion contacting the charge storage pattern and the dummy charge storage pattern in a space between the charge storage pattern and the dummy charge storage pattern, the second pattern portion surrounding a portion of the conductive pattern,
   wherein the first pattern portion and the second pattern portion of the blocking dielectric pattern are connected to each other without a visible interface therebetween.

8. The integrated circuit device of claim 1, further comprising:
   a blocking dielectric pattern contacting the charge storage pattern and the dummy charge storage pattern and surrounding a portion of the conductive pattern,
   wherein the blocking dielectric pattern comprises:
   a first blocking dielectric pattern contacting the charge storage pattern and being spaced apart from the conductive pattern and the dummy charge storage pattern; and
   a second blocking dielectric pattern comprising a portion contacting the charge storage pattern and the dummy charge storage pattern and a portion interposed between the first blocking dielectric pattern and the conductive pattern.

9. The integrated circuit device of claim 1, further comprising:
   a tunneling dielectric layer between the charge storage pattern and the channel layer and between the dummy charge storage pattern and the channel layer, the tunneling dielectric layer extending in a direction in which the channel layer extends.

10. The integrated circuit device of claim 1, wherein a width of the charge storage pattern in the horizontal direction is different from a width of the dummy charge storage pattern in the horizontal direction.

11. The integrated circuit device of claim 1, wherein a width of the charge storage pattern in the horizontal direction is the same as a width of the dummy charge storage pattern in the horizontal direction, and a minimum horizontal distance between the charge storage pattern and the channel layer is smaller than a minimum horizontal distance between the dummy charge storage pattern and the channel layer.

12. An integrated circuit device comprising:
    a plurality of conductive patterns extending on a substrate in a horizontal direction that is parallel to a surface of the substrate, the plurality of conductive patterns overlapping each other in a vertical direction that is perpendicular to the surface;
a plurality of insulating layers respectively arranged between adjacent ones of the plurality of conductive patterns, the plurality of insulating layers extending in the horizontal direction;
a channel layer extending in the vertical direction within a channel hole penetrating the plurality of conductive patterns and the plurality of insulating layers;
a plurality of charge trap patterns spaced apart from each other inside the channel hole and interposed between the plurality of conductive patterns and the channel layer;
a plurality of dummy charge trap patterns spaced apart from each other inside the channel hole and spaced apart from the plurality of charge trap patterns, the plurality of dummy charge trap patterns interposed between the plurality of insulating layers and the channel layer; and
a plurality of blocking dielectric patterns comprising a plurality of first pattern portions respectively arranged between adjacent ones of the plurality of insulating layers and interposed between the plurality of conductive patterns and the plurality of charge trap patterns, and a plurality of second pattern portions surrounding respective portions of the plurality of conductive patterns and filling respective spaces between the plurality of charge trap patterns and the plurality of dummy charge trap patterns.

13. The integrated circuit device of claim 12, wherein the plurality of charge trap patterns and the plurality of dummy charge trap patterns are respectively alternately arranged inside the channel hole along a straight line extending in a direction away from the substrate.

14. The integrated circuit device of claim 12, wherein the plurality of charge trap patterns and the plurality of dummy charge trap patterns have a same width in the horizontal direction.

15. The integrated circuit device of claim 12, wherein the first pattern portion and the second pattern portion of each of the plurality of blocking dielectric patterns are connected to each other without a visible interface between the first pattern portion and the second pattern portion.

16. The integrated circuit device of claim 12, wherein the first pattern portion of each of the plurality of blocking dielectric patterns contacts one charge trap pattern among the plurality of charge trap patterns, and the second pattern portion of each of the plurality of blocking dielectric patterns contacts the one charge trap pattern and one dummy charge trap pattern among the plurality of dummy charge trap patterns, and
a length of each of the plurality of charge trap patterns in the vertical direction is equal to or less than a length of each of the plurality of conductive patterns in the vertical direction and equal to or greater than half of the length of each of the plurality of conductive patterns in the vertical direction.

17. The integrated circuit device of claim 12, wherein the plurality of second pattern portions comprise air gaps in the respective spaces between the plurality of charge trap patterns and the plurality of dummy charge trap patterns.

18. An integrated circuit device comprising:
a lower conductive line and an upper conductive line extending in a horizontal direction in parallel to each other on a substrate;
an insulating layer extending in the horizontal direction between the lower conductive line and the upper conductive line;
a channel layer in a channel hole extending in a vertical direction by penetrating the lower conductive line, the upper conductive line, and the insulating layer;
a lower charge trap pattern in the channel hole, the lower charge trap pattern interposed between the lower conductive line and the channel layer;
an upper charge trap pattern in the channel hole, the upper charge trap pattern interposed between the upper conductive line and the channel layer and being spaced apart from the lower charge trap pattern in the vertical direction; and
a dummy charge trap pattern between the insulating layer and the channel layer, the dummy charge trap pattern being spaced apart from the lower charge trap pattern by a lower separating space and from the upper charge trap pattern by an upper separating space;
a lower first blocking dielectric pattern between the lower conductive line and the channel layer;
an upper first blocking dielectric pattern between the upper conductive line and the channel layer;
a lower second blocking dielectric pattern between the lower conductive line and the lower first blocking dielectric pattern, the lower second blocking dielectric pattern filling the lower separating space; and
an upper second blocking dielectric pattern between the upper conductive line and the upper first blocking dielectric pattern, the upper second blocking dielectric pattern filling the upper separating space.

19. The integrated circuit device of claim 18, wherein a thickness of the lower conductive line in the vertical direction is different from a thickness of the upper conductive line in the vertical direction, and
a side wall of the lower first blocking dielectric pattern facing the channel layer has a different shape from a side wall of the upper first blocking dielectric pattern facing the channel layer.

* * * * *